(12) United States Patent
Schweitzer, III et al.

(10) Patent No.: US 8,581,723 B2
(45) Date of Patent: *Nov. 12, 2013

(54) FAULT DETECTION USING PHASE COMPARISON

(75) Inventors: Edmund O. Schweitzer, III, Pullman, WA (US); David E. Whitehead, Pullman, WA (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 450 days.

This patent is subject to a terminal disclaimer.

(21) Appl. No.: 12/906,813

(22) Filed: Oct. 18, 2010

(65) Prior Publication Data

US 2011/0080283 A1  Apr. 7, 2011

Related U.S. Application Data

(63) Continuation-in-part of application No. 11/750,962, filed on May 18, 2007, now Pat. No. 8,059,006.

(60) Provisional application No. 61/252,768, filed on Oct. 19, 2009, provisional application No. 60/801,757, filed on May 19, 2006.

(51) Int. Cl.
 *G08B 1/08* (2006.01)
(52) U.S. Cl.
 USPC ............ 340/539.26; 340/506; 340/539.1; 340/538; 340/539.11; 340/635; 340/539.3
(58) Field of Classification Search
 USPC ............ 340/506, 539.1, 538, 539.11, 539.26, 340/635, 539.3
 See application file for complete search history.

(56) References Cited

U.S. PATENT DOCUMENTS

| | | | | |
|---|---|---|---|---|
| 5,959,529 | A * | 9/1999 | Kail, IV | 340/539.12 |
| 8,059,006 | B2 * | 11/2011 | Schweitzer et al. | 340/635 |
| 8,065,099 | B2 | 11/2011 | Gibala | |
| 8,274,394 | B2 | 9/2012 | Feight | |
| 2003/0224740 | A1 * | 12/2003 | Takano et al. | 455/102 |
| 2006/0217081 | A1 * | 9/2006 | Takano et al. | 455/102 |
| 2008/0284585 | A1 | 11/2008 | Schweitzer | |
| 2009/0231150 | A1 | 9/2009 | Feight | |
| 2009/0240449 | A1 | 9/2009 | Gibala | |

OTHER PUBLICATIONS

A. Dos Santos, J.F. Martins, P. Monteiro, LJ. A. Kojovic, T.R. Day, Project Implementation and Field Experience with a Transmission Cable Differential Protection System using Low-Power Current Sensors, 63rd Annual Conference for Protective Relay Engineers 2010, Mar. 29-Apr. 1, 2010.
PCT/US2010/053116 PCT International Search Report and Written Opinion of the International Searching Authority, Dec. 14, 2010.

* cited by examiner

*Primary Examiner* — Daryl Pope
(74) *Attorney, Agent, or Firm* — Eugene M. Cummings, PC

(57) ABSTRACT

A system for communicating information between a detection device and a wireless device is provided. The system generally includes a detection device adapted to monitor a condition related to a power system. A radio interface unit is in communication with the detection device via a communication member. A wireless device is further provided which is in radio communication with the radio interface unit such that the detection device communicates information to the wireless device through a radio interface unit. The system's components are further adapted to endure harsh conditions (e.g., prolonged exposure to water).

27 Claims, 43 Drawing Sheets

FAULT DETECTION USING PHASE COMPARISON

CROSS-REFERENCE TO RELATED APPLICATIONS

This application also claims benefit under 35 U.S.C. §119 (e) of U.S. Provisional Application entitled "FAULT LOCATION USING PHASE COMPARISON," filed on Oct. 19, 2009, having the Ser. No. 61/252,768, and is a continuation-in-part application of U.S. patent application entitled "SYSTEM AND METHOD FOR COMMUNICATING POWER SYSTEM INFORMATION THROUGH A RADIO FREQUENCY DEVICE," filed on May 18, 2007 now U.S. Pat. No. 8,059,006, having the Ser. No. 11/750,962, which claims benefit under 35 U.S.C. §119(e) of U.S. Provisional Application entitled "SYSTEM AND METHOD FOR COMMUNICATING POWER SYSTEM INFORMATION THROUGH A RADIO FREQUENCY DEVICE," filed on May 19, 2006, having Ser. No. 60/801,757, naming Edmund O. Schweitzer, III, Mark J. Bosold, Douglas A. Park, Laurence Virgil Feight, and Adam Thomas Belote, as inventors, the complete disclosure thereof being incorporated by reference.

FIELD OF THE INVENTION

The present invention relates generally to a system and method for communicating power system information, and more particularly to a system and method for communicating power system information through a radio frequency device. The present invention system further relates to an apparatus and method for locating a fault on an electric power conductor, and more particularly to an apparatus and method for locating a fault on an electric power conductor using phase comparison.

DESCRIPTION OF THE PRIOR ART

Power transmission and distribution systems may include power system protection, monitoring, and control devices such as sensors, protective relays, faulted circuit indicators, and the like. Throughout, the term "power system device" will include any power system protection, monitoring, or control device. Detection devices are used in the power system industry to monitor certain areas and conditions in the power system. Some examples of detection devices include: faulted circuit indicators (FCIs); water, high voltage electric field, specific gravity, light, and sound sensors; gas sensors such as CO, CO2, SOx, NOx, Ammonia, Arsine, Bromine, Chlorine, Chlorine Dioxide, VOCs, Combustibles, Diborane, Ethylene Oxide, Fluorine, Formaldehyde, Germane, Hydrogen, Hydrogen Chloride, Hydrogen Cyanide, Hydrogen Fluoride, Hydrogen Selenide, Hydrogen Sulfide, Oxygen, Ozone, Methane, Phosgene, Phosphine, Silane, and the like; pressure sensors for sensing, for example, pressure in a gas line, water line, waste line, oil line, and the like; temperature sensors; electromagnetic radiation sensors; radiation sensors; smoke sensors; particulate matter sensors; liquid phase sensors such as pH, turbidity, Br—, Ca2+, Cl—, CN—, Cu2+, F—, I—, K+, Na+, NH4+, NO3-, Pb2+, S-(AG+), conductivity sensors, and the like; radio wave sensors; electrical sensors such as under voltage sensors, over voltage sensors, under current sensors, over current sensors, frequency sensors and the like; power factor alarms; demand overload indicators; sensors that detect the presence of primary system voltage; sensors that determine if a sealed subsurface fuse has operated by sensing voltage on each side of fuse element with loss of load current; sensors that sense the open or closed position of a subsurface switch; voltage sensors which monitors status of lead-acid batteries used to run controller or motor operators for subsurface switches; power quality sensors which detect primary voltage swells and sags along the distribution system, and other sensors that detect power quality issues and send an alarm status.

Faulted circuit indicators (FCIs) play a vital role in detecting and indicating faults and locations of faulted conductors to decrease the duration of power outages and improve the reliability of power systems throughout the world. Electrical utilities depend on faulted circuit indicators to help their employees quickly locate faulted conductors. Most conventional faulted circuit indicators utilize a mechanical target or a light emitting diode (LED) to provide a visual indication of a faulted conductor. By visually scanning faulted circuit indicators located at a site, an electrical utility crew can quickly locate a fault. Industry statistics indicate that faulted circuit indicators reduce fault location time by 50%-60% versus the use of manual techniques, such as the "refuse and sectionalize" method. Nonetheless, electrical utilities still spend substantial amounts of time and money determining the locations of faults on their networks.

A recent advancement is the use of Radio Frequency ("RF") technology within fault circuit indication systems. In one prior art system, each faulted circuit indicator communicates with a radio interface unit which communicates the occurrence of a fault to an external receiver. The radio interface unit is often located in proximity to an FCI within an underground vault, which is susceptible to external elements. For example, vaults may often be filled with water thereby exposing the radio interface unit located therein to also be exposed to such. In another example, for overhead FCI systems, radio interface units are also exposed to the external elements as they are situated in proximity to the overhead FCI device.

As such, it is an object of the present invention to provide a system for communicating power system information through a radio frequency device which may endure harsh external elements.

Prior art fault circuit indication systems have further been found to be insufficient in their reporting of data. In one prior art system, a wireless device is used to monitor radio signals from RF equipped faulted circuit indicators that are connected to a radio interface unit. Using a wireless device, a utility crew can locate a fault and determine when the fault has been properly cleared by monitoring the display of the wireless device. However, conventional wireless devices provide no indication as to whether a particular faulted circuit indicator is actually connected to the radio interface unit. In addition, prior art devices do not display the status of a plurality of or multiple groups of faulted circuit indicators simultaneously. Prior art systems also do not provide the capability to view detection devices or sensors for communicating other conditions related to the power system.

Accordingly, one object of this invention is to provide a user interface for a wireless device that simultaneously displays the status of multiple groups of monitored faulted circuit indicators. Another object of this invention is to provide an indication on a wireless device of whether a faulted circuit indicator is connected to a remote monitoring device, such as a radio interface unit. Yet another object of the present invention is to provide data on a wireless device for other conditions related to the power system.

In one application, solid dielectric cables such as cross-linked polyethylene (XLPE) cables are often used as electrical power conductors or underground electric power transmission lines. Installation of these cables often requires splicing vaults or manholes to be installed. Splice failures is often regarded as the leading source of cable failures. Nevertheless, power system devices are generally not installed in splice vaults. Accordingly, when faults occur at a splice vault, sustained power outages occur until the exact location of the fault is determined. Traditionally, determining the location of a fault is generally performed by a visible inspection of cables in each splice vault. This inspection process can be rather extensive especially if the vault is located in a hard to reach location such as a busy intersection.

Accordingly, it is generally an object of the present invention to provide a system for determining the location of a fault. It is specifically an object of the present invention to determine the location of a fault using a phase comparison. The present invention apparatus and method may utilize RF technology such that a fault location may be determined in hard to reach locations such as a splice vault.

BRIEF DESCRIPTION OF THE DRAWINGS

Although the characteristic features of this invention will be particularly pointed out in the claims, the invention itself, and the manner in which it can be made and used, can be better understood by referring to the following description taken in connection with the accompanying drawings forming a part hereof, wherein like reference numerals refer to like parts throughout the several views and in which:

DETAILED DESCRIPTION OF THE ILLUSTRATED EMBODIMENT

Figure 1:
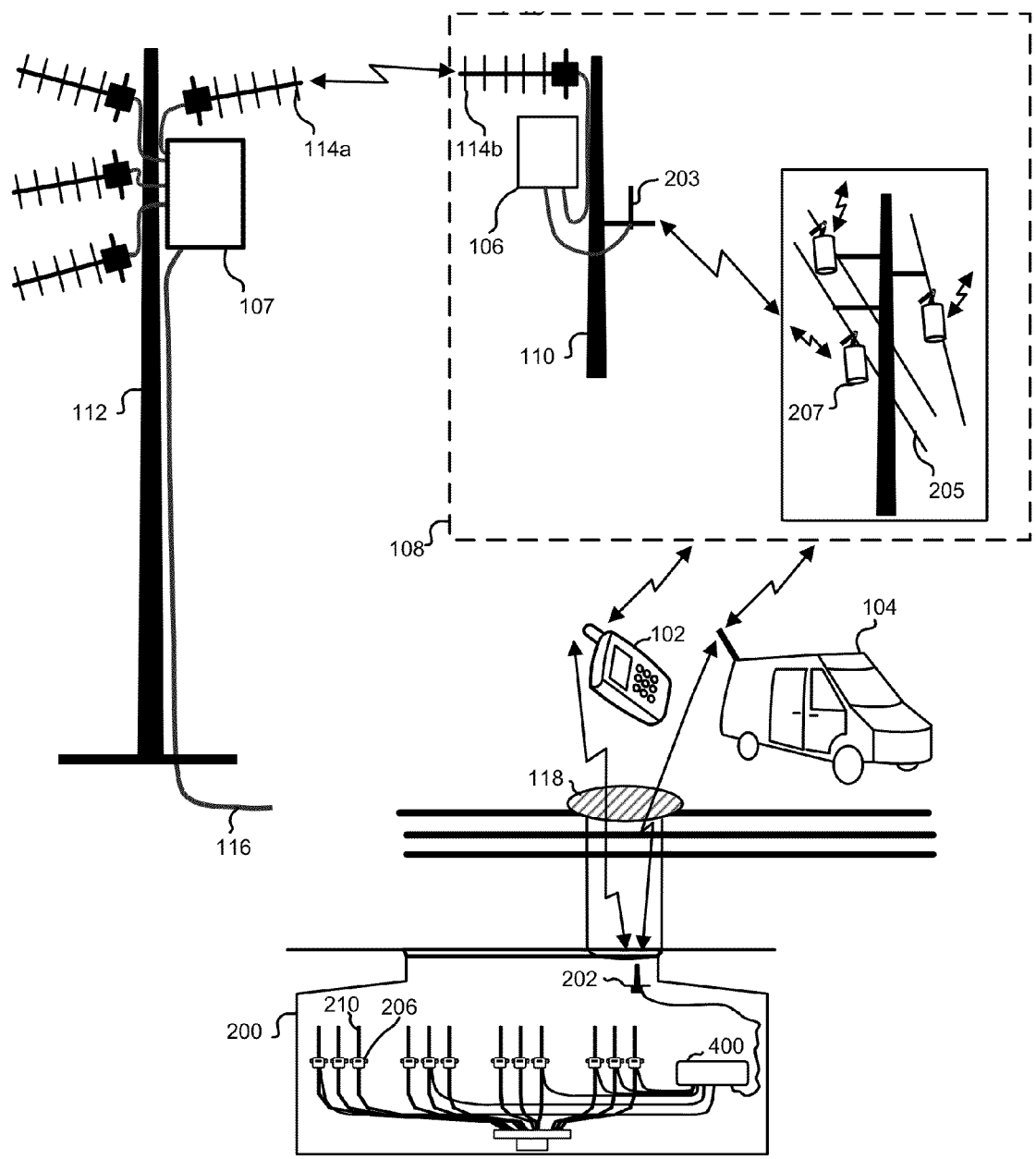
FIG. 1 illustrates a system view of a faulted circuit indicator monitoring system in accordance with an aspect of the present invention.

FIG. 1 illustrates a faulted circuit indicator monitoring system in accordance with an aspect of the present invention.

A number of overhead faulted circuit indicators 207 each contain a two-way radio that communicates the occurrence of a fault via a short range antenna 203 to a local site 110 having an intelligent module 106 installed within radio range of the faulted circuit indicators 207. The intelligent module then uses the existing wired telephone network (not shown) to communicate the fault occurrence to a remote site 112. Alternatively, the intelligent module may include a radio interface unit associated therewith for communication with an antenna 114b to communicate the fault occurrence to a remote site 112 having another long range RF antenna 114a. The remote site 112 includes a remote intelligent module 107, which may be connected to another site (not shown) via a wired connection 116. When a fault is detected by a faulted circuit indicator, the occurrence is relayed in the manner described above to the remote site 112, triggering the dispatch of a team to the fault site. The user then uses a wireless device 102 (e.g., a wireless handheld device). In another embodiment, the wireless device may be located in a vehicle 104 to determine which conductor 205 is faulted.

Note that the conductors could also be located in an underground vault 200, which may be accessible through a manhole 118. Faulted circuit indicators 206 attached to the underground conductors 210 are wired to a radio interface unit 400 with a short range antenna 202 to communicate with the wireless device 102 or wireless device installed in a vehicle 104. In one embodiment, the short range antenna 202 may be part of or separate from the radio interface unit.

Figure 2A:
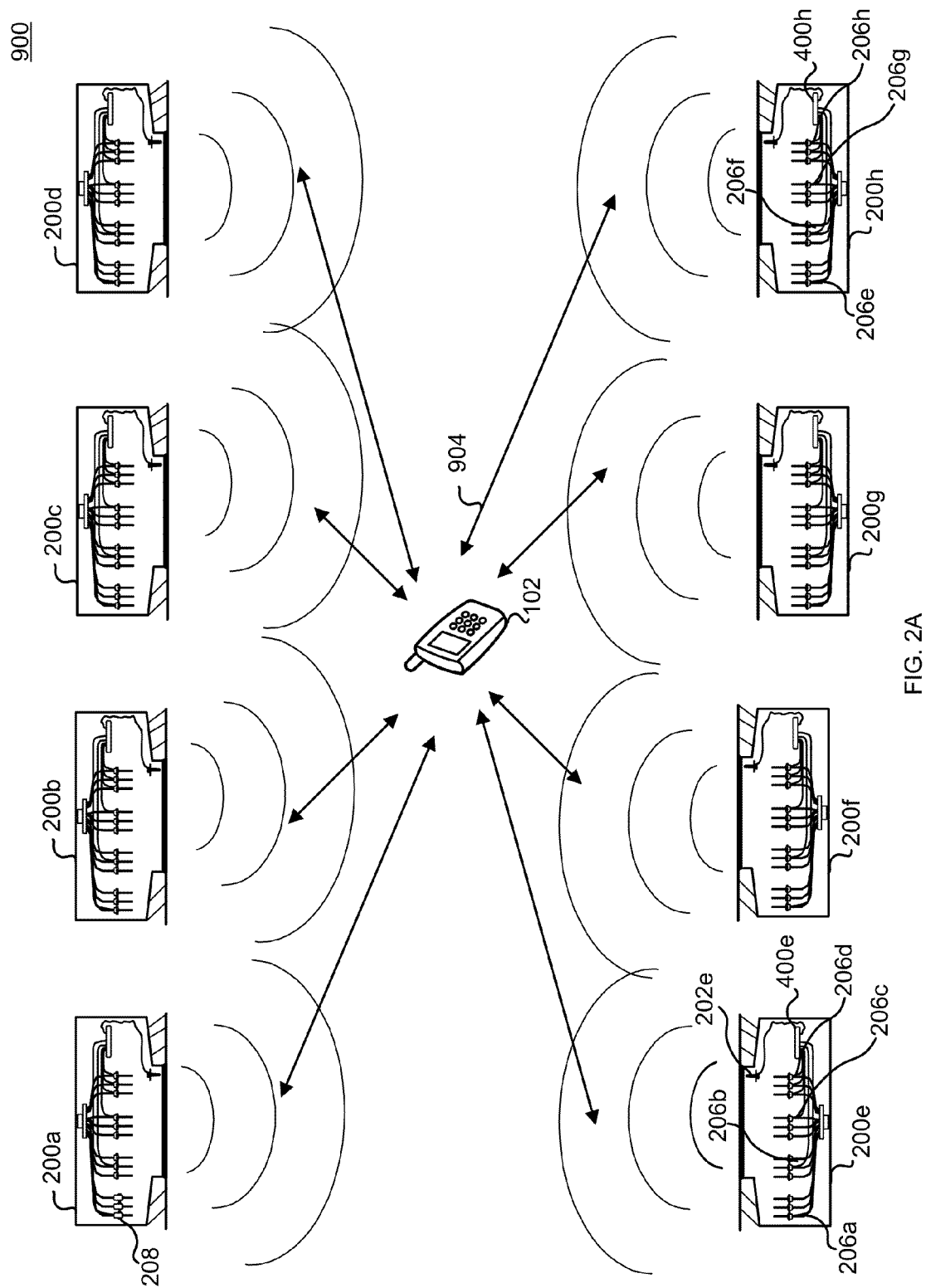
FIG. 2A illustrates a wireless device communicating with eight radio interface units, each of which is connected to four groups of faulted circuit indicators in accordance with an aspect of the present invention.
Figure 2B:
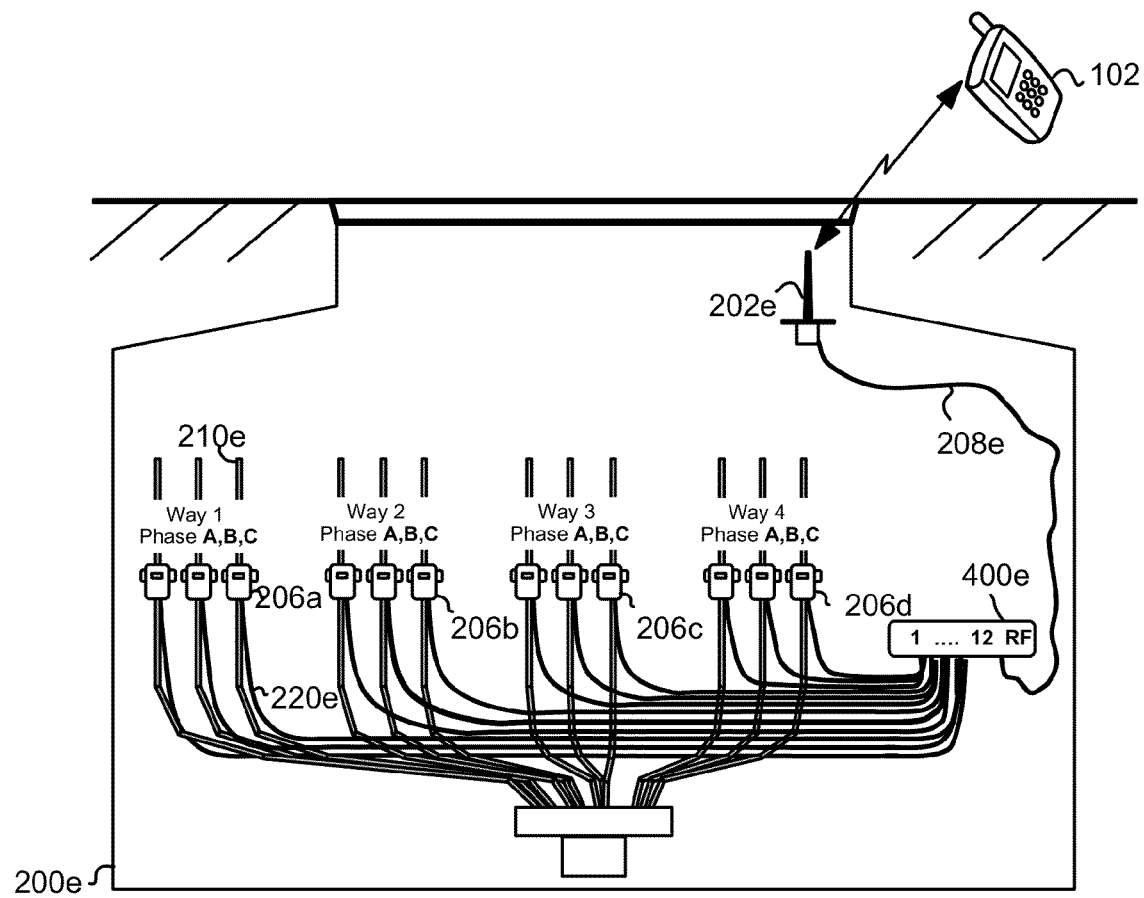
FIG. 2B illustrates the underground vault 200e of FIG. 2A.

Referring to the drawings and to FIGS. 2A and 2B in particular, a wireless device 102 communicates 904 with eight installations of faulted circuit indicators 200a-200h. As illustrated, each installation of faulted circuit indicators consists of a radio interface unit, and four separate groups ("ways") of faulted circuit indicators, wherein each group has three faulted circuit indicators, one for each phase. For example, the installation shown at 200e, as shown in FIGS. 2A and 2B includes four separate groups 206a-d of faulted circuit indicators connected to a radio interface unit 400e through cables 220e with a separate short range antenna 202e connected through cable 208e. This radio interface unit 400e may include a particular setting such that it may be differentiated from the other radio interface units. For example, this identification setting may be in the form of a designation setting (e.g., serial number), whereupon each particular radio interface unit has a particular designation (e.g., a particular serial number). In another embodiment, the identification setting may be in the form of an address setting (e.g., a media access control (MAC) address). In yet another embodiment, in order to ensure proper differentiation among a plurality of units, each radio interface unit may include both a designation setting and an address setting. For example, both the radio interface unit 400b and radio interface unit 400e may be associated with a particular address (e.g., address 5). In order to differentiate between these radio interface units 400b and 400e, each radio interface unit 400b and 400e is given a particular designation setting (e.g., particular serial numbers). In this way, radio interface units may be differentiated.

Each faulted circuit indicator within these separate groups 206a-d may be used to monitor the various phases (e.g., commonly referred to as the A, B, C phases) associated therewith. For example, each of the faulted circuit indicators associated with way 206a may be used to monitor the three phases associated therewith. Through this system, the installation 200e of faulted circuit indicators 206a, 206b, 206c, 206d may communicate with wireless device 102.

Additionally, the wireless device 102 may alternatively be adapted to communicate with radio interface units associated with overhead fault circuit indicators as illustrated in FIG. 1. In yet another embodiment, the wireless device may be in the form of a personal digital assistant (PDA) with a wireless interface, a laptop computer or a handheld computer with a wireless interface, etc. and may optionally be mounted in a service vehicle.

Referring back to FIG. 1, various components of the faulted circuit indicator monitoring system may be located in an underground vault 200 and only accessible through a manhole 118. As discussed above, the underground vault 200 is often susceptible to external elements and even flooding. Accordingly, its contents are also susceptible to external elements such as water. Likewise, overhead FCI systems also include electronic devices which are exposed to external elements. Accordingly, it is also desirable that any connections between the electronic devices be wireless and/or waterproof. Moreover, it is also desirable that the communication members (e.g., probes or other wireless connection means) and corresponding detection devices be substantially self-contained.

For example, it is desirable that any connection between each FCI 206 and the radio interface unit 400 of the previous figures be wireless and waterproof. Also, it is desirable that both the communication members (not shown) from the FCI 206 and the radio interface unit 400 each be substantially self-contained.

Referring to FIG. 4, the radio interface unit 400a includes a housing 402a which is substantially self-contained. Contained within the housing 402a are electronic components (not shown). The electronic components contained within the housing 402a may further be encapsulated using an encapsulate material such as potting material. Encapsulate material provides a physical barrier around the electronic components. This barrier is malleable, providing increased resistance to shock and vibration. In addition, if the material is properly cured, the barrier will be water-tight.

One such encapsulate material is referred to as potting material. Potting material may include epoxy based materials, urethane based materials, silicone based materials, acrylic based materials, polyester based materials, and others. Urethane and silicone based materials are the types used most often in the electronics industry. Each particular type of potting material has its own strengths and weaknesses.

With the exception of the opening for antenna 208a, there are generally no outlets or openings in the housing 402a. Accordingly, the housing 402a is substantially self-contained (sealed from the elements). For example, address switch 414a and power switch 406a are separate and apart from the housing 402a in that they do not require any mechanical or electrical connection to any electronic component contained within the housing 402a. The housing 402a further defines cavities (e.g., at 304a) for receiving communication members which may be in the form of inductor coil probes (e.g., at 508a) in a manner in which they do not expose the electronic components contained within the housing 402a to the external environment. Housing 402a may further include a securing member such as a connector socket 408a in order to secure the inductor coil probe 508a within the cavity 304a. Although inductor coil probes are illustrated and described herein, it is intended that any communication member which includes an inductor and produces a magnetic field or communicates information via a magnetic field may be used in place thereof.

The inductor coil probes (e.g., at 508a) which interface the cavities (e.g., at 304a) are coupled to a detection device such as an FCI as described with regards to FIG. 1. The inductor coil probes (e.g., at 508a) are also substantially self-contained. The inductor coil probes (e.g., at 508a) wirelessly communicate with the radio interface unit 400a via cavities (e.g., 304a) in the manner described below.

One particular advantage to having inductor coil probes (e.g., at 508a) which interface the cavities (e.g., at 304a) without a wired or electrical connection, is that the system is closer to being intrinsically safe. Because so-called waterproof connections that require electrical and mechanical connection between the two devices fail after time, the electrical connection may become exposed, and pose a safety risk.

Figure 3:
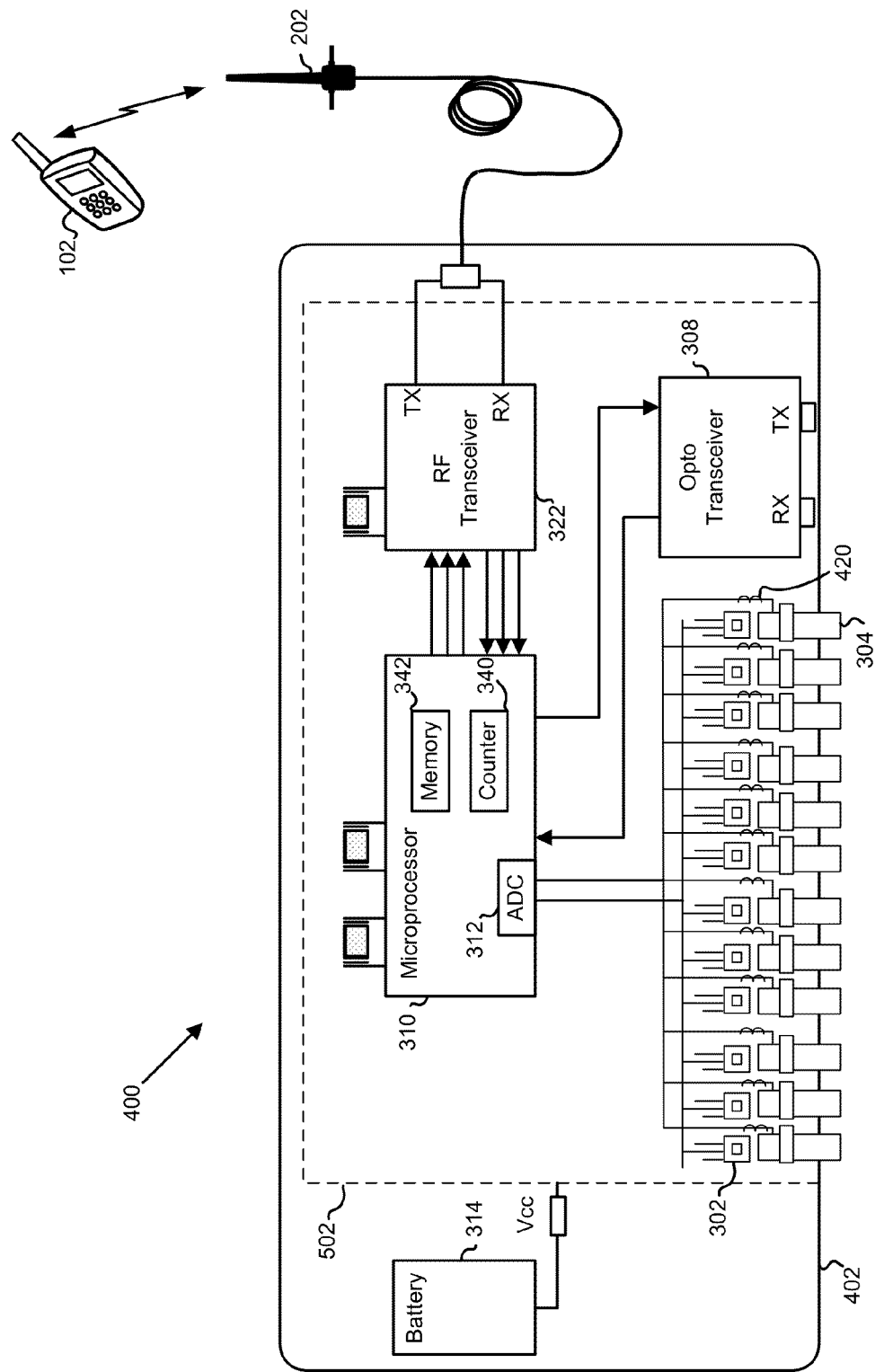
FIG. 3 illustrates a circuit diagram of the radio interface unit of FIG. 1 in accordance with an aspect of the present invention.
Figure 5A:
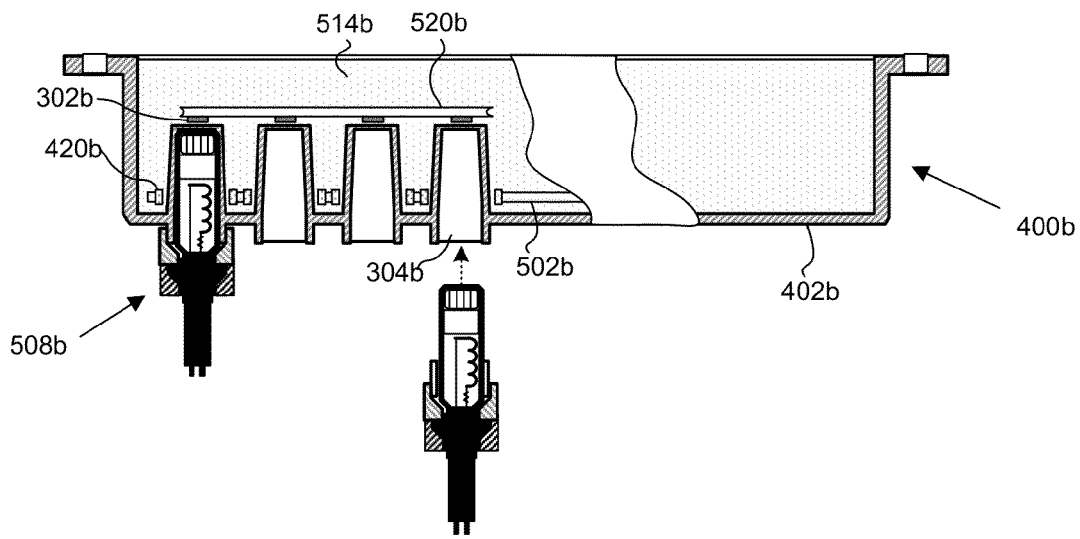
FIGS. 5A and 5B illustrate a cross-sectional view of an embodiment of the present invention system showing the engagement of the communication member and interface.
Figure 5B:
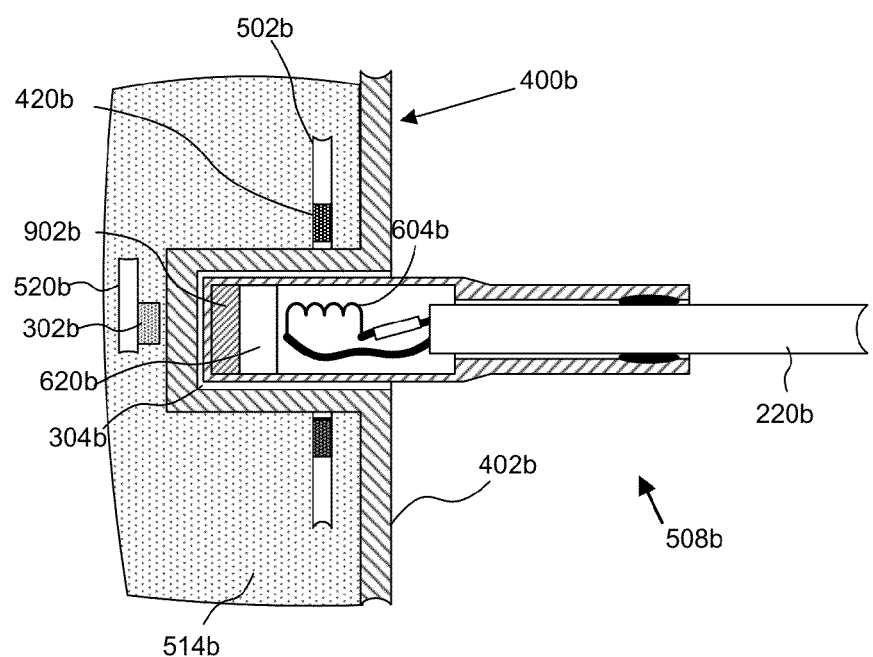
Figure 5C:
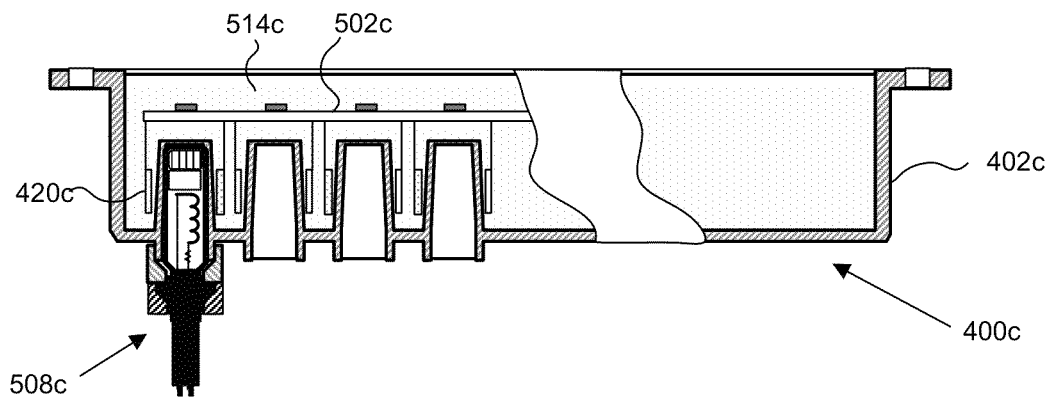
FIGS. 5C and 5D illustrate a cross-sectional view of another embodiment of the present invention system showing the engagement of the communication member and interface.
Figure 5D:
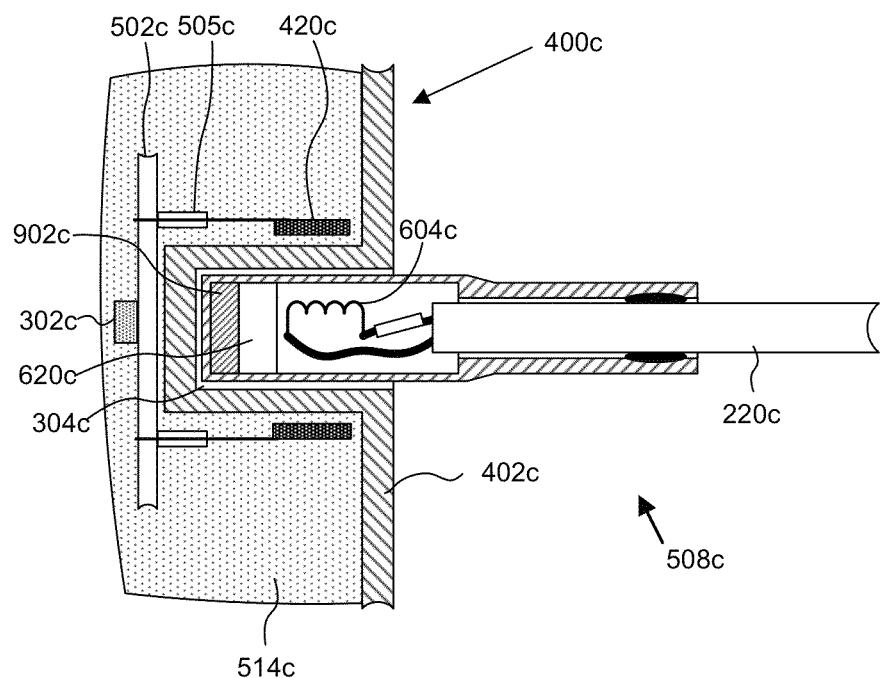

FIGS. 5A and 5B illustrate one embodiment of the hardware arrangement for the circuitry described with respect to FIG. 3 having an interface between an inductor coil probe 508b and a radio interface device 400b. Contained within the housing 402b are various electronic components of the radio interface unit 400b. The electronic components are further encapsulated by an encapsulate material 514b such as a potting material. The housing 402b further defines a plurality of cavities (e.g., at 304b) for receiving inductor coil probes (e.g., at 508b) in a manner in which they do not expose the electronic components contained within the housing 402b to the external environment. Further provided are a printed circuit board 520b which includes a plurality of magnetic field sensors such as hall-effect sensors (e.g., at 320b) and a printed circuit board 502b which includes a plurality of inductors (e.g., at 420b) implemented thereon. In this embodiment, the printed circuit boards 520b and 502b are separate and distinct. FIGS. 5C and 5D are similar to FIGS. 5A and 5B with the exception that only one circuit board 520c is implemented and the inductors are in the form of coiled inductors 420c in the embodiments of FIGS. 5C and 5D.

During operation of each of the embodiments illustrated in FIGS. 5A-5D, the interface between the inductor coil probes (e.g., at 508 b, c) and the radio interface unit 400 b, c is as follows. The inductor coil probes (e.g., at 508 b, c) may be inserted into the cavities (e.g., at 304 b, c). For example, as shown in FIGS. 5B and 5D, a magnet 902 b, c is situated at the end of the inductor coil probe 508 b, c. A corresponding magnetic field sensor (e.g., a hall-effect sensor) 302 b, c situated on printed circuit board 502b, 520c detects the presence of a magnetic field from magnet 902 b, c upon insertion of the inductor coil probe 508 b, c into the cavity 304 b, c. The magnetic field sensor 302 b, c produces a signal to the microprocessor, thereby signaling the presence of an inductor coil probe 508 b, c. A spacer 620 b, c is further provided in order to prevent the magnet 902 b, c from affecting the inductor coil 604 b, c contained within the inductor coil probe 508 b, c. Although a hall-effect sensor is described herein, other suitable magnetic field sensors may also be implemented such as a Reed switch and the like.

The inductor coil probes 508b, c which interface with the cavities 304b, c are coupled to a detection device such as an FCI as described in FIG. 1. The inductor coil probe 508 b, c includes an inductor coil 604 b, c and is also substantially self-contained. The inductor coil probes 508 b, c wirelessly communicate with the radio interface unit 400 b, c via cavities 304 b, c by magnetic field or electromagnetic field induction (also referred to as "magnetic field induction") in the manner described below.

Figure 6:
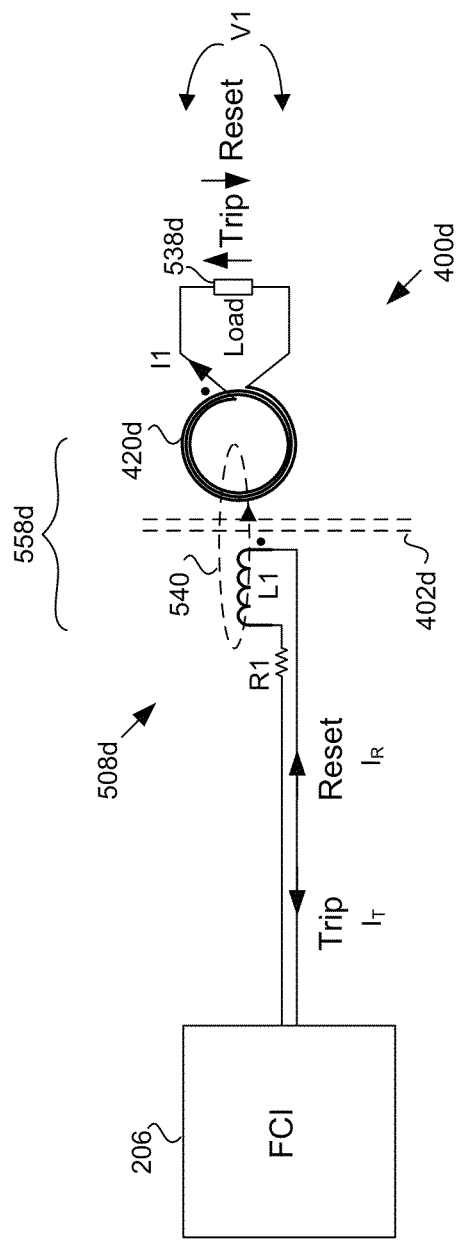
FIG. 6 is a circuit diagram of an embodiment of the present invention system illustrating the interaction between the communication member and the interface.

As illustrated in FIG. 6, during operation, a trip current signal $I_T$ is sent from a detection device, such as an FCI 206, when a conductor (e.g., 210 of FIG. 1) related thereto exceeds a select current threshold (e.g., upon an occurrence of a ground fault). The trip current signal $I_T$ induces a magnetic field 540 at the inductor coil L1 of the inductor coil probe 508d. The magnetic field 540 from the trip current $I_T$ induces a current $I_1$ in inductor coil 420d of the radio interface unit.

This induced current further induces a voltage $V_1$ across load 538d. Information regarding the increased voltage $V_1$ across load 538d may be transmitted from the radio interface unit to a wireless handheld unit to signal a trip signal by an FCI.

Alternatively, a reset current signal $I_R$ may be sent from a detection device such as an FCI 206 after the current in a conductor (e.g., 210 of FIG. 1) is restored from a previously tripped condition. In order to distinguish between the reset current signal $I_R$ and the trip current signal $I_T$, these signals may be sent or established in opposite directions. The reset current signal $I_R$ induces a magnetic field 540 at the inductor coil L1 of the inductor coil probe 508d. The magnetic field 540 from the reset current $I_R$ induces a current $I_1$ in inductor coil 420d of the radio interface unit. This induced current further induces a voltage $V_1$ across load 538d. Information regarding the decreased voltage $V_1$ (as opposed to an increased voltage $V_1$ for a trip signal) across load 538d may be transmitted from the radio interface unit to the wireless handheld unit to signal a reset signal by an FCI.

Figure 7:
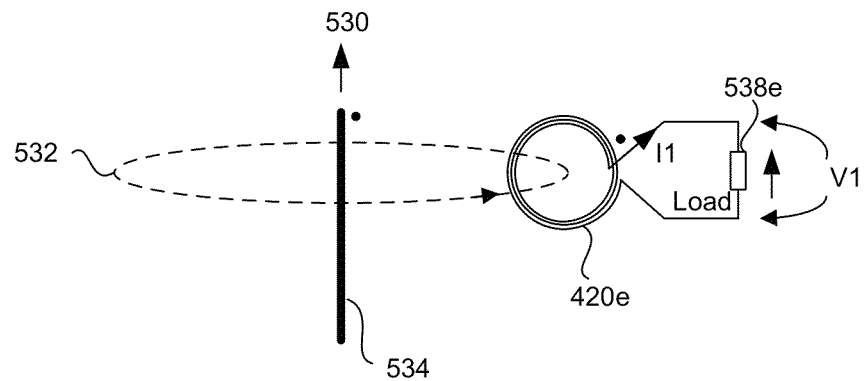
FIG. 7 is a circuit diagram showing magnetic field interference with the communication member and the interface.

Nevertheless, communication members having a single probe as discussed in the previous figures are often susceptible to magnetic or electromagnetic field interference from external sources. For example, as illustrated in FIG. 7, an interfering magnetic field 532 may be produced by an adjacent power line 534 carrying high current 530. The interfering magnetic field 532 may induce a current in inductor coil 420e of the radio interface unit. This induced current further induces a voltage $V_1$ across load 538e, and thereby produces a false trip or reset signal.

Figure 8:
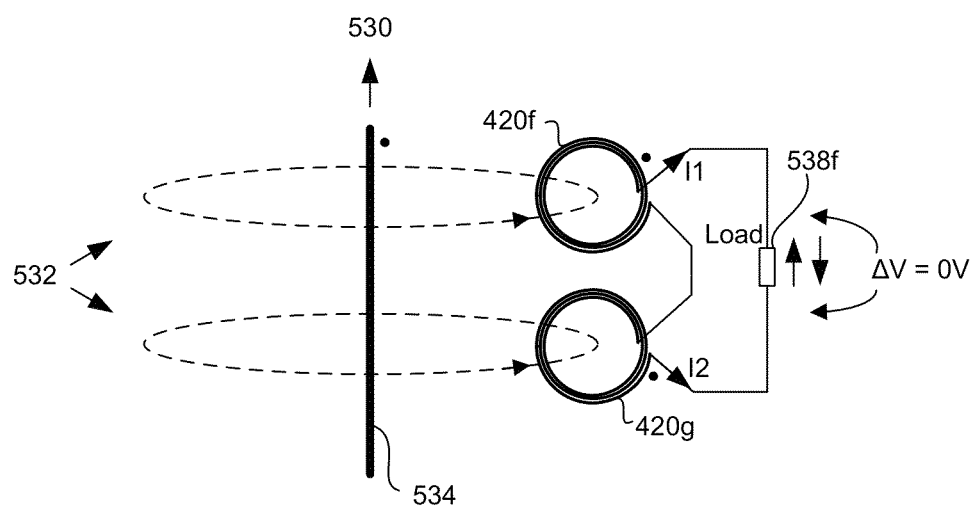
FIG. 8 is a circuit diagram of an embodiment of the present invention system showing the compensation for magnetic field interference implementing a differential inductor coil configuration.

As illustrated in FIG. 8, the interfering magnetic field 532 may be cancelled using a differential inductor coil configuration. In this arrangement, the communication member includes two inductor coils 420f and 420g which are connected in opposite directions. The interfering magnetic field 532 induces a current $I_1$ in inductor coil 420f and a current $I_2$ in inductor coil 420g of the radio interface unit. The currents $I_1$ and $I_2$ are induced in opposite directions and each induce a voltage $V_1$ in opposite polarity to each other across load 538f. Accordingly, this arrangement provides for a net induced voltage of 0, thereby compensating for interference from a magnetic field and thereby negating false signals.

Figure 9:
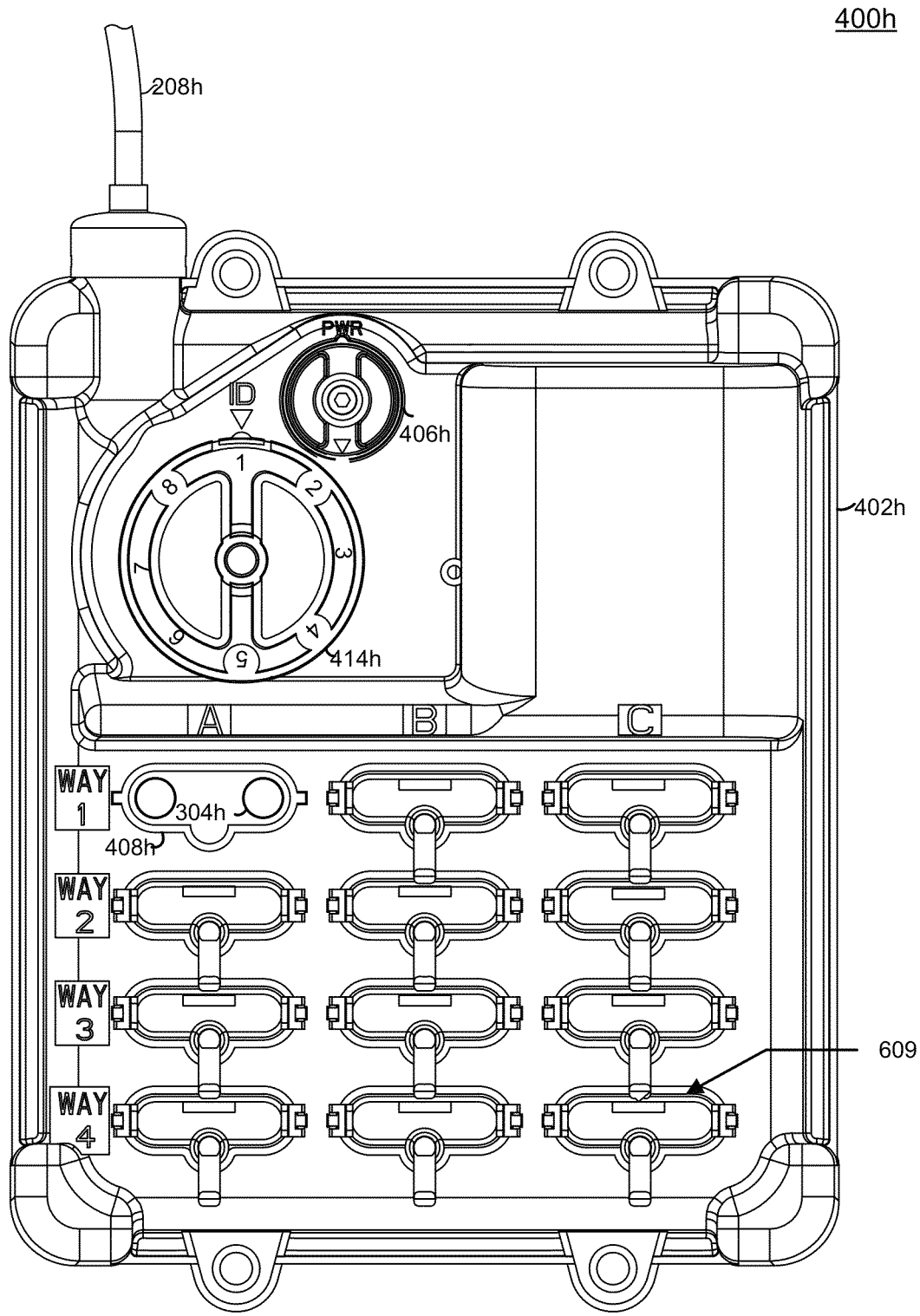
FIG. 9 illustrates an example of the housing of a radio interface unit in accordance with an aspect of the present invention.

Referring to FIG. 9, a radio interface unit 400h is provided for accommodating a differential inductor coil probe for cancelling interfering magnetic fields. The substantially self-contained construction of the housing 400h may be generally similar to the housing 402h described with respect to FIG. 4. Accordingly, the housing 402h further defines cavities (e.g., at 304h) for receiving differential inductor coil probes (e.g., at 609) having dual prongs in a manner in which they do not expose the electronic components contained within the housing 402h to the external environment.

In another embodiment, the radio interface unit 400a may be provided for accommodating a differential inductor coil for cancelling interfering magnetic fields. This embodiment is similar to that described above in conjunction with FIG. 9, except that each socket 408a includes only a single cavity 304a to accept the single inductor coil probe 508a. Instead of having a differential inductor coil probe for each probe 508a, there is a single differential inductor coil for cancelling interfering magnetic fields.

The differential inductor coil probes (e.g., at 609) which interface the cavities (e.g., at 304h) are coupled to a detection device such as an FCI as described with regards to FIG. 1. The differential inductor coil probe 609 is also substantially self-contained. The differential inductor coil probes (e.g., at 609) wirelessly communicate with the radio interface unit 400h via cavities (e.g., 304h) in the manner described below.

Figure 10A:
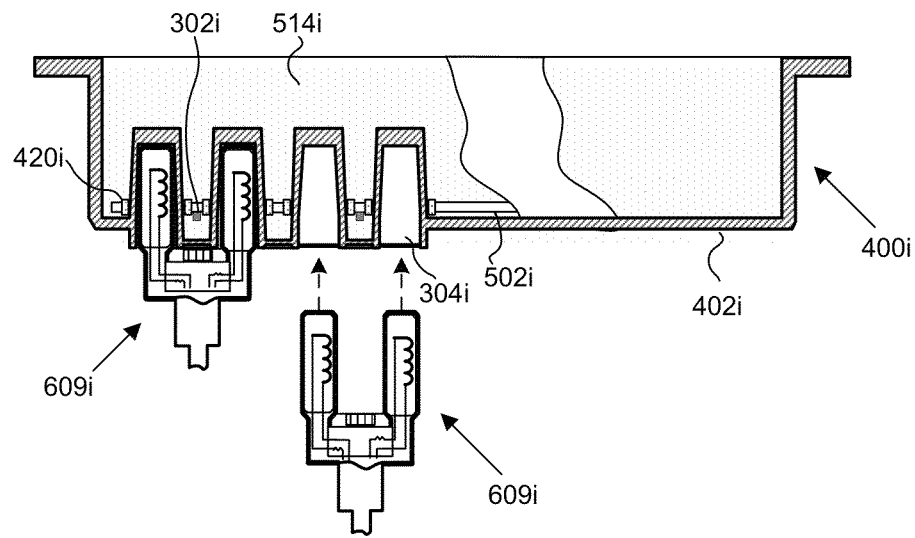
FIGS. 10A and 10B illustrate a cross-sectional view of an embodiment of the present invention system showing the engagement of the communication member and interface implementing a differential inductor coil configuration.
Figure 10B:
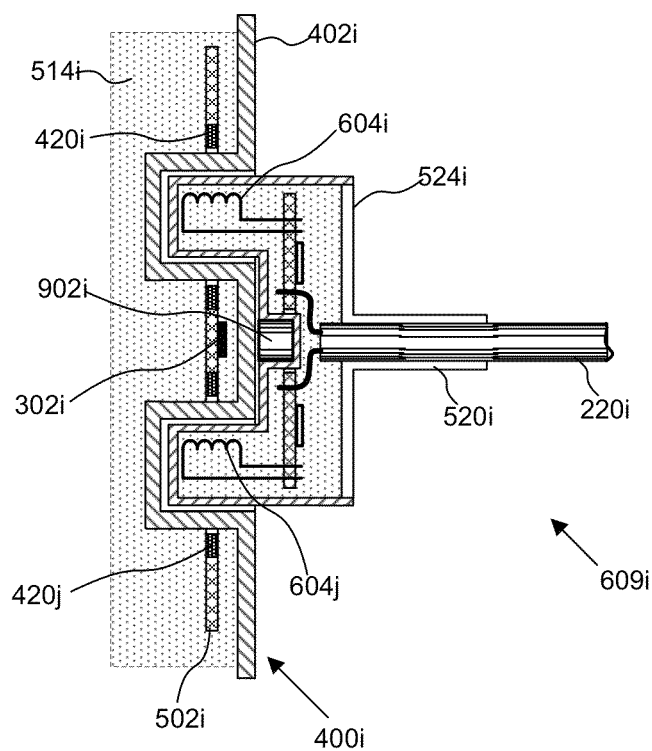
Figure 10C:
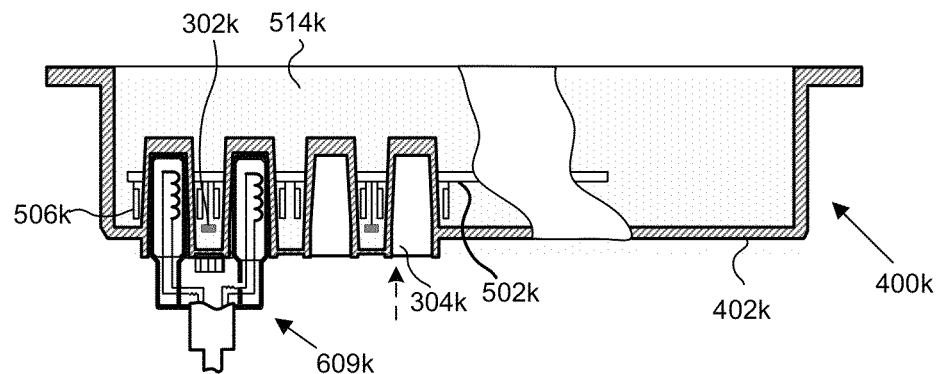
FIGS. 10C and 10D illustrate a cross-sectional view of another embodiment of the present invention system showing the engagement of the communication member and interface implementing a differential inductor coil configuration.
Figure 10D:
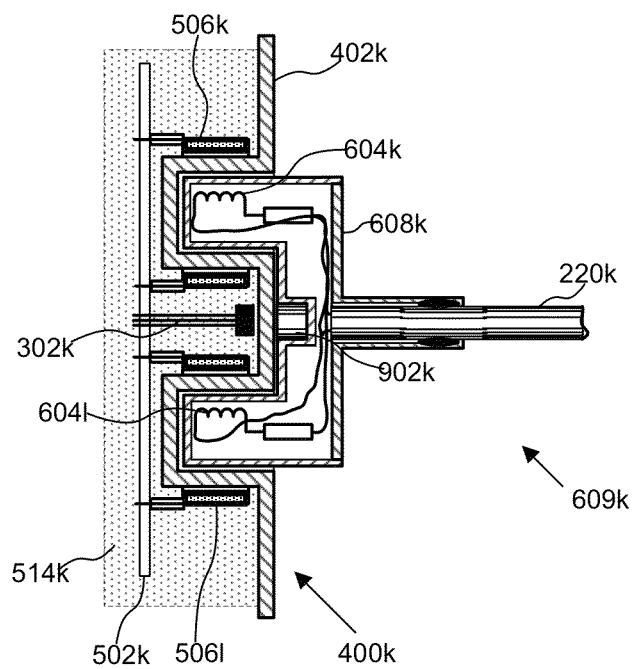

FIGS. 10A and 10B illustrate one embodiment of the hardware arrangement for the circuitry described with respect to FIG. 8 having an interface between the differential inductor coil probe and the cavity. Contained within the housing 402i are various electronic components of the radio interface unit 400i. The electronic components are further encapsulated by an encapsulate material 514i such as a potting material. The housing 402i further defines a plurality of cavities (e.g., at 304i) for receiving differential inductor coil probes (e.g., at 609i) in a manner in which they do not expose the electronic components contained within the housing 402i to the external environment. Further provided is a printed circuit board 502i which includes a plurality of magnetic field sensors such as hall-effect sensors (e.g., at 302i) and a plurality of inductors (e.g., at 420i) implemented thereon. FIGS. 10C and 10D are similar to FIGS. 10A and 10B with the exception that the inductors 506k of FIGS. 10C and 10D are in the form of coiled inductors.

During operation of each to the embodiments illustrated in FIGS. 10A-D, the interface between the differential inductor coil probes 609 i, k and the radio interface unit 400 i, k is as follows. The differential inductor coil probes 609 i, k may be inserted into the cavities 304i, k. For example, as shown in FIGS. 9B and 9D, a magnet 902 i, k is situated between the prongs of differential inductor coil probe 609 i, k. A corresponding magnetic field sensor (e.g., hall-effect sensor 302 i, k) situated on printed circuit board 502 i, k detects the presence of a magnetic field from magnet 902 i, k upon insertion of the differential inductor coil probe 609 i, k into the cavity 304 i, k. The hall-effect sensor 302 i, k produces a signal to the microprocessor, thereby signaling the presence of a differential inductor coil probe 609 i, k. Although a hall-effect sensor is described herein, other suitable elements may be implemented (e.g., a Reed switch).

The differential inductor coil probes 609 i, k which interface the cavities 304 i, k are coupled to a detection device such as an FCI as described with regards to FIG. 1. The differential inductor coil probe 609 i, k includes an inductor coil 604 i, k in each prong and is also substantially self-contained. The differential inductor coil probes 609 i, k wirelessly communicate with the radio interface unit 400 i, k via cavities (e.g., 304 i, k) by magnetic field induction in the manner described below.

Figure 11:
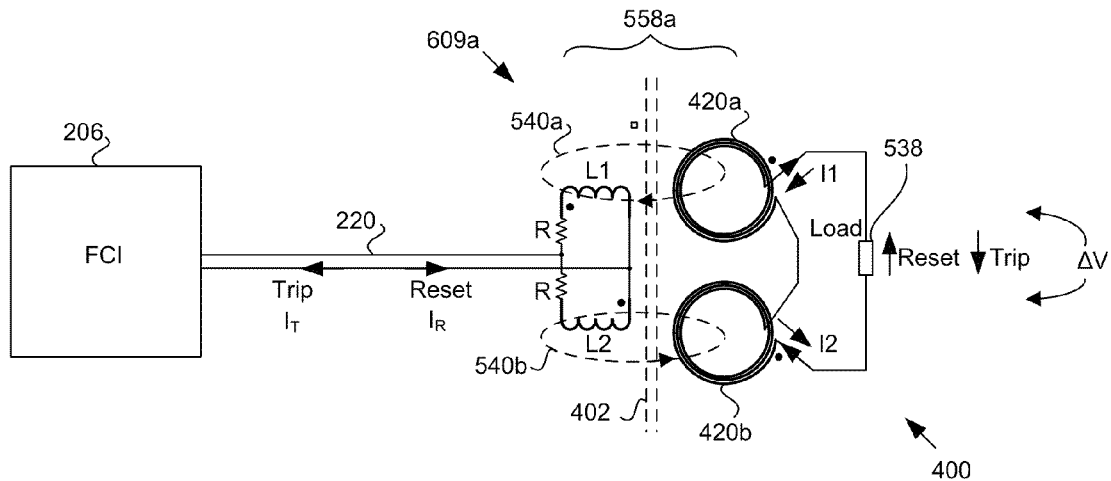
FIG. 11 is a circuit diagram of an embodiment of the present invention system illustrating the interaction between the communication member and the interface implementing a parallel inductor coil configuration.

FIG. 11 illustrates one embodiment which implements the differential coil configuration of FIG. 8. In this arrangement, the differential inductor coil probe 609a is in a parallel inductor coil configuration. During operation, two inductor coils 420a and 420b are connected in parallel in opposite directions. The interfering magnetic field (not shown) induces a current $I_1$ in inductor coil 420a and a current $I_2$ in inductor coil 420b of the radio interface unit. The currents $I_1$ and $I_2$ are induced in opposite directions and each induce a voltage $V_1$ in opposite polarity to each other across load 538, thereby canceling the respective voltages. Accordingly, this arrangement provides for a net induced voltage of 0, thereby compensating for interference from a magnetic field and negating false signals.

The arrangement of FIG. 11, in effect, forms a differential pulse transformer configuration 558a, whereupon high-energy, short-lasting pulses are transmitted with low distortions. During operation, a trip current signal $I_T$ is sent from a detection device such as an FCI 206 when a conductor (e.g., 210 of FIG. 1) related thereto exceeds a select current threshold (e.g., upon an occurrence of a ground fault) via cable 220 into differential inductor coil probe 609a with series load resistors R. The inductor coils L1 and L2 are connected in parallel to generate magnetic fields 540a and 540b in opposite directions. The trip current signal $I_T$ induces magnetic fields 540a and 540b in opposite directions. The magnetic fields 540a and 540b from the trip current $I_T$ induces currents $I_1$ and $I_2$ in inductor coils 420a and 420b of the radio interface unit. The induced currents $I_1$ and $I_2$ further induce a differential voltage $\Delta V$ across load 538. Information regarding a positive differential voltage $\Delta V$ across load 538 may be transmitted from the radio interface unit to the wireless handheld unit to signal a trip signal by an FCI.

Alternatively, a reset current signal $I_R$ may be sent from a detection device such as an FCI 206 after the current in a conductor (e.g., 210 of FIG. 1) is restored from a previously tripped condition. In order to distinguish between the reset current signal $I_R$ and the trip current signal $I_T$, these signals may be sent or established in opposite directions. The reset current signal $I_R$ induces magnetic fields 540a and 540b in opposite directions. The magnetic fields 540a and 540b from the reset current $I_R$ induces currents $I_1$ and $I_2$ in inductor coils 420a and 420b of the radio interface unit. The induced currents $I_1$ and $I_2$ further induce a differential voltage $\Delta V$ across load 538. Information regarding a negative differential voltage $\Delta V$ across load 538 may be transmitted from the radio interface unit to the wireless handheld unit to signal a reset signal by an FCI.

Figure 12:
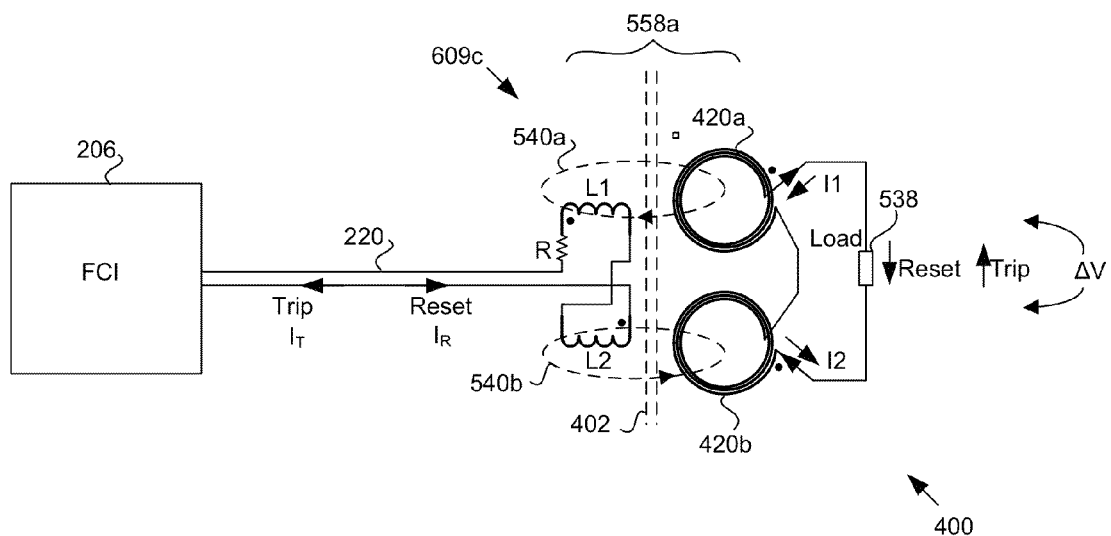
FIG. 12 is a circuit diagram of an embodiment of the present invention system illustrating the interaction between the communication member and the interface implementing a serial inductor coil configuration.

In yet another embodiment, FIG. 12 illustrates another embodiment which implements the differential coil configuration of FIG. 8. In this arrangement, the differential inductor coil probe 609c is in a serial inductor coil configuration. During operation, two inductor coils 420a and 420b are connected in series in opposite directions. The interfering magnetic field (not shown) induces a current $I_1$ in inductor coil 420a and a current $I_2$ in inductor coil 420b of the radio interface unit. The currents $I_1$ and $I_2$ are induced in opposite directions and each induce a voltage $V_1$ in opposite polarity to each other across load 538, thereby canceling the respective voltages. Accordingly, this arrangement provides for a net induced voltage of 0, thereby compensating for interference from a magnetic field and negating false signals.

The arrangement of FIG. 12, in effect, forms a differential pulse transformer configuration 558a, whereupon high-energy, short-lasting pulses are transmitted with low distortions. Because the inductor coils L1 and L2 are connected in series, the design values thereof are generally lower than the parallel arrangement of FIG. 11 due to the additive or period inductance. During operation, a trip current signal $I_T$ is sent from a detection device such as an FCI 206 when a conductor (e.g., 210 of FIG. 1) related thereto exceeds a select current threshold (e.g., upon an occurrence of a ground fault) via cable 220 into differential inductor coil probe 609a with series damping ringing pulse resistors R. The inductor coils L1 and L2 are connected in series to generate magnetic fields 540a and 540b in opposite directions. The trip current signal $I_T$ induces magnetic fields 540a and 540b in opposite directions. The magnetic fields 540a and 540b from the trip current $I_T$ induces currents $I_1$ and $I_2$ in inductor coils 420a and 420b of the radio interface unit. The induced currents $I_1$ and $I_2$ further induce a differential voltage $\Delta V$ across load 538. Information regarding a positive differential voltage $\Delta V$ across load 538 may be transmitted from the radio interface unit to the wireless handheld unit to signal a trip signal by an FCI.

Alternatively, a reset current signal $I_R$ may be sent from a detection device such as an FCI 206 after the current in a conductor (e.g., 210 of FIG. 1) is restored from a previously tripped condition. In order to distinguish between the reset current signal $I_R$ and the trip current signal $I_T$, these signals may be sent or established in opposite directions. The reset current signal $I_R$ induces magnetic fields 540a and 540b in opposite directions. The magnetic fields 540a and 540b from the reset current $I_R$ induces currents $I_1$ and $I_2$ in inductor coils 420a and 420b of the radio interface unit. The induced currents $I_1$ and $I_2$ further induce a differential voltage $\Delta V$ across load 538. Information regarding a negative differential voltage $\Delta V$ across load 538 may be transmitted from the radio interface unit to the wireless handheld unit to signal a reset signal by an FCI.

Figure 13:
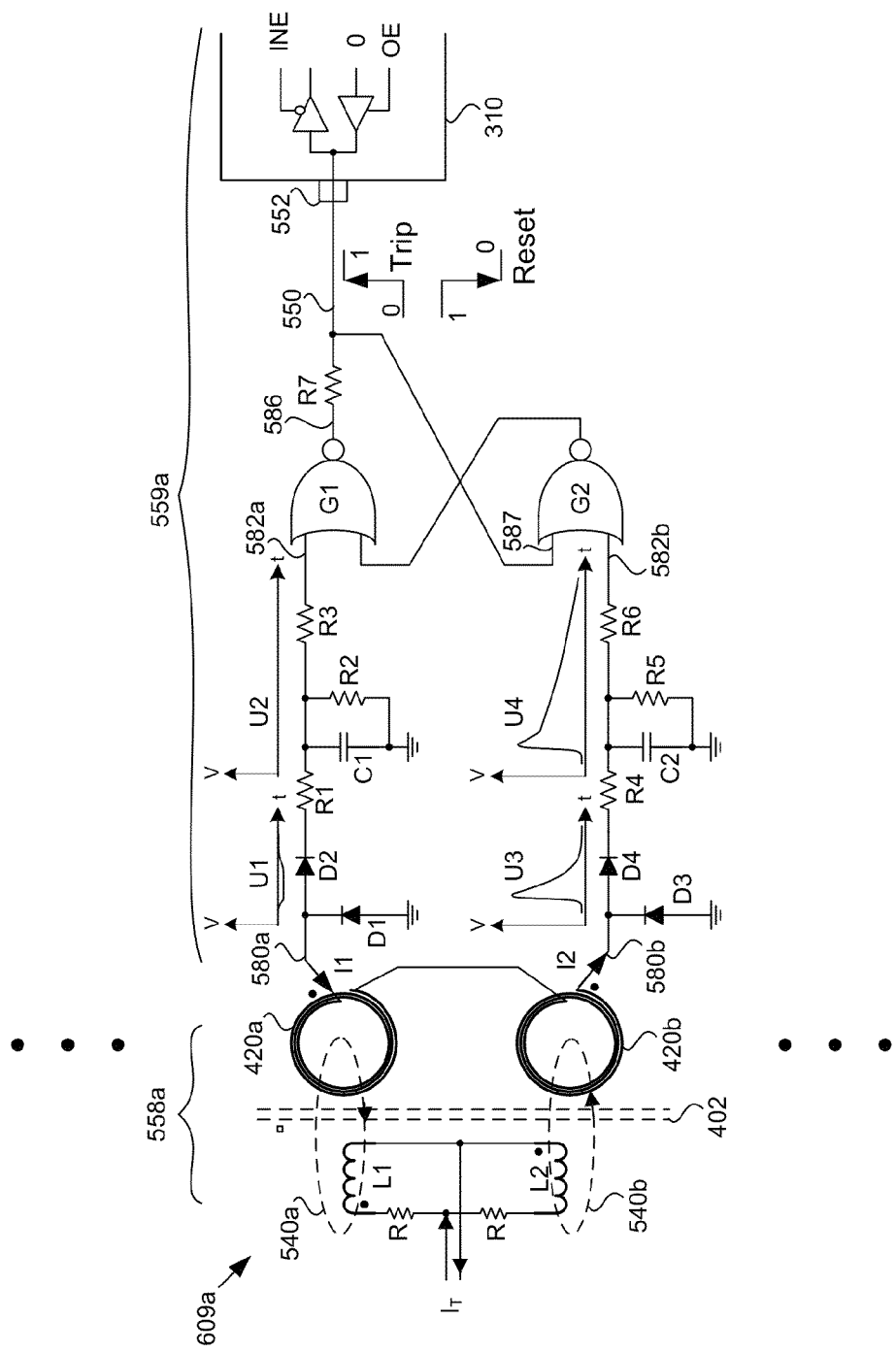
FIG. 13 is a circuit diagram of an embodiment of the present invention system illustrating the interaction between the communication member and the interface implementing a circuit for preventing false latching from ringing currents.

FIG. 13 illustrates another embodiment which implements the differential coil configuration of FIG. 8. In this arrangement, a trip current $I_T$ or a reset current $I_R$ signal from the differential inductor coil probe 609a generates equal and opposite magnetic fields 540a and 540b. The magnetic fields 540a and 540b induce currents $I_1$ and $I_2$ in the radio interface unit. A detection circuit 559a is further provided with symmetrical network branches having inputs 580a and 580b coupled to inductor coils 420a and 420b. Symmetrical ends 582a and 582b are further coupled to a latching flip-flop G1/G2 and a microcontroller 310. Each symmetric network branch includes a series diode; an amplitude control element such as a shunt diode or a shunt resistor; a low pass filter; and a charging circuit (or charge holding circuit). In an embodiment of the detection circuit 559a, shunt diodes D1 and D3 are the amplitude control elements for the incoming pulse, whereas the low pass filter and charging circuit is formed by a network of resistors and capacitor.

More specifically, the direction of the voltage/current peak from an induced pulse is detected with four diodes (D1, D2, D3 and D4) at inputs 580a and 580b, respectively. A positive pulse U3 FIG. 13Aii (at D3 and D4) is directed through resistor R4 into capacitor C2, storing the charge. Resistor R5 or R2 allows capacitor discharging of positive pulse U3 in a controlled manner, preventing false latching from ringing currents from the FCI and probe circuits (e.g., L1, L2 and R). A negative pulse U1 FIG. 13Ai is conducted through diode D1, with diode D2 blocking any residual voltage from getting into capacitor C1 through clamping in diode D1 and reverse bias rectification in diode D2. Diode D1 clamps the negative pulse at about −0.5 V to −0.8 V, depending on the diode type.

The R4/C2 (and R1/C1) components create a low-pass filter, preventing high frequency spikes changing the logic state of the flip-flop gates G1/G2 (NOR gate flip flops). The positive pulse U3 generates a current, through R4, which charges capacitor C2. Resistors R6 and R3 each prevent latch-up of respective CMOS gates G2 and G1, and allow charging capacitors C1 and C3 to reach a higher voltage above the internal CMOS gates clamping voltage. Charging and retaining charge is important in preventing undesired flip-flop action due to ringing in the Trip/Reset pulses. In this arrangement, NOR gates G1 and G2 are further connected in an R-S flip-flop configuration, with active-high inputs.

Pulse U4 FIG. 13Bii is applied to gate G2 input 587 of the flop-flop. If the flip-flop outputs logic 0 on G1 at output 587, prior to the trip pulse, the pulse changes the logic state of line 550 from logic 0 to logic 1. The status of the flip-flop is evaluated with a microprocessor 310 at I/O interface 552. The microprocessor 310 such as a Texas Instruments MSP430 family is suitable for this application where a standard program can be written.

On a power-up, flip-flop G1/G2 sets a random output logic level on line 550. Resistor R7, serial with the G1 output, allows for resetting of the flip-flop G1/G2 with the microprocessor 310. A program may further be provided for driving the microprocessor 310, changing the I/O interface 552 from input to output, and setting line input 550 with a logic 0. If, at the same time, the gate G1 outputs logic 1, the resistor R7 allows voltage at gate G2 input 587 to drop below the threshold level of logic 0, causing flip-flop G1/G2 to change the G1 output to logic 0. This circuit arrangement allows reusing the same line 550 to read logic data from flip-flop G1/G2 and resetting the flip-flop G1/G2, with a single copper trace line input 550 and a single reset resistor R7.

The flip-flop NOR gates G1/G2 may further create a CMOS memory location, thereby allowing for latching and storage of logic values for month and years. CMOS inherently uses a relatively small supply current, thereby allowing for extension of the lifetime of a supply battery.

A ringing pulse from a trip pulse or a reset pulse can often cause false latching. The arrangement of FIG. 13 provides for an embodiment which suppresses such false latching. FIGS. 14A-14C depict the progression of a ringing pulse exiting the detection circuit of FIG. 13 and the suppression of false latching caused by ringing.

The arrangement of FIG. 13 is designed to accept a trip/reset pulse from a various FCI sensors and differential inductor coil probes. Such hardware diversification may result in a trip or reset pulse with multiple ringing portions such as 560*b*, 564*a* and 566*b* in induced pulse U1, and 560*c*, 564*c* and 566*c* in induced pulse U3 shown in FIGS. 13Ai and 13Aii. In effect, induced pulses U1 and U3 generated by differential pulse transformer 558*a* at both ends of the coil pair (e.g., inductor coils 420*a* and 420*b*) will be of similar amplitude and reversed polarity in the absence of shunt diodes D1 and D3 and series diodes D2 and D4 (shown as dotted lines).

Shunt diodes D1 and D3 may be used to clamp a negative pulse, whereas series diodes D2 and D4 may be used to rectify and pass a positive pulse in forward bias. Diode pairs D1 and D2 clamp and rectify negative and positive pulse portions 560*a*, 564*a* and 566*a* in a reversed polarity induced pulse U1. Diode pairs D3 and D4 rectify and clamp positive and negative pulse portions 560*c*, 564*b* and 566*c*, respectively, in a positive polarity induced pulse U3.

FIG. 14Bi depicts the voltage of pulse U2 across capacitor C1, induced by a ringing pulse U1. An erred latching of the flip-flop G1/G2 may result if the voltage of pulse U2 reaches above the logic 1 threshold 570. The desired positive polarity induced pulse U3 depicted in FIG. 14Aii with a higher amplitude generates filtered pulse U4 across capacitor C2 as shown in FIG. 14Bii, that in turn generates logic 1 for gate G2. The charge of pulse U4 across capacitor C2 holds longer than the later charging of ringing pulse U2 across C1 as shown in FIG. 14Bi.

Figure 14:
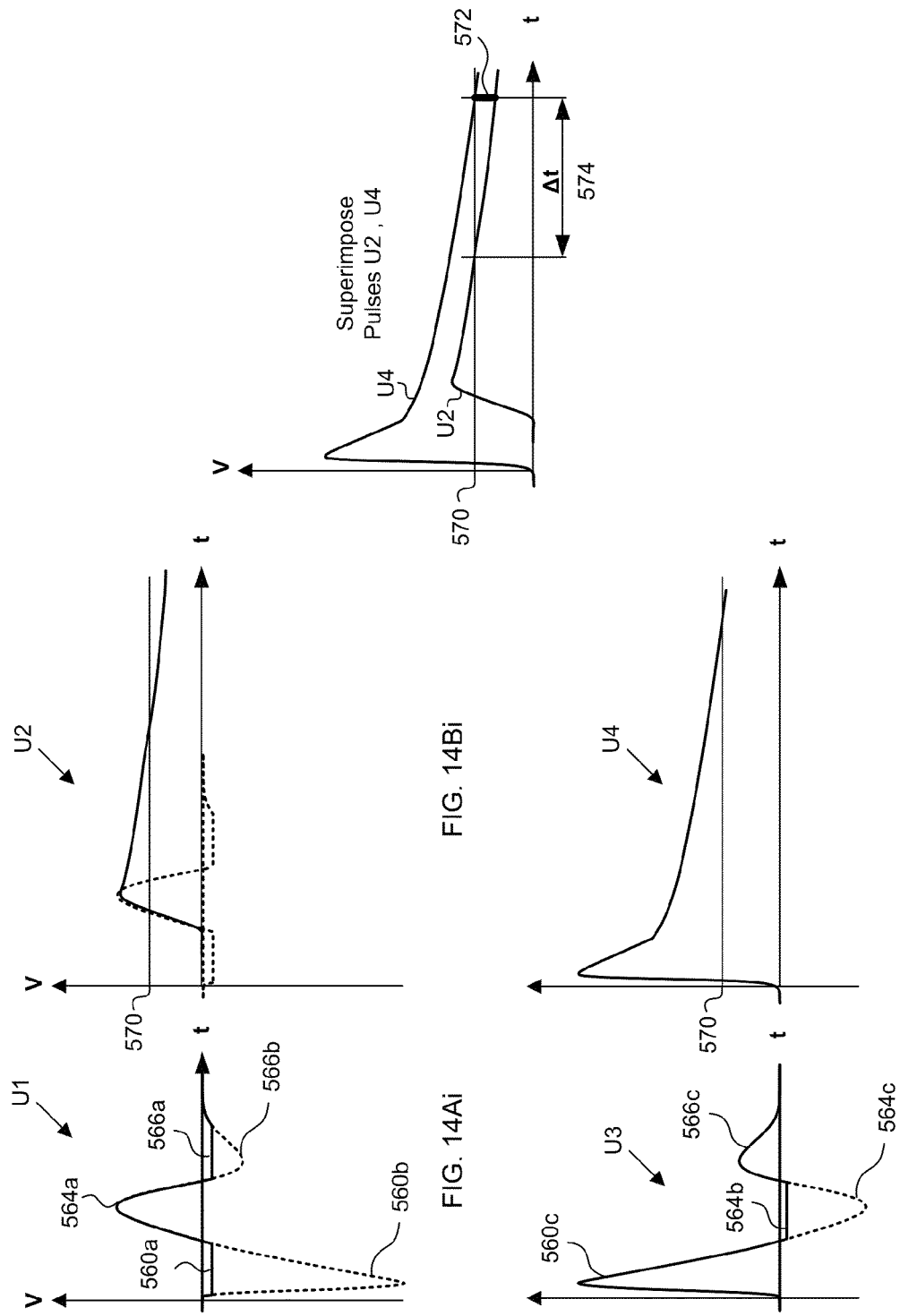
FIGS. 14A-14C are graphical representations depicting the progression of a ringing pulse exiting the detection circuit of FIG. 12 and the suppression of false latching caused by ringing.

FIG. 14*c* superimposes pulses U2 and U4 presented to the flip-flop G1/G2 to illustrate the concept that an extended logic 1 level of pulse U4 presented to gate G2 outlasts a false logic 1 caused by ringing pulse U2 presented to gate G1, thus preserving a proper logic latch by the flip-flop G1/G2. The time constant of the C2/R5/R6 (or C1/R2/R3) allows for rejection of most false ringing voltage of pulse U2 by a voltage margin 572, and a time margin 574 depending on the amplitude differences of pulses U4 and U2 set at the logic level in G1/G2. The diode pair and RC network in differential arrangement allows for error-free detection of the desired induced pulse U4 under the presence of a "ringing" signal U2 on the opposite side of the differential pulse transformer 558. The same principle of operation applies if the induced pulses U1 and U3 are of reverse polarity, except that the pulses in FIGS. 14*a* to 14*c* will be interposed between U1 and U3, and between U2 and U4. The teachings described in relation to FIGS. 13 and 14 may further be implemented for a single probe differential coil configuration without deviating from the spirit of the present invention.

Further according to the present invention, it is envisioned that any type of detection device that is capable of sending a positive and a negative signal may be used in conjunction with or in place of the radio interface unit. Some examples of detection devices (other than an FCI) that may be used include: water, high voltage electric field, specific gravity, light, and sound, gas sensors such as CO, CO2, SOx, NOx, Ammonia, Arsine, Bromine, Chlorine, Chlorine Dioxide, VOCs, Combustibles, Diborane, Ethylene Oxide, Fluorine, Formaldehyde, Germane, Hydrogen, Hydrogen Chloride, Hydrogen Cyanide, Hydrogen Fluoride, Hydrogen Selenide, Hydrogen Sulfide, Oxygen, Ozone, Methane, Phosgene, Phosphine, Silane, and the like; pressure sensors for sensing, for example, pressure in a gas line, water line, waste line, oil line, and the like; temperature sensors; electromagnetic radiation sensors; radiation sensors; smoke sensors; particulate matter sensors; liquid phase sensors such as pH, turbidity, Br—, Ca2+, Cl—, CN—, Cu2+, F—, I—, K+, Na+, NH4+, NO3-, Pb2+, S-(AG+), conductivity sensors, and the like; radio wave sensors; electrical sensors such as under voltage sensors, over voltage sensors, under current sensors, over current sensors, frequency sensors and the like; power factor alarms; demand overload indicators; sensors that detect the presence of primary system voltage; sensors that determine if a sealed subsurface fuse has operated by sensing voltage on each side of fuse element with loss of load current; sensors that sense the open or closed position of a subsurface switch; voltage sensors which monitors status of lead-acid batteries used to run controller or motor operators for subsurface switches; power quality sensors which detect primary voltage swells and sags along the distribution system, and other sensors that detect power quality issues and send an alarm status.

The detection device communicates with the radio interface unit 400 according to any of the embodiments herein described. Thus, the monitoring system of the present invention may be used to monitor states or conditions that are detected with any of the detection devices (e.g., FCIs or other sensors) mentioned above.

It is a further aspect of this invention that the faulted circuit indicator monitoring system differentiate between the different types of detection devices that may be in communication with the radio interface unit 400. The differentiation may be performed between two different types of detection devices using the permanent magnet (e.g., at 902*b*, 902*c*, 902*i*, or 902*k*) of the inductor coil probes (e.g., at 508*a*, 508*b*, 508*c*, 609, 609*i*, or 609*k*) and the magnetic field sensor (e.g., 302*b*, 302*c*, 302*i*, or 302*k*). The polarity of the permanent magnet (e.g., at 902*b*, 902*c*, 902*i*, or 902*k*) for a particular type of detection device may be a polar opposite from the permanent magnet (e.g., at 902*b*, 902*c*, 902*i*, or 902*k*) for another particular type of detection device. The radio interface unit 400 may then be configured to transmit the status of only one particular type of detection device when interrogated by a specific wireless device 102 (or when the wireless device 102 interrogates using a specific algorithm), and transmit the status of another particular type of detection device when interrogated by another specific wireless device 102 (or when the wireless device 102 interrogates using another algorithm).

For example, the radio interface unit 400 may be mounted in a vault 200 containing electrical conductors for an electrical power utility, and access to water lines for a water utility. Faulted circuit indicators may be used to monitor faulted circuits on the electrical conductors, and may be in communication with the radio interface unit 400 using the various probe systems described herein. However, the inductor coil probes (e.g., at 508*a*, 508*b*, 508*c*, 609, 609*i*, or 609*k*) for the faulted circuit indicators would be configured such that the permanent magnets (e.g., at 902*b*, 902*c*, 902*i*, or 902*k*) have a common pole (north) facing the magnetic field sensor (e.g., 302*b*, 302*c*, 302*i*, or 302*k*). If the radio interface unit 400 has twelve connector sockets (e.g., 408*a*, 408*h*), less then all of them may be used by the faulted circuit indicators. The magnetic field sensors (e.g., 302*b*, 302*c*, 302*i*, or 302*k*) would sense that all of these inductor coil probes (e.g., at 508*a*, 508*b*, 508*c*, 609, 609*i*, or 609*k*) have permanent magnets (e.g., at 902*b*, 902*c*, 902*i*, or 902*k*) with a common polarity.

The radio interface unit 400 may also be in communication with inductor coil probes (e.g., at 508*a*, 508*b*, 508*c*, 609, 609*i*, or 609*k*) from detection devices for the water utility. For example, the water utility may want to monitor whether the pressure in the water lines exceeds a threshold. The water utility could install such detection devices on the water lines, and have these water pressure detection devices communicate with inductor coil probes (e.g., at 508*a*, 508*b*, 508*c*, 609, 609*i*, or 609*k*) in communication with the remaining connector sockets (e.g., 408*a*, 408*h*) of the radio interface unit 400. The inductor coil probes (e.g., at 508*a*, 508*b*, 508*c*, 609, 609*i*, or 609*k*) from the water utility would include permanent magnets (e.g., at 902*b*, 902*c*, 902*i*, or 902*k*) having a common pole (south) facing the magnetic field sensor (e.g., 302*b*, 302*c*, 302*i*, or 302*k*). The pole of the permanent magnets (e.g., at 902*b*, 902*c*, 902*i*, or 902*k*) facing the inductor coil probes (e.g., at 508*a*, 508*b*, 508*c*, 609, 609*i*, or 609*k*) of the water utility would be opposite the pole of the permanent magnets (e.g., at 902*b*, 902*c*, 902*i*, or 902*k*) facing the inductor coil probes (e.g., at 508*a*, 508*b*, 508*c*, 609, 609*i*, or 609*k*) of the electric utility. In this way, the radio interface unit 400 could differentiate between detection devices of different utilities, and transmit information relating only to the utility that interrogates the radio interface unit 400.

The radio interface unit 400*e* may include a particular identification setting such that it may be differentiated from the other radio interface units. For example, this identification setting may be in the form of a designation setting (e.g., serial number), whereupon each particular radio interface unit has a particular designation (e.g., a particular serial number). In another embodiment, the identification setting may be in the form of an address setting (e.g., a media access control (MAC) address). In yet another embodiment, in order to ensure proper differentiation among a plurality of units, each radio interface unit may include both a designation setting and an address setting. For example, both the radio interface unit 400*b* and radio interface unit 400*e* may be associated with a particular address (e.g., address 5). In order to differentiate between these radio interface units 400*b* and 400*e*, each radio interface unit 400*b* and 400*e* is given a particular designation setting (e.g., particular serial numbers). In this way, radio interface units may be differentiated.

Referring back to the drawings and to FIGS. 2A and 2B in particular, a wireless device 102 communicates 904 with eight installations of faulted circuit indicators 200*a*-200*h*. As illustrated, each installation of faulted circuit indicators consists of a radio interface unit, and four separate groups ("ways") of faulted circuit indicators, wherein each group has three faulted circuit indicators, one for each phase. For example, the installation shown at 200*e*, as shown in FIGS. 2A and 2B includes four separate groups 206*a*-*d* of faulted circuit indicators connected to a radio interface unit 400*e* through cables 220*e* with a separate short range antenna 202*e* connected through cable 208*e*. This radio interface unit 400*e* may include a particular setting such that it may be differentiated from the other radio interface units. For example, this identification setting may be in the form of a designation setting (e.g., serial number), whereupon each particular radio interface unit has a particular designation (e.g., a particular serial number). In another embodiment, the identification setting may be in the form of an address setting (e.g., a media access control (MAC) address). In yet another embodiment, in order to ensure proper differentiation among a plurality of units, each radio interface unit may include both a designation setting and an address setting. For example, both the radio interface unit 400*b* and radio interface unit 400*e* may be associated with a particular address (e.g., address 5). In order to differentiate between these radio interface units 400*b* and 400*e*, each radio interface unit 400*b* and 400*e* is given a particular designation setting (e.g., particular serial numbers). In this way, radio interface units may be differentiated.

Each faulted circuit indicator within these separate groups 206*a*-*d* may be used to monitor the various phases (e.g., commonly referred to as the A, B, C phases) associated therewith. For example, each of the faulted circuit indicators associated with way 206*a* may be used to monitor the three phases associated therewith. Through this system, the installation 200*e* of faulted circuit indicators 206*a*, 206*b*, 206*c*, 206*d* may communicate with wireless device 102.

Figure 4A:
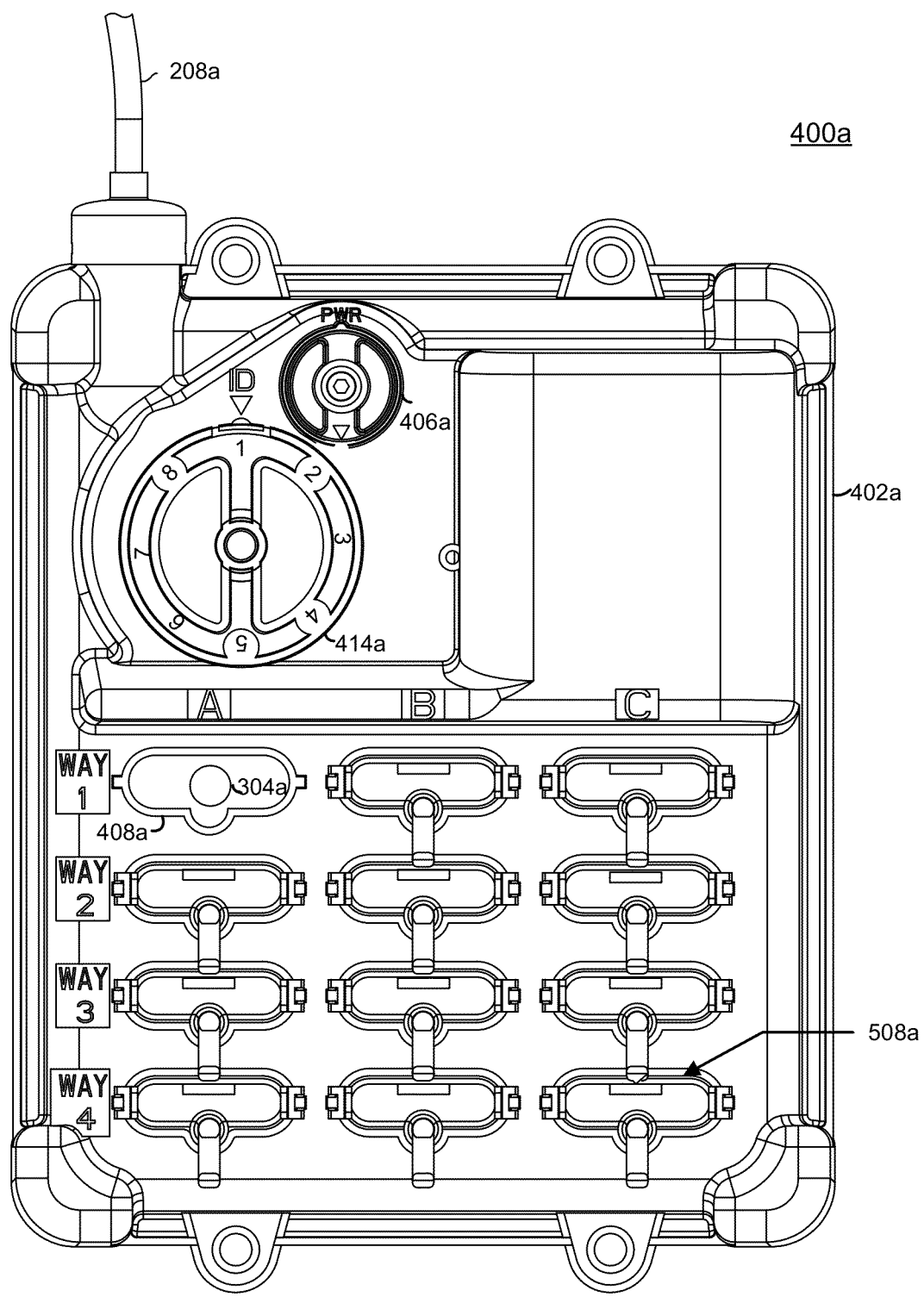
FIGS. 4A and 4B illustrate an example of the housing of a radio interface unit in accordance with an aspect of the present invention.
Figure 4B:
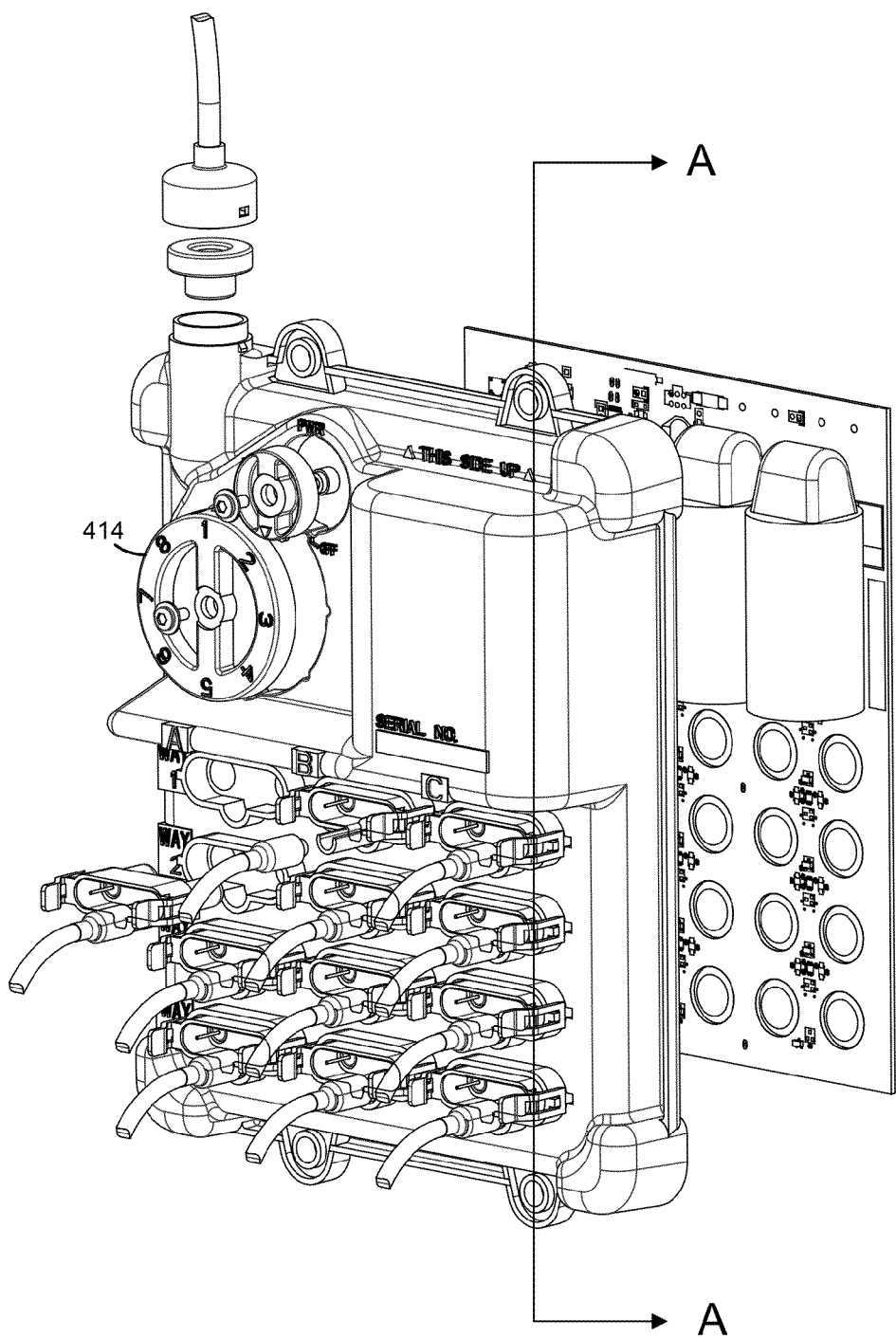

In one embodiment in which the identification setting of each radio interface unit is an address setting, the address setting of a radio interface unit 400 may be adjusted by simply turning the address dial 414 as illustrated in FIGS. 4*a* and 4*b*. Although this embodiment specifically describes the setting in the form of an identification setting and, more particularly an address setting, the setting to be adjusted may be any setting, (e.g., a designation setting, power setting, communication setting, etc.). Moreover, although a dial is specifically shown, any actuator is suitable (e.g., a linear multi-position switch instead of a dial).

The address dial 414 may also be self-contained. Accordingly, the address dial does not mechanically or electrically engage any of the internal electronic components contained within the housing 402 of the radio interface unit. This allows for the housing 402 of the radio interface unit to be substantially self-contained. As such, the substantially self-contained housing 402 allows the radio interface unit 400 to be submergible and capable of withstanding harsh environments. This arrangement is an example of a system for adjusting the settings of a power system device using a magnetically coupled actuator.

Figure 15:
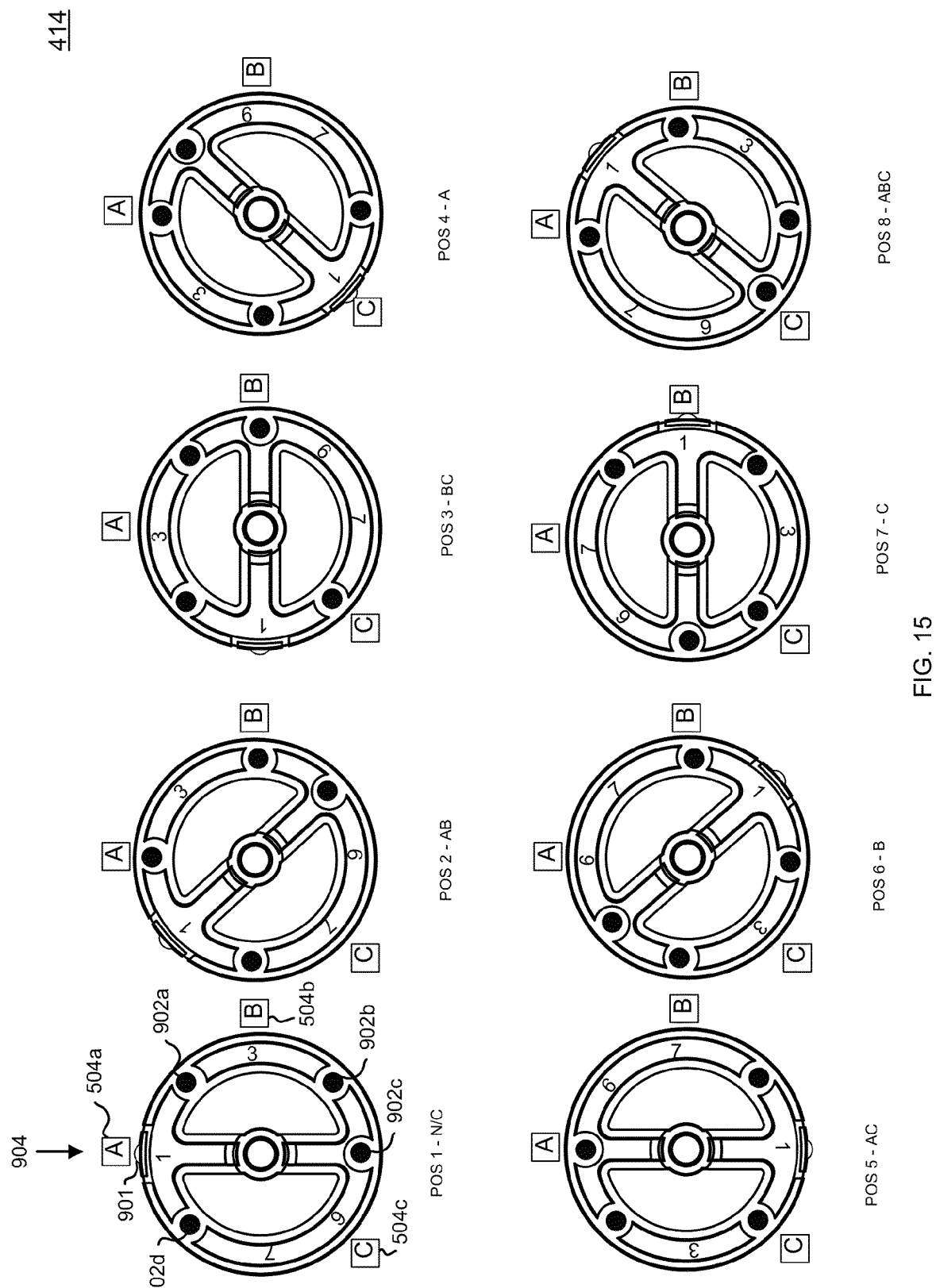
FIG. 15 illustrates a dial having a plurality of magnets in a select arrangement, wherein each arrangement corresponds to a select identification setting.

More specifically, FIG. 15 illustrates the address dial of FIGS. 4*a* and 4*b*. The address dial generally includes a plurality of magnets situated in a select arrangement. By turning the address dial 414, the plurality of magnets may be situated in various select arrangements. The select arrangements may correspond to various select addresses. In the illustrated embodiment, turning the address dial 414 in the counter-clockwise direction progresses through the various addresses in increasing order. Alternatively, the radio interface unit may be configured such that turning the address dial 414 in the clockwise direction progresses through the various addresses in increasing order.

In an embodiment, the magnetically coupled address dial 414 has a start position at 901 and a circular rotatable dial with a plurality of embedded magnets (e.g, 902*a* to 902*d*). The arrangement of magnets may correspond to select addresses. More specifically, when the magnets are coupled to one or more magnetic field sensors such as Hall effect sensors or Reed switches 504*a*, 504*b* and 504*c* at positions A, B and C, the select arrangement of the magnets is detected and a select address corresponding thereto is provided.

In an embodiment of the present invention, address dial 414 includes four magnets 902*a* to 902*d*, which may be coupled to three magnetic field sensors for detecting the select arrangement of the magnets. The Hall effect sensors or Reed switches 504*a* to 504*c* are connected to a microprocessor 310 (FIGS. 6A, 6B, 6C, and 6D) within radio interface unit 400. The microprocessor processes the select magnet arrangement and provides a select address corresponding thereto.

The illustrated embodiment has eight settable positions indicated at position A as a position pointer 904. The three bits read by Hall effect sensors or Reed switches 504a, 504b and 504c represent binary addresses corresponding to select radio interface units. For example, magnets such as 902a and 902b coupled to Hall effect sensors or Reed switches A and B will form a binary bit of 011. This binary bit provides for a specific binary address for the radio interface unit. A binary address table corresponds to the pointer position 904 can be constructed as below:

| Pointer Position | Hall Sensor coupled | Binary Address |
| --- | --- | --- |
| 1 | N/C | 000 |
| 2 | AB | 011 |
| 3 | BC | 110 |
| 4 | A | 001 |
| 5 | AC | 101 |
| 6 | B | 010 |
| 7 | C | 100 |
| 8 | ABC | 111 |

Fewer or more addresses can be accomplished by using fewer or more permanent magnets and/or fewer or more Hall effect sensors or Reed switches in similar arrangement. In an embodiment, the magnetically coupled address dial 414 magnet and magnetic field sensor position pattern can be also mirrored or permutated for the same number of addresses.

As shown in FIG. 4A, the radio interface unit 400 may also include a power dial 406 for effecting the power of the unit. The power dial 406 may include a magnet, which may be adjustable such that power is supplied to the radio interface unit when the magnet is coupled to a switch contained in the housing of the radio interface unit. The power dial 406 may further be coupled to the address setting dial 414 such that every time the address setting dial 414 position is changed the power dial 406 will turn to the reset position to power off the radio interface unit 400. In this manner, the previous address setting will not be stored.

In another embodiment, by turning the power dial 406 to "ON" position, the radio interface unit 400 may be adapted to execute the following sequence:

1) Measure the battery voltage. If the voltage is below a minimum voltage, then turn off the radio interface unit 400, otherwise save the measured voltage.

2) Perform a complete RAM and Flash diagnostic test and record the results in RAM 3) Read configuration parameters and enter normal operation.

In an embodiment, the address dial 414 includes a magnetically coupled address interface that is water tight sealed using potting material. The magnetically coupled address interface is operable in an environment exposed to water such as an outdoor, overhead or underground installation.

Figure 16A:
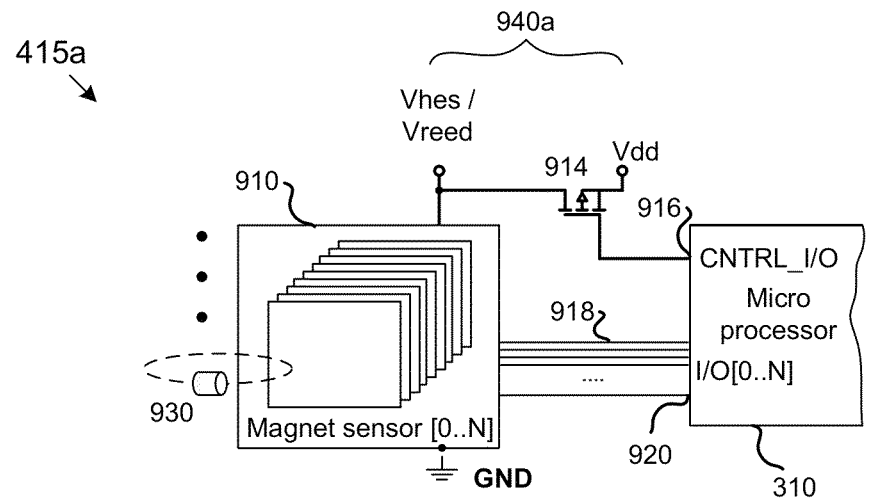
FIGS. 16A-16D are circuit diagrams illustrating various embodiments of systems for identifying a power system device according to various aspects of the present invention.

FIG. 16A depicts a circuit diagram of an embodiment of a magnetically coupled address interface. As illustrated in FIG. 16A, the address dial 414 includes a magnetically coupled address interface 415a or 415b including an arrangement of a plurality of magnets 930. When the magnets 930 are coupled to the magnetic field sensors 910, a select address 918 may be provided. The various addresses 918 are dependent upon the various arrangements of the magnets. A microprocessor (or other logic device such as an FPGA, ASIC, or discrete logic) 310 may further be provided for processing the select arrangement of magnets and providing addresses 918 corresponding thereto. The microprocessor 310 may further be adapted to provide a power management output control 916 to activate or deactivate the biasing circuits 940a or 940b of the magnetic field sensor 910. In an embodiment, the magnetic field sensors 910 are a plurality of hall-effect sensors or a plurality of Reed switches.

In another embodiment, a battery-saving environment for the radio interface unit is further provided whereupon the magnetic field sensors 910 are turned on momentarily and turned off after the addresses are read. For example, the radio interface unit may be adapted to turn on upon activation by a power management control 916 (e.g., the power dial of FIG. 5) or upon receiving an external request command from an external device via the microprocessor 310.

In an embodiment, the biasing circuit 940a includes a power source Vdd, a plurality of pull up resistors (not shown in FIG. 8B) and at least a transistor such as a P-channel MOSFET 914 that supplies the biasing voltage Vhes/Vreed to the magnetic field sensor 910. In an embodiment, a power management control I/O 916 in the microprocessor 310 activates or deactivates the biasing circuit 940a by controlling the gate voltage of the P-channel MOSFET 914. Upon an initial power on or a power-on-reset, the control I/O 916 activates the biasing circuit 940a to bias the magnetic field sensor 910 for a brief period such as approximately 100 microseconds to about 150 microseconds. The biasing voltage Vhes/Vreed is turned off after the addresses 918 are read by the microprocessor 310. In an embodiment, subsequent to reading the addresses 918, the control I/O 916 deactivates the biasing circuit 940a indefinitely until the power management issues a control I/O 916 to reactivate the biasing circuit 940a.

The activation or deactivation of the magnetic field sensor 910 may be controlled by a factory set power management program in the microprocessor 310 or upon receiving an external request command from an external device. The external devices may include a hand held terminal, PDA, cellular phone or laptop host computer, alternatively mounted in a vehicle. When the biasing circuit 940a is deactivated, the magnetic field sensor 910 consumes essentially no current, thus extending the battery life.

Figure 16B:
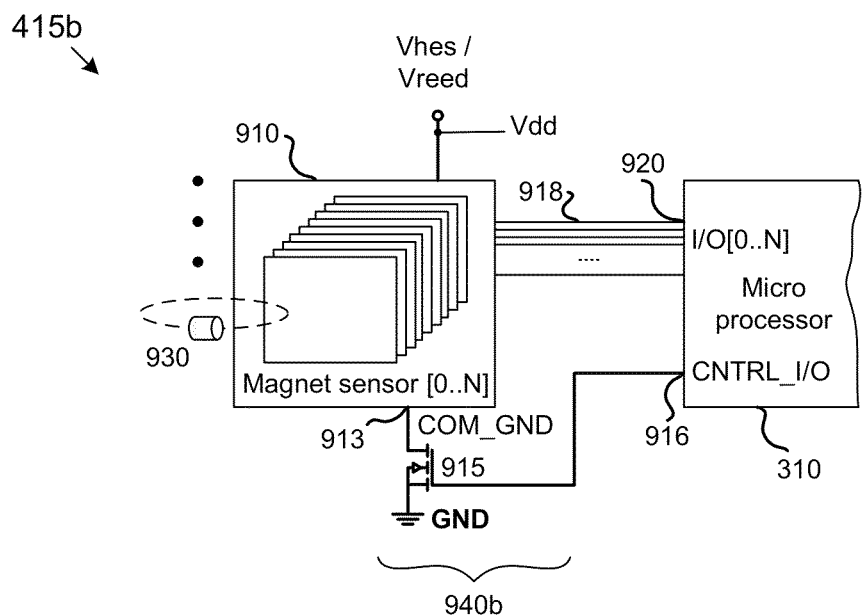

FIG. 16B depicts another embodiment of a magnetically coupled address interface 415b. As shown in FIG. 16B, a biasing circuit 940b includes connecting the ground to an N-channel MOSFET 915 while the biasing voltage Vhes/Vreed is connected to Vdd. The biasing circuit is activated or deactivated through controlling the gate of the N-channel MOSFET 915. In either embodiments, the transistors used in biasing circuits 940a or 940b can be bipolar transistors or any suitable switching transistors to perform the activation or deactivation switching function.

Figure 16C:
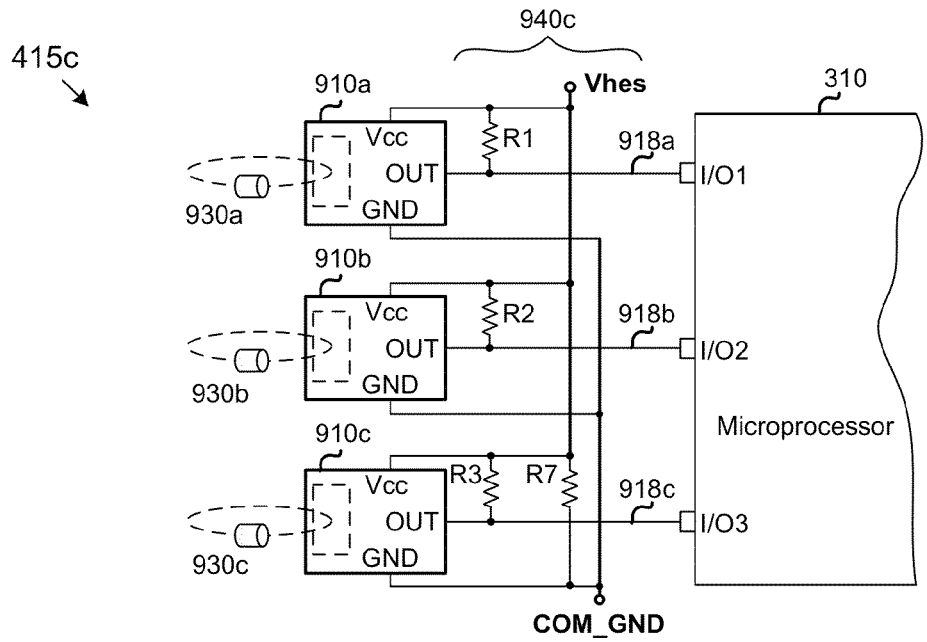

FIG. 16C depicts an embodiment of a magnetically coupled address interface 415c between a plurality of hall-effect sensors to a microprocessor. In an embodiment, three hall-effect sensors 910a to 910c are used as magnetic field sensors to sense respective magnets 930a to 930c. The Hall effect sensors 910a to 910c outputs are open drain and respective pull-up resistors R1 to R3 with values ranging from about 10 kOhm to about 100 kOhm connected to the biasing voltage Vhes are used to indicate logic levels 1 in respective addresses 918a to 918c to I/O1 to I/O3 of microprocessor 310. In the presence of magnets 930a to 930c, the Hall sensors 910a to 910c will give a logic level 0 to the respective addresses 918a to 918c.

In an embodiment illustrated, the biasing circuit 940c uses a transistor such as a P-channel MOSFET 914, a PNP bipolar transistor or any suitable switching transistor (not shown) to activate or deactivate the biasing circuit 940c. In an alternate embodiment, the biasing circuit 940c uses a transistor such as a N-channel MOSFET 915, a NPN bipolar transistor or any suitable switching transistor (not shown) connected to the ground COM_GND to activate or deactivate the biasing circuit 940c, with the biasing voltage Vhes connected to Vdd in this scheme. An optional discharging resistor R7, with values of hundreds of kOhms connected to the ground COM_GND can be used for discharging any remaining voltages, with Hall effect sensors 910a to 910c are powered down to prevent floating address lines 918a to 918c to I/O1 to I/O3 in microprocessor 310.

Figure 16D:
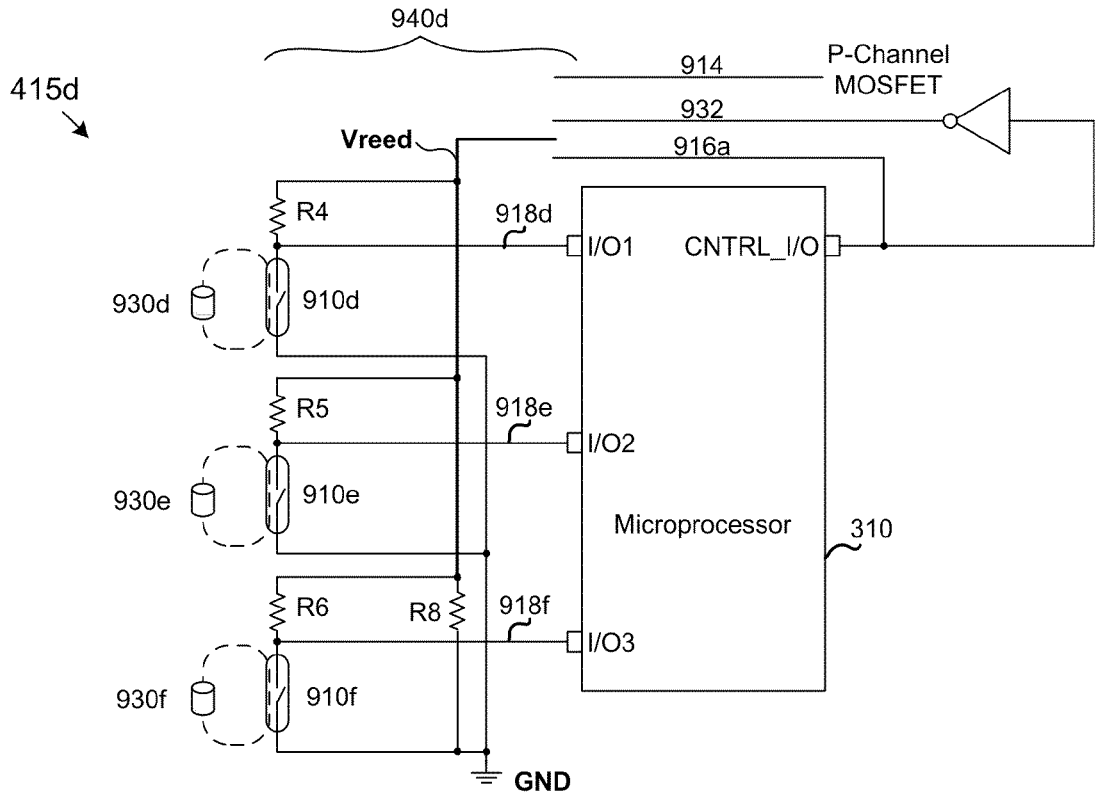

FIG. 16D depicts another embodiment of a magnetically coupled address interface 415d between a plurality of Reed switches to a microprocessor. In an embodiment, three Reed switches 910d to 910f are used as magnetic field sensor to sense respective magnets 930d to 930f. The Reed switches 910d to 910f are connected to respective pull-up resistors R4 to R6. In the absence of magnet, the pull-up resistors indicate logic 1 to address lines 918d to 918f. In the presence of magnets 930d to 930f, the Reed switches 910d to 910f close where the currents are shunt to ground, thus indicating logic 0 in addresses 918d to 918f to I/O1 to I/O3 of microprocessor 310.

In an embodiment of battery saving circuit design, the biasing voltage Vreed can be powered with On/Off control from a microprocessor I/O 916, with a higher current buffer 932 or with a P-channel MOSFET 914, a PNP bipolar transistor or any suitable switching transistor (not shown). The choice may be factory set by design. The pull-up resistors R4 to R6 can be in a range from about 10 kOhm to about 100 kOhm, allowing a relatively weak voltage source to drive three or more resistors and Reed switches. In the previous embodiment shown in FIG. 16C, the Hall-effect sensors 910a to 910c cannot be driven from a microprocessor 310 nor from a current buffer 932 as shown in FIG. 16D since relatively high currents are needed to be driven with a P-channel, or N-channel MOSFETs or any suitable switching transistor with a proper circuit connection. In an alternate embodiment, the biasing circuit 940d can use a N-channel MOSFET 915, a NPN bipolar transistor or any suitable switching transistor (not shown) connected to the Reed switches ground GND while the biasing voltage Vreed is connected to Vdd. A discharging resistor R8 of values of hundreds of kOhms connected to the ground GND may be used for discharging any remaining voltages when all Reed switches 910d to 910f are open, preventing floating address lines 918d to 918f to I/O1 to I/O3 to microprocessor 310.

Figure 17B:
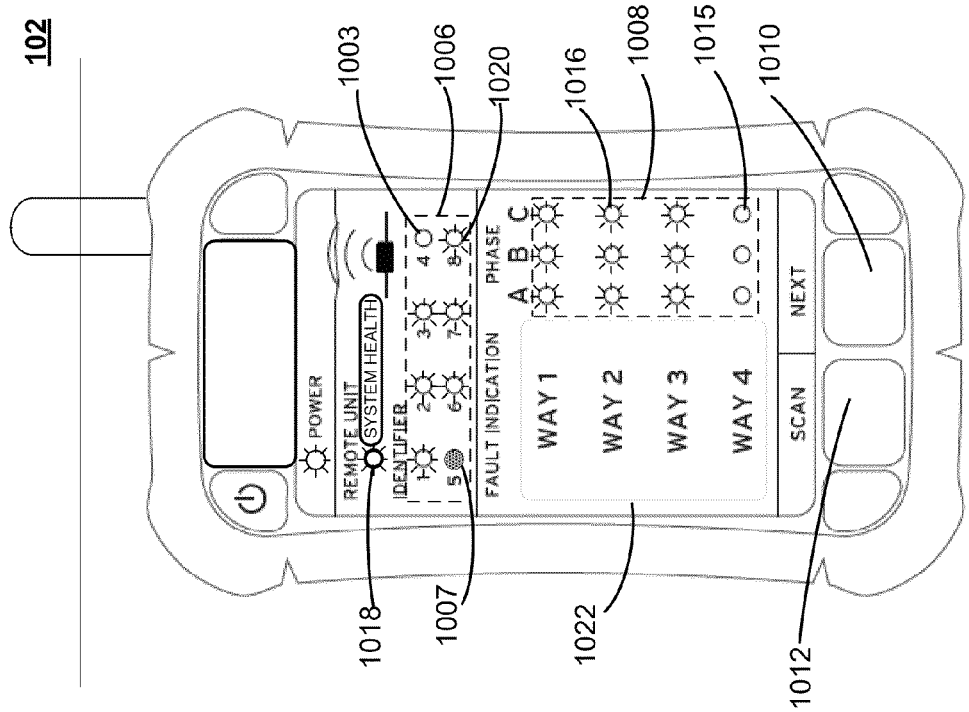
FIG. 17B illustrates the same wireless device user interface of FIG. 17A after a scan operation has been completed.
Figure 17A:
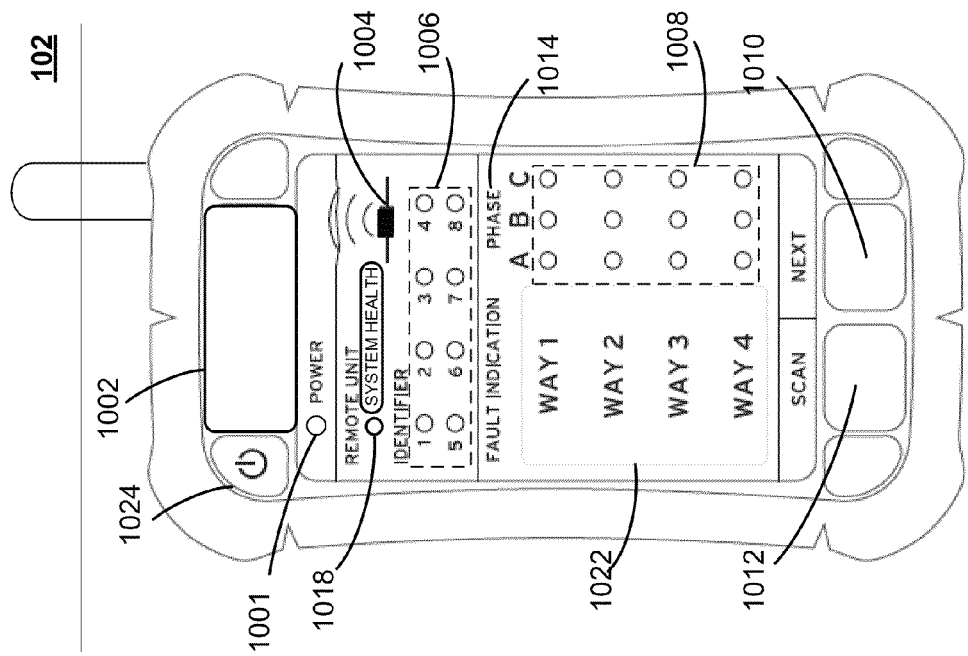
FIG. 17A illustrates the user interface of a wireless device of FIGS. 2A and 2B used to scan a number of groups of faulted circuit indicators connected to separate radio interface units for their status.

FIG. 17A illustrates an example of a user interface of the wireless device 102 that may be used in the systems illustrated in FIGS. 2A and 2B. The user interface includes a power indicator 1001, such as a green LED, which is illuminated when the wireless device 102 is turned on via power button 1024. In addition, the user interface includes two controls, an information acquisition control which is implemented as a "scan" button 1012, and an identification setting increment control which is implemented as a "next" button 1010. The "scan" button 1012 causes the wireless device 102 to scan the nearby area for any radio interface units (e.g., those associated with the installation of faulted circuit indicators of FIGS. 2A and 2B) that may be present. During the scan, each radio interface unit may be adapted to communicate its identification setting (e.g., address), its status, and the status of any faulted circuit indicators that are connected to it.

Once a scan is completed, a summary of the scan is displayed on a radio address indicator 1006. The radio address indicator 1006 comprises a plurality of radio interface unit status indicators. Each LED of the radio address indicator 1006 may correspond to each radio interface unit associated with each one of the installations of faulted circuit indicators 200a-h of FIGS. 2A and 2B. The radio interface unit status indicators may be implemented using eight tri-color LEDs. Depending on the result of the scan operation, the LEDs within the radio address indicator 1006 will be illuminated in different ways. If a radio interface unit with a particular address is not detected, then the radio address indicator 1006 LED with the corresponding address will not be illuminated. Conversely, for each radio interface unit detected, a corresponding LED within the radio address indicator 1006 will display amber, green or red. A particular LED within the radio address indicator 1006 displays green if none of the faulted circuit indicators connected to the particular radio interface unit have detected a fault. Conversely, a particular LED within the radio address indicator 1006 displays red if any of the faulted circuit indicators connected to the corresponding radio interface unit have detected a fault. As discussed later, a particular LED may be illuminated as amber if the corresponding radio interface unit is presently selected as discussed below.

The "next" button 1010 allows a user of the wireless device 102 to sequentially step through each of the radio interface units that the wireless device 102 detected during its last scan operation. The user interface of the wireless device 102 also includes a group (way) indicator 1022, which displays the status of any group of faulted circuit indicators connected to the radio interface unit presently monitored by the wireless device 102. The group (way) indicator 1022 includes a plurality of faulted circuit indicator status indicators, which as shown, are twelve LEDs 1008. The twelve LEDs are organized in four rows, each corresponding to one of four separate groups (ways) of faulted circuit indicators, and three columns, each corresponding to a separate phase 1014. For example, if the user were to select the display for radio interface 400e of FIGS. 2A and 2B, the group (way) indicators 1022 will correspond to each group of faulted circuit indicators 206a-d, whereas if the user were to select the display for radio interface 400h of FIGS. 2A and 2B, the group (way) indicators 1022 will correspond to each group of faulted circuit indicators 206e-h. As discussed above, each of the faulted circuit indicators associated with the particular group (or way) are generally associated with different phases (e.g., A, B, C phases) and accordingly will correspond to the LEDs 1008.

During operation, if a particular faulted circuit indicator is not faulted, the corresponding LED will display green. Conversely, if a particular faulted circuit indicator is faulted, the corresponding LED will display red. And if the particular faulted circuit indicator is not connected, the corresponding LED will not be illuminated.

The user interface of the wireless device 102 also includes a system health indicator 1018, which displays information about the health of the presently selected radio interface unit. One implementation of the system health indicator 1018 is a bi-color LED, which displays green when there are no issues with the selected radio interface unit, and red when the selected radio interface unit has an issue that requires maintenance. In another embodiment, a tri-color LED may be used to indicate the system life of the radio interface unit. For example, a green color may indicate that greater than one year of system life remains. An amber color may indicate that less than one year of system life remains. A red color may indicate that complete depletion of system life is imminent. In one embodiment, the system life of the radio interface unit may equate to the battery life associated therewith.

FIG. 17B illustrates an embodiment of the disclosed user interface 102 after a scan operation has been completed, and the "next" button has been pushed to display the status of the faulted circuit indicators attached to the radio interface unit with address 5 (e.g., 400e of FIG. 2). Among others, the radio interface unit with address 8 has reported as problem free as indicated by the LED 1020 being illuminated as green. Also, the radio interface unit with address 4 indicates that that unit is either not installed, or the radio within the radio interface unit has malfunctioned, as indicated by the unlit LED 1003.

For illustration purposes, the status of the faulted circuit indicators attached to the radio interface unit with address 5 (e.g., 400e of FIG. 2), are being displayed in the group (way) indicator 1022. This is indicated by LED 1007, which is displayed as amber in the illustrated embodiment. All faulted circuit indicators in group or way 1 (e.g., 206a of FIGS. 2A and 2B), group or way 2 (e.g., 206b of FIGS. 2A and 2B), and group or way 3 (e.g., 206c of FIG. 2) are installed, and none have detected faults. Therefore, the particular LEDs corresponding to those faulted circuit indicators are illuminated green. For instance, the LED 1016 corresponding to way 2 (e.g., 206b of FIGS. 2A and 2B), phase C is illuminated green. In addition, the group (way) indicator 1022 indicates that none of the faulted circuit indicators corresponding to group or way 4 (e.g., 206d of FIGS. 2A and 2B) are installed. In the illustrated embodiment, this is indicated with an unlit LED, such as the LED 1015 corresponding to group or way 4, phase C. Because, the faulted circuit indicators corresponding to group or way 4 (206d) are shown to be connected in FIGS. 2A and 2B, this may indicate a problem in the connection of the faulted circuit indicators.

Figure 17D:
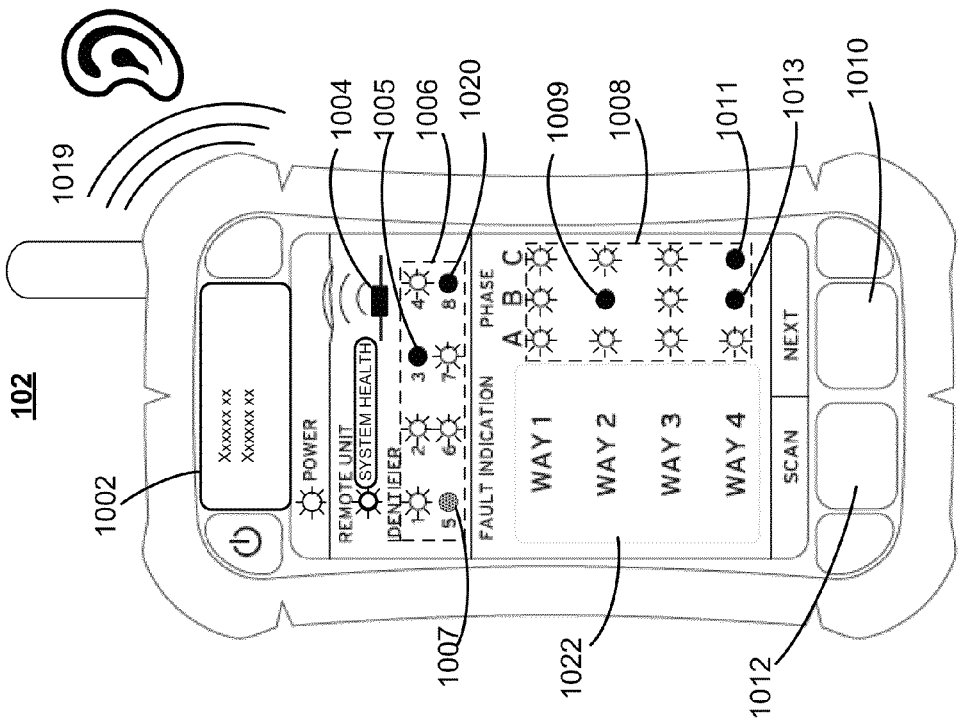
FIG. 17D illustrates the same wireless device user interface FIG. 17A where, in addition to the selected radio interface unit, two other radio interface units are coupled to one or more faulted circuit indicators asserting a fault condition.
Figure 17C:
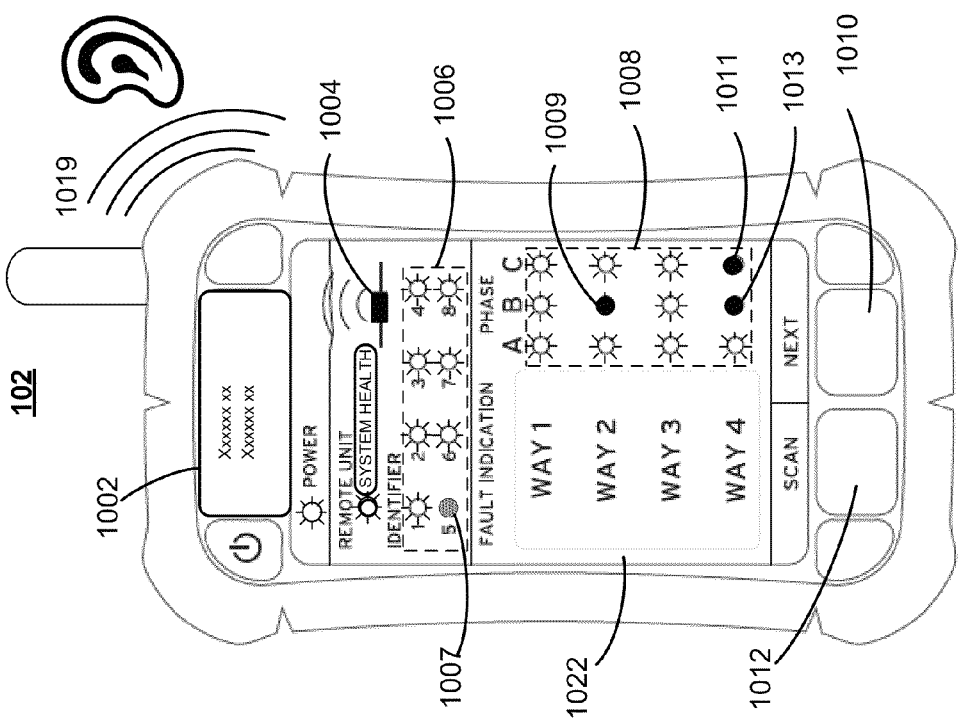
FIG. 17C illustrates the same wireless device user interface FIG. 17A where a number of faulted circuit indicators attached to the selected radio interface unit are asserting a fault condition.

In FIG. 17C, the status of the faulted circuit indicators attached to the radio interface unit with address 5 are being displayed. However, during the previous scan, a number of the faulted circuit indicators attached to the radio interface unit with address 5 reported a fault condition. For instance, LEDs 1009, 1011, and 1013 all indicate that the faulted circuit indicators corresponding to those LEDs reported a fault. For illustration purposes, the faulted circuit indicator associated with phase B of group or way 2 (e.g., 206b of FIG. 2) is faulted whereas the faulted circuit indicators associated with phases A and C of group or way 2 (e.g., 206d of FIG. 2) are connected and not faulted.

According to one embodiment, the user interface 102 will display on the group (way) 1022 and phase 1008 indicators the status of the faulted circuit indicators attached to the radio interface unit that first reports a faulted circuit. If none of the radio interface units report a faulted circuit, then the user interface 102 will display on the group (way) 1022 and phase 1008 indicators the status of the faulted circuit indicators attached to the radio interface unit with the lowest numbered address. For example, FIG. 17D indicates that at least one faulted circuit indicator attached to radio interface unit at address 3 reports a fault, as well as at least one faulted circuit indicator attached to radio interface unit at address 8. As soon as the radio interface unit with address 3 reports a fault, the status of the faulted circuit indicators connected to the radio interface unit associated with address 3 will be displayed on the group (way) and phase 1022, 1008 indicators. In order to view the status of the faulted circuit indicators attached to the radio interface unit at address 8, the "next" button 1010 may be pushed enough times to scroll to that report.

During operation, a user will approach an area with one or more groups of faulted circuit indicators installed. The user will then start a scan operation using the wireless device 102 by pressing the "scan" button 1012. The radio address indicator 1006 will provide an overview of the status of the faulted circuit indicators attached to the different radio interface units. For those radio interface units with no attached faulted circuit indicators asserting a fault condition, the corresponding LEDs within the radio address indicator will display green. Conversely, for those radio interface units attached to faulted circuit indicators which have asserted a fault, the corresponding LEDs within the radio address indicator will display red. And for those radio interface units which are not installed or which have radio communication, the corresponding LEDs within the radio address indicator will not be illuminated.

The radio interface is indicated within the radio address indicator by the corresponding LED being illuminated amber within the radio address indicator 1006. The user may view the scan results for a different radio interface unit by pressing the "next" button 1010, which selects the radio interface unit with the next lowest address, until the desired radio interface unit is selected. Using this technique, the user can determine which faulted circuit indicators are asserting a fault within range of the wireless device. The user can also tell if any radio interface units are malfunctioning due to a low battery or other reason. The system health indicator 118 will show the system health of the radio interface unit currently being displayed according to the radio address indicator 1006. And the user can determine if a faulted circuit indicator has become disconnected from the appropriate radio interface unit. All of the above can be done without accessing any of the faulted circuit indicators, which can result in enormous time savings, particularly when dealing with underground installations.

In yet another embodiment, the handheld wireless device 102 may be adapted to indicate an interference or collision of signals received from more than one radio interface device. For example, LEDs associated with the radio address indicator 1006 may flash between two colors to indicate that at least two signals have been received from radio interface devices having different unique serial numbers but using the same address in the vicinity. In one embodiment, an LED associated with radio address indicator 1006 may flash between green and amber to signal that neither radio interface unit contains a fault. Alternatively, an LED associated with radio address indicator 1006 may flash between red and amber to signal that at least one of the radio interface units contains a fault. When selecting the display for the address in which a collision has occurred, the way 1022 and phase 1008 indicators may alternate between indications for the data of each of the radio interface units. In yet another embodiment, a particular designation may be shown (e.g., a particular serial number associated with a particular radio interface unit) in order to differentiate between two radio interface units having the same address.

In addition to the wireless devices LED display, the user interface may further include other means for communicating information. Such information may include, but is not limited to, radio interface unit address, radio interface unit serial number, faulted circuit indicator status, faulted circuit indicator fault location, diagnostic parameters, firmware revisions, radio interface unit health, counter information, radio interface unit GPS position, handheld device GPS position, navigation information or any other information. In one embodiment, the additional communication means may be a liquid crystal display (LCD) as shown in 1002 on FIGS. 17A-17D.

The wireless device may also communicate data related to any detection device, other than FCIs, as defined above. For example, the wireless device may communicate data related to the detection of water, high voltage electric field, specific gravity, light, and sound, gas sensors such as CO, CO2, SOx, NOx, Ammonia, Arsine, Bromine, Chlorine, Chlorine Dioxide, VOCs, Combustibles, Diborane, Ethylene Oxide, Fluorine, Formaldehyde, Germane, Hydrogen, Hydrogen Chloride, Hydrogen Cyanide, Hydrogen Fluoride, Hydrogen Selenide, Hydrogen Sulfide, Oxygen, Ozone, Methane, Phosgene, Phosphine, Silane, and the like; pressure sensors for sensing, for example, pressure in a gas line, water line, waste line, oil line, and the like; temperature sensors; electromagnetic radiation sensors; radiation sensors; smoke sensors; particulate matter sensors; liquid phase sensors such as pH, turbidity, Br—, Ca2+, Cl—, CN—, Cu2+, F—, I—, K+, Na+, NH4+, NO3-, Pb2+, S-(AG+), conductivity sensors, and the like; electrical sensors such as under voltage sensors, over voltage sensors, under current sensors, over current sensors, frequency sensors and the like; power factor alarms; demand overload indicators; sensors that detect the presence of primary system voltage; sensors that determine if a sealed subsurface fuse has operated by sensing voltage on each side of fuse element with loss of load current; sensors that sense the open or closed position of a subsurface switch; voltage sensors which monitors status of lead-acid batteries used to run controller or motor operators for subsurface switches; power quality sensors which detect primary voltage swells and sags along the distribution system, and other sensors that detect power quality issues and send an alarm status.

In another embodiment, the communication means may be a speaker 1004. This speaker 1004 can communicate the occurrence of an event 1019 to a user through prerecorded or synthesized messages, chirps, dog barks, beeps, or other sounds. Further, the speaker 1004 may communicate more complicated messages through Morse code. In particular, among other messages, Morse code may be used to communicate the occurrence of a fault by a monitored faulted circuit indicator or the occurrence of low system life in a radio interface unit or a faulted circuit indicator. As Morse code is well known in the art, its particulars are not discussed here.

The foregoing embodiments are drawn toward using faulted circuit indicators 206 as a sensing probe to indicate the presence of a predetermined condition, namely, a faulted circuit. However, because the faulted circuit indicator sends either a positive (fault) or negative (no fault) signal to the radio interface unit 400, any sensing probe that is capable of detecting a predetermined condition and sending a positive or negative signal to the radio interface unit 400 may be used. For example, it may be necessary to communicate information about the temperature inside the vault underground 200. In this embodiment, as illustrated in FIGS. 2A and 2B, instead of using a faulted circuit indicator 206, a temperature transducer 208 may be used as the sensing probe. The temperature transducer 208 may be coupled to the article from which knowledge about the temperature needs to be communicated. The temperature transducer 208 may be configured to send a positive signal in the case that the temperature sensed is either above or below a predetermined threshold. Thus, the user would be able to determine whether the temperature sensed by the transducer 208 was above or below a predetermined level, or if the temperature transducer probe had become disconnected from the radio interface unit 400 by the display of the appropriate LED 1008. For example, if the temperature transducer 208 corresponds to group (way) 4 phase C, the user will understand the state of this probe by the display of the LED in group (way) 4, phase C.

In one embodiment, the various LEDs may function so as to indicate different colors for a colorblind person. For example, if the LEDs are capable of showing red or green, the LED may be programmed to flash for red, and stay constant for green. In this way, a user who cannot otherwise distinguish between red and green would be able to determine if the LED was reporting a red or a green color.

Figure 17E:
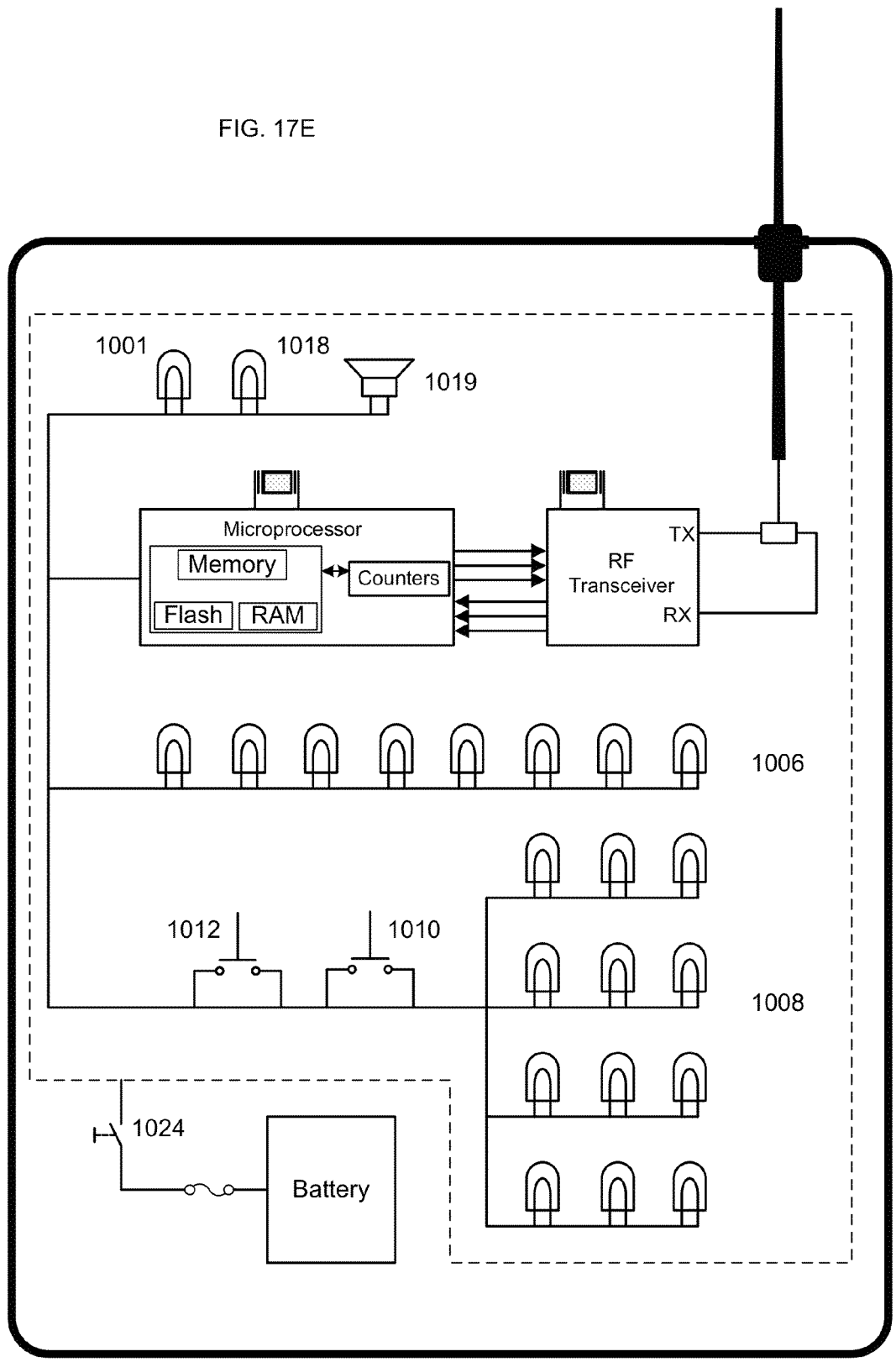
FIG. 17E illustrates a schematic for a circuit diagram for a wireless device according to an embodiment of the present invention.

An embodiment of the schematic of the circuitry of the wireless device 102 is shown in FIG. 17*e*. The reference numbers in FIG. 17*e* correspond to the functions as shown in FIGS. 17*a-d*.

The wireless device 102 of FIGS. 2*a* and 2*b* may further be adapted to communicate data to and from the radio interface units 400*a*-400*h*. Referring to the drawings, and back to FIG. 3 in particular, a wireless device communicates with a radio interface unit connected to a number of power system devices (e.g., detection devices or faulted circuit indicators). The radio frequency faulted circuit indicator monitor 400 also includes a microprocessor 310 with some amount of memory 342. The memory may be in the form of randomly accessible memory (e.g., any type of randomly accessible memory, such as SRAM, DRAM, internal registers, FLASH, etc.). Note that the memory need not be integrated within the microprocessor. The microprocessor is coupled to an RF transceiver 322, which is coupled to an antenna 202 directly or via a radio frequency cable 208. The radio frequency faulted circuit indicator monitor 400 communicates with a wireless device 102. A wide variety of wireless communications protocols could be used, such as 802.11. The particular wireless communications protocol used is not significant to this invention, and as wireless communications protocols are well known in the art, no such protocol is described.

Turning to FIG. 18, possible data formats for messages used to monitor and modify memory locations within the radio frequency faulted circuit indicator monitor are detailed. The "peek request" message 600 of FIG. 18A is sent by the wireless device to the radio frequency faulted circuit indicator monitor, and is used to retrieve the contents of a particular memory location or range of memory locations within the radio frequency faulted circuit indicator monitor. In the illustrated embodiment, the peek request message 600 contains a header 602 with data identifying the desired message (i.e.; peek request), and may include information (e.g. an identification number of the faulted circuit indicator monitor) about the sending unit and/or the receiving unit. In addition, the illustrated peek request message 600 contains a field with the start address 604 of the data the user wishes to view as well as the number of bytes 606 starting at the start address 604 that the user wishes to view. To ensure reliability, the peek request message may also contain a cyclical redundancy check (CRC) 608, which is used to validate the contents of the message. Alternatively, the peek request message could use a different means for data validation, such as a checksum or parity bit.

Figure 18A:
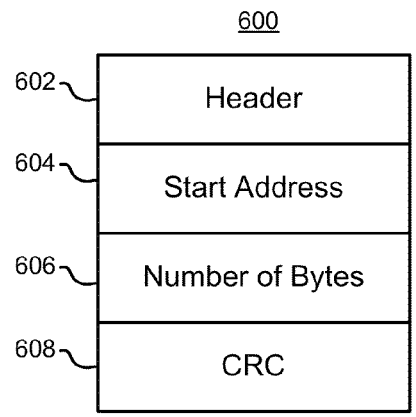
FIG. 18 illustrates the data format of peek and poke messages used to read and modify memory locations within a radio frequency faulted circuit indicator monitor in accordance with an aspect of the present invention.
Figure 18D:
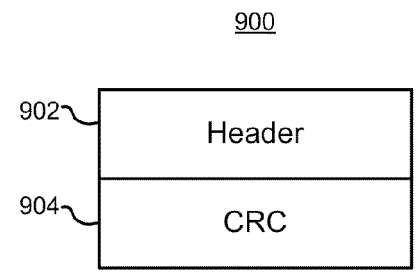
Figure 18B:
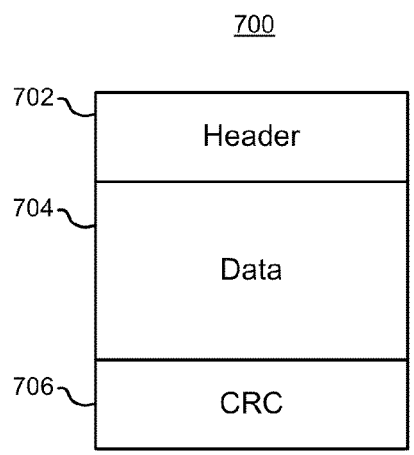

FIG. 18B illustrates a "peek response" message 700, which contains the data requested by the peek request message. In the illustrated embodiment, the peek response message contains a header 702, with information identifying the message as a peek response, as well as information about the sending and/or receiving unit. In addition, the peek response message contains a data payload 704, with the contents of the memory locations requested. To ensure reliability, the peek response message may contain a CRC 706, which is used to validate the contents of the message. Alternatively, the peek response message could use a different means for data validation, such as a checksum or parity bit. The peek response message may also include the status of the faulted circuit indicator monitor, which may include, for example, a result from a self test such as a memory (RAM and/or flash memory) test, the expected useful life expectancy, battery usage, and the like.

Figure 18E:
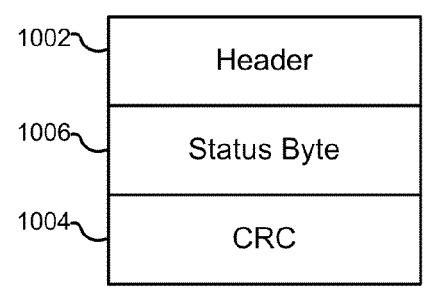
Figure 18C:
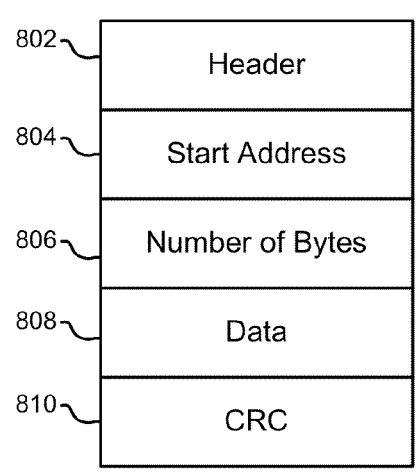

FIG. 18C illustrates a "poke request" message 800, which is used to modify memory locations in the faulted circuit indicator or faulted circuit indicator monitor. In the illustrated embodiment, the poke request message 800 contains a header 802, with information identifying the message as a poke request, as well as information about the sending and/or receiving unit. In addition, the poke request message 800 contains a start address 804, which identifies the address or range of addresses the user wishes to modify. The poke request message also contains a field with the number of bytes 806 to modify, as well as a data field 808 containing the bytes to be put into the address or range of addresses. Note that another scheme to identify the particular memory location or range of memory locations would work just as well. Finally, the poke request message may contain a CRC 810, which is used to validate the contents of the message. Alternatively, the poke request message could use a different means for data validation, such as a checksum or parity bit.

The poke request message could also be used to initiate a control or command in the faulted circuit indicator or faulted circuit indicator monitor. In this embodiment, the poke request message 800 may include a start address 804 which indicates to the faulted circuit indicator or faulted circuit indicator monitor that the data 808 includes a command or control. The data may indicate to the faulted circuit indicator or faulted circuit indicator monitor to undergo any of the available commands or controls on the faulted circuit indicator or faulted circuit indicator monitor, such as, for example, a Power on Reset (POR) which resets all faulted circuit indicator latches to a closed state. Another example of a command or control is requiring the faulted circuit indicator or faulted circuit indicator monitor to undergo a complete FLASH and RAM self test. The command or control may require the faulted circuit indicator or faulted circuit indicator monitor to undergo a system test and write the results to a particular address, which may be later viewed using a peek request. Other commands or controls may require the faulted circuit indicator or faulted circuit indicator monitor to undergo an update of Data Flash, extend operating modes, decrease operating modes, or change a state of operation.

FIG. 18D illustrates a "poke response" message 900, which is used to acknowledge the poke request message 800. In the illustrated embodiment, the poke response message 900 contains a header 902, with information identifying the message as a poke response, as well as information about the sending and/or receiving unit. To ensure reliability, the poke response message may also contain a CRC 904, which is used to validate the contents of the message. Alternatively, the poke response message could use a different means for data validation, such as a checksum or parity bit.

FIG. 18E illustrates another "poke response" message 1000, which is used to acknowledge the poke request message 800 and indicate that the poke was successful. In the illustrated embodiment, the poke response message 1000 contains a header 1002, with information identifying the message as a poke response, as well as information about the sending and/or receiving unit. The illustrated poke response message 1000 also includes a status byte 1006, which communicates that the poke was successful, that is, that the requested memory change had taken place. To ensure reliability, the poke response message may also contain a CRC 1004, which is used to validate the contents of the message. Alternatively, the poke response message could use a different means for data validation, such as a checksum or parity bit.

Figure 19:
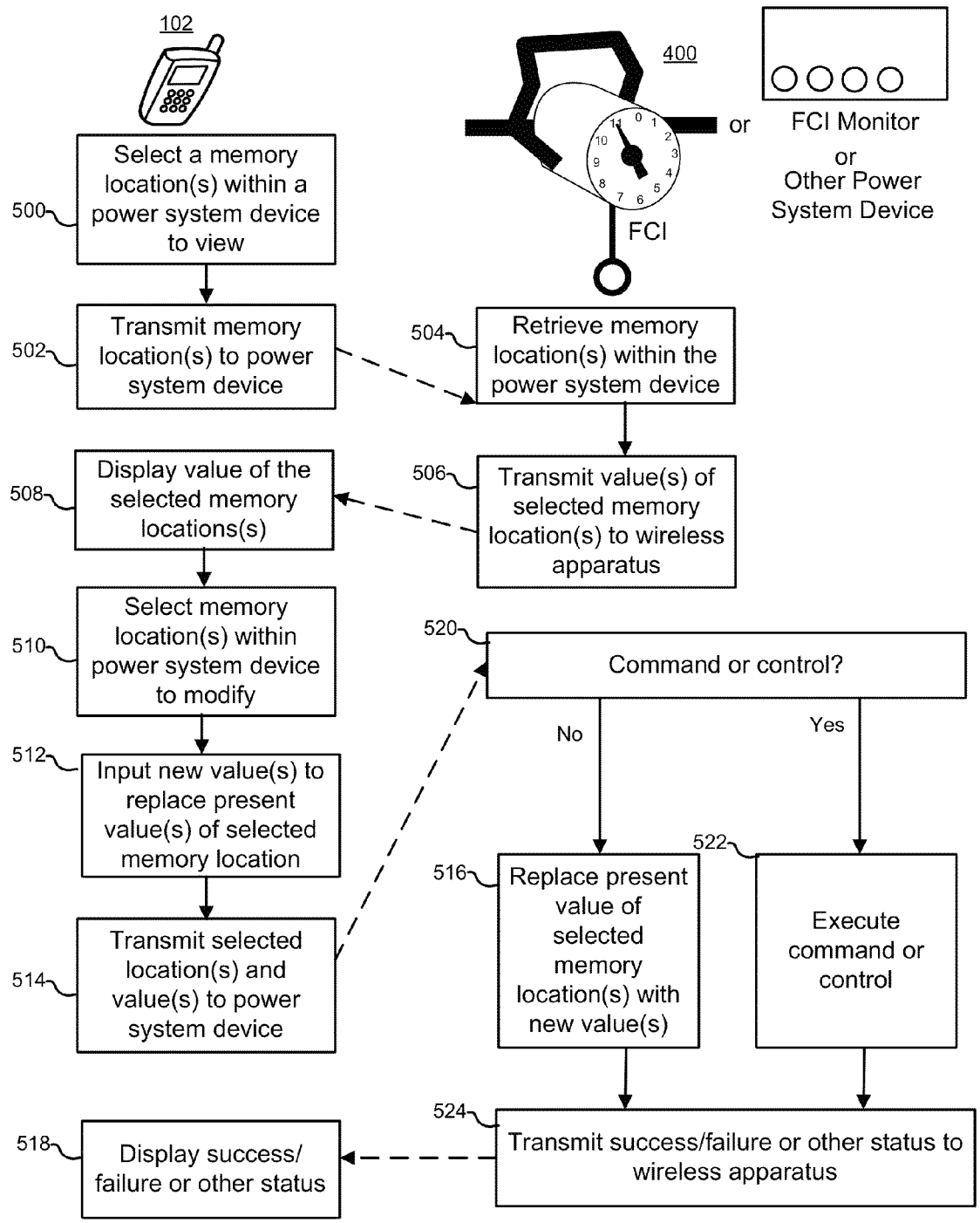
FIG. 19 is a flow chart showing how the present invention may be used to view or modify memory locations within a selected power system device in accordance with an aspect of the present invention.

As illustrated in FIG. 19, during operation the user will first identify a particular power system device that the user wishes to troubleshoot. For example, the power system device may be in the form of a faulted circuit indicator or faulted circuit indicator monitor (or other power system device) 400. As shown at 500, the user will then use the wireless device 102 to specify the device and select a particular memory location or locations within the power system device which the user wishes to view. As shown at 502, the wireless device 102 will then transmit a peek request message (e.g. a peek request for the memory location of step 500) to the power system device 400 that the user previously selected. As shown at 504, the targeted power system device 400 will retrieve the selected memory location or locations located therein. Thereafter, as shown at 506, the power system device 400 responds with a peek response message containing the contents of the memory locations the user wished to view. The wireless device 102 receives the message and displays the requested values as shown at 508. Depending on the contents of the memory location or locations that the user viewed, the user may wish to modify the contents of those locations.

To modify the contents of memory in the power system device 400, the user begins by choosing the address or addresses to modify using the wireless device 102 (as shown at 510), along with the values to place into the chosen memory locations (as shown at 512). The wireless device 102 then generates a poke request message (e.g. selected location and values), which is wirelessly transmitted to the targeted device as shown at 514. As discussed herein, the poke request message may include a command or control for the power system device 400 to execute. The power system device 400 recognizes in 520 whether the poke request message includes a command or control. If the poke request message does include a command or control, the power system device 400 executes the command or control in 522. The targeted device may further generate a poke response message in 524 including the success/failure or other status that is wirelessly transmitted to the wireless device 102. The poke response message may indicate the success of the poke. The wireless device 102 then displays the success/failure or other status in 518. If, however, the poke request does not include a command or control, the microprocessor embedded within the targeted device then processes and executes the poke request message as shown at 516. Finally, the targeted device may further generate a poke response message in 524 including the success/failure or other status that is wirelessly transmitted to the wireless device 102. The poke response message may indicate the success of the poke. The wireless device 102 then displays the success/failure or other status in 518.

In one embodiment, the poke may be followed by a peek to verify that the contents of the memory were modified as requested. To accomplish this peek sequence, the user selects a particular memory location or locations within the power system device that the user wishes to view using the wireless device 102. This will likely be the memory location(s) for which the modification was requested in the prior poke. Next, as shown at 502, the wireless device 102 will then transmit a peek request message (e.g. memory location of step 500) to the power system device 400 that the user previously selected. As shown at 504, the targeted power system device 400 will retrieve the memory location or locations located therein. Thereafter, as shown at 506, the power system device 400 responds with a peek response message containing the contents of the memory locations the user wished to view. The wireless device 102 receives the message and displays the contents of the message as shown at 508. The wireless device 102 may compare the contents of the memory locations requested with the requested modification and indicate to the user whether the requested modification did occur.

In yet another embodiment, either the peek or poke message could include any data related to the faulted circuit indicator or the power system associated therewith. For example, the message could contain information relating to the location of the faulted circuit indicator or the location of a condition in the power system. In one embodiment, the message could include data relating to the GPS location of the faulted circuit indicator or the GPS location of a fault on a transmission line.

In yet another embodiment, provided is a method for communication between a portable terminal (e.g., the wireless device 102) and the radio interface unit 400 which maximizes the battery life of the radio interface unit 400. Battery power consumption is kept to a minimum by keeping the radio interface unit 400 in sleep mode most of the time. Since in an embodiment the transmission cycle consumes more power than the receiving cycle, the radio interface unit 400 may be further adapted to transmit data to the wireless device 102 only upon successfully receiving a request command signal from the wireless device 102. In an analogy, the wireless device 102 acts as a master device and the radio interface unit 400 acts as a slave device.

The communication between the radio interface unit 400 and the wireless device 102 may be achieved by a number of wireless communication protocols. For example, suitable protocols may include frequency shift keying (FSK), phase shift keying (PSK), code devision multiple access (CDMA), spread spectrum (e.g., direct sequencing spread spectrum), or other wireless communication protocols.

Accordingly, under normal conditions, i.e. no conductor fault detected, the radio interface unit is in sleep mode or a "slow mode" at most times. It wakes up periodically to listen for a request command. When a fault is asserted by an FCI, the radio interface unit 400 is in a "fast mode" and wakes up more frequently to listen in anticipation of a request command from the wireless device 102.

Figure 20A:
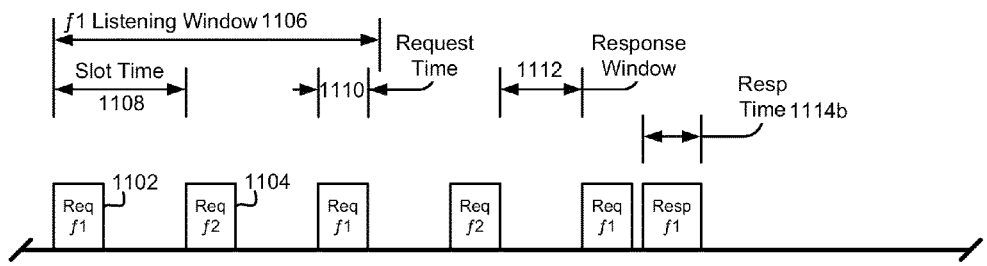
FIG. 20A illustrates a request command timing diagram for a wireless device according to an embodiment, wherein request commands are transmitted in alternating frequencies over a select interval of time at a select request time or byte length.

FIG. 20A illustrates a request command timing diagram for the wireless device 102 according to an embodiment. This diagram specifically illustrates request commands 1102 and 1104 transmitted in alternating frequencies f1 and f2 over a select interval of time 1108 at a select request time 1110 or byte length. After each request command, the wireless device 102, as a requester, listens for a response over a response window 1112 (e.g. 0.3 to 0.5 msec) before transmitting a second command in a second frequency. A response will be sent within a defined response time 1114b almost immediately after a request command is received by the radio interface unit 400 during the listening window 1106 in the corresponding frequency. The slot time 1108 is the sum of the request time 1110 and the response window 1112.

Figure 21:
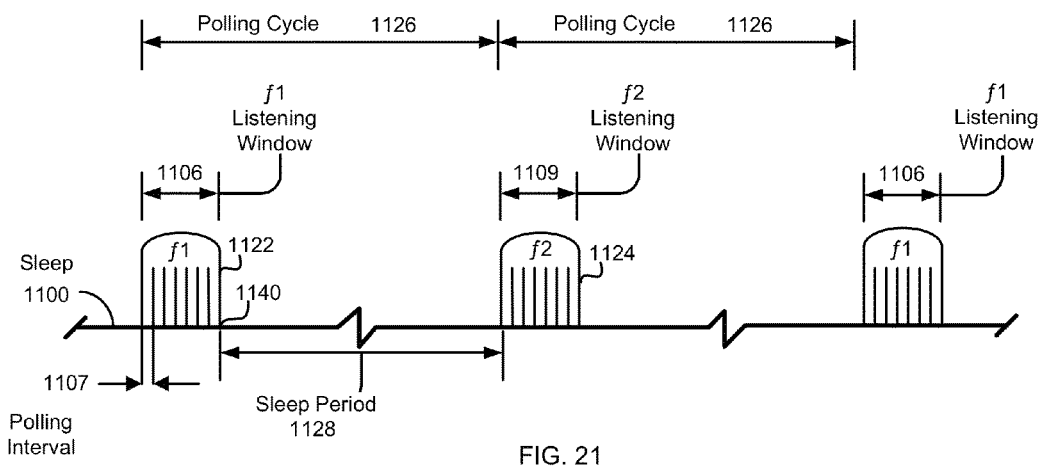
FIG. 21 is a timing diagram for a radio interface unit according to an embodiment, which depicts periodic polling cycles of a radio interface unit with listening windows of polling packets in alternating frequencies.

FIG. 21 is a timing diagram for the radio interface unit 400 according to an embodiment. This timing diagram depicts periodic polling cycles 1126 of the radio interface unit 400 with listening windows 1106 and 1109 of polling packets 1122 and 1124 in alternating frequencies f1 and f2. To reduce power consumption, the radio interface unit 400 employs a polling for carrier scheme, which detects a presence of a request command. Accordingly, during the listening window 1106 or 1109, the radio interface unit 400, as a responder, checks for a signal. If the radio interface unit does not receive a signal above a predetermined threshold, the listening window 1106 expires and times out 1140. The radio interface unit 400 then goes to sleep mode 1100 over a sleep period 1128.

Figure 20B:
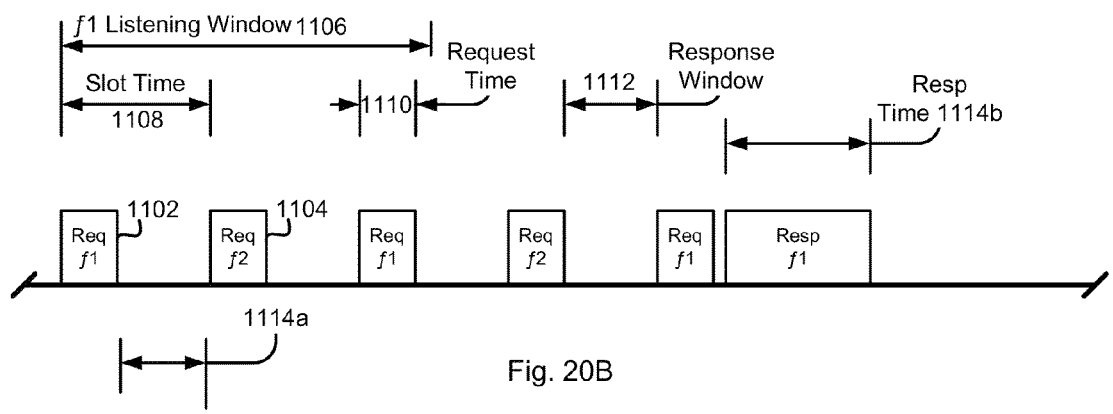
FIG. 20B illustrates a request command timing diagram for a wireless device according to an embodiment, wherein request commands are transmitted in alternating frequencies over a select interval of time at a select request time or byte length.

FIG. 20B illustrates a request command timing diagram for the wireless device 102 according to an embodiment. The listening window 1106 is greater than the length of a first request time 1102, a response window 1112, a second request time 1104, and a second response window 1112, and the response time 1114b is greater than the response window 1112. In this embodiment, the response window 1112 is shorter than the response when the wireless device 102 does not detect the presence of a response, thereby reducing the total length of the listening window 1106.

Figure 22:
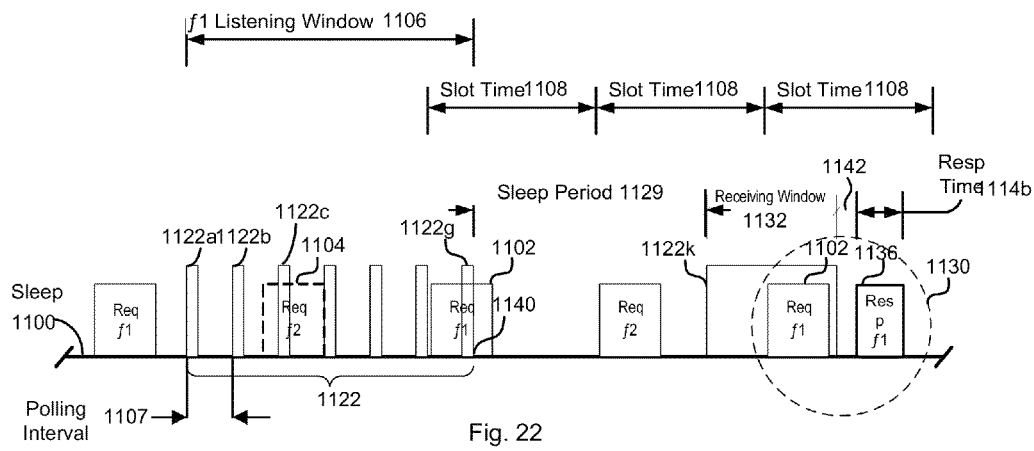
FIG. 22 is a timing diagram for a radio interface unit according to an embodiment wherein a request command is detected by a polling pulse at a corresponding frequency.

FIG. 22 is a timing diagram for the radio interface unit 400 according to an embodiment wherein a request command 1102 is detected by a polling pulse 1122g at corresponding frequency f1. The radio interface unit 400 wakes up from sleep 1100 periodically to listen for a message such as request commands 1102 and 1104 by f1 polling packet 1122 within the listening window 1106. Since polling is in frequency f1, the request command 1104 in frequency f2 is ignored by the polling pulse 1122c in frequency f1. The time between the polling pulses 1122a and 1122b (i.e., when the radio interface unit 400 checks for request command or carrier is the polling interval 1107). Polling activity ceases within the listening window 1106 once a polling pulse 1122g detects a request command 1102 by timing out 1140 and goes into sleep period 1129.

The sleep period duration varies depending on the status of the radio interface unit. For multiple radio interface units, the sleep period for each unit may have a set schedule different from that of other radio interface units, or alternatively a randomized schedule, to lower the likelihood that multiple radio interface units will respond to a single request. There are generally three sleep modes: 1) Slow mode, i.e. longest period when no condition (e.g., fault) is asserted; e.g. 3 to 5 sec to conserve battery power. 2) Fast mode, where at least a condition (e.g., a fault) is asserted to the radio interface unit. 3) Response mode, where the radio interface unit polling pulse detects a request command carrier with sufficient signal strength. The response mode sleep period 1129 varies between one to two slot time 1108 intervals from the last detected carrier 1102.

The radio interface unit 400 sends back a response 1136 with a select response time 1114b after verifying the message in the request command 1102 by verifying the cyclical request check (CRC) bits during a period of brief delay 1142. The response action 1130 is according to the type of request command message. The messages may further be verified by a number of verification methods such as, for example, a cyclical request check (CRC), check sum or parity bit validation scheme, or other methods.

Figure 23:
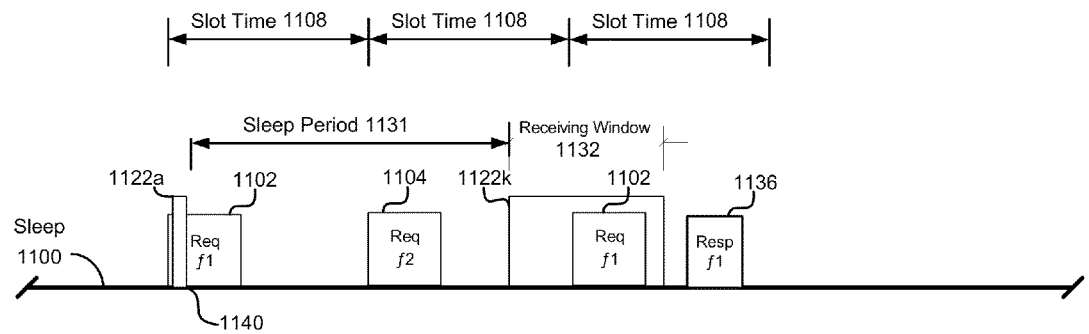
FIG. 23 is a timing diagram for a radio interface unit according to an embodiment wherein the radio interface unit successfully detects a command request message by a polling pulse at the beginning of the listening window as shown in FIG. 22 at a corresponding frequency.

FIG. 23 is a timing diagram for the radio interface unit 400 according to an embodiment wherein the radio interface unit 400 successfully detects a command request message 1102 by a polling pulse 1122a at the beginning of the listening window (as shown in FIG. 22) at corresponding frequency f1. Polling activity ceases by timing out 1140 and goes to sleep 1100 in a Response mode sleep period 1131 with a duration of approximately between one to two slot times. Similarly, the radio interface unit 400 wakes up at the end of the sleep period 1131 and opens the polling pulse 1122k to a wider receiving window 1132 to capture the next command request 1102. The radio interface unit 400 sends back a response 1136 as action performed.

Figure 24:
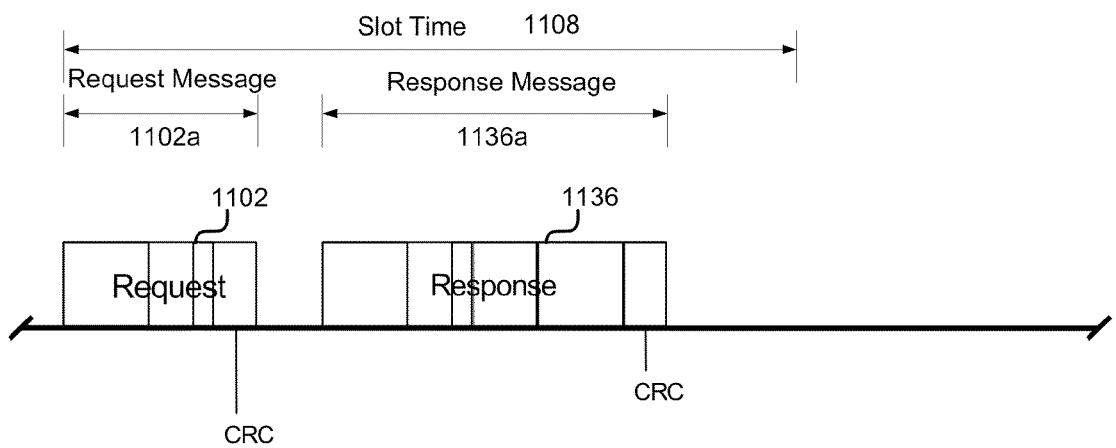
FIG. 24 illustrates a request command message and a response message in a response action according to an embodiment of the present invention.

FIG. 24 illustrates a request command message 1102a and a response message 1136a in a response action. The request command message 1102a has a predetermined number of bytes with a message size that varies depending on being in a compact mode or an extended mode. For compact mode, the request command message 1102a may include a preamble, a sync word, a request to response and CRC bits for validity check. For extended mode, the request command message 1102*a* may include additional request code, serial number of radio and data packet. The response message 1136*a* has a message size that varies depending on being in a compact mode or an extended mode. For compact mode, the response packet 1136*a* includes a preamble, a sync word, an FCI radio serial number, data such as fault status, radio address, radio life, and 16 CRC bits for validity check. For extended mode, the response message 1136*a* includes additional request code and requested data.

Compact format messages may consist of a single request/response pair. Requests of this type are "broadcast" i.e. without an address field. Requests and response messages may also contain a predetermined number of bytes.

Messages with the extended request mode are used to send multiple bytes of data to a responder. The responder then replies with an acknowledgment, which may include data. Messages with the extend response mode are used to send multiple bytes of data from a specific responder to the requester.

The request field determines the specific meaning of the data. The sync word may be different from the one used in the other message mode to prevent responders that are listening for other message modes from detecting the message and trying to decode it. In the request message, the address field may also contain either the serial number which acts as a unique address of the responder that the requester is communicating with or other identifier (e.g., 0xFFFFFF. 0xFFFFFF) to indicate that the request is a broadcast request and all responders should reply. In response messages, the response field may contain the serial number of the responder.

Figure 25:
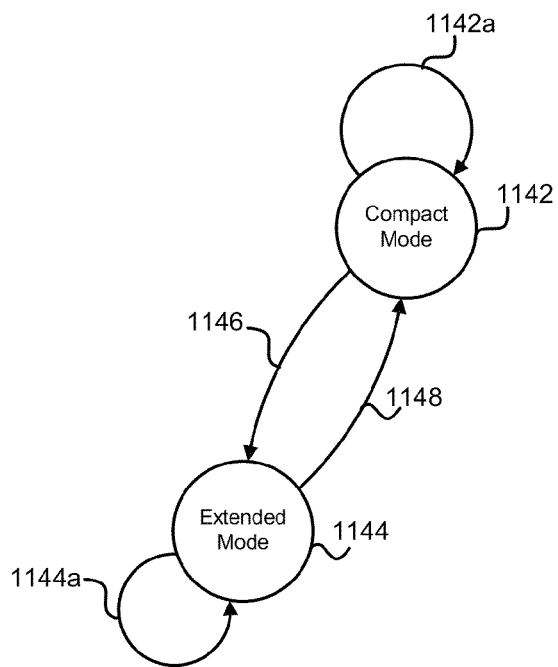
FIG. 25 illustrates a power conserving communication protocol mode change between a wireless device and a radio interface unit according to an aspect of the present invention.

FIG. 25 illustrates the power conserving communication protocol mode change between the wireless device (requester) and the radio interface unit (responder). This communication protocol may be adapted to support several packet formats. In one embodiment, the protocol supports two packet formats: a Compact mode 1142 and an Extended mode 1144. The Compact mode 1142 is a protocol default in which there is no Address field in the request commands by the wireless device 102. The Extended mode is used to send larger data packets between the wireless device 102 and the radio interface unit 400.

The default Compact mode request and respond path 1142*a* allows the wireless device 102 to broadcast and for the radio interface unit 400 to respond in Compact mode 1142. The Extended mode request and respond path 1144*a* allows the wireless device 102 to send a request command, and the radio interface unit 400 to respond in larger packets.

In FIG. 25, the wireless device 102 sends a Compact mode message with an Extended mode request command 1146 to one or more radio interface units. The radio interface units switch from Compact mode 1142 to Extended mode 1144 and wait for the next request command in the Extended mode 1144. The wireless device 102 starts sending large packet messages in Extended mode 1144 to the radio interface units, likewise the radio interface units respond large packet messages in Extended mode 1144 to the wireless device 102 through path 1144*a*. The Extended mode includes an address field in the request command packet 1102*a* or message. Radio interface units that receive a request command not addressed to them and not broadcast shall return to listening for messages in the compact mode. If no message is received within a predetermined time (for example, after a number of listening windows, an amount of time, or the like), the radio interface unit may be adapted to time-out and revert to listening for compact mode messages 1142 through path 1148.

Figure 26:
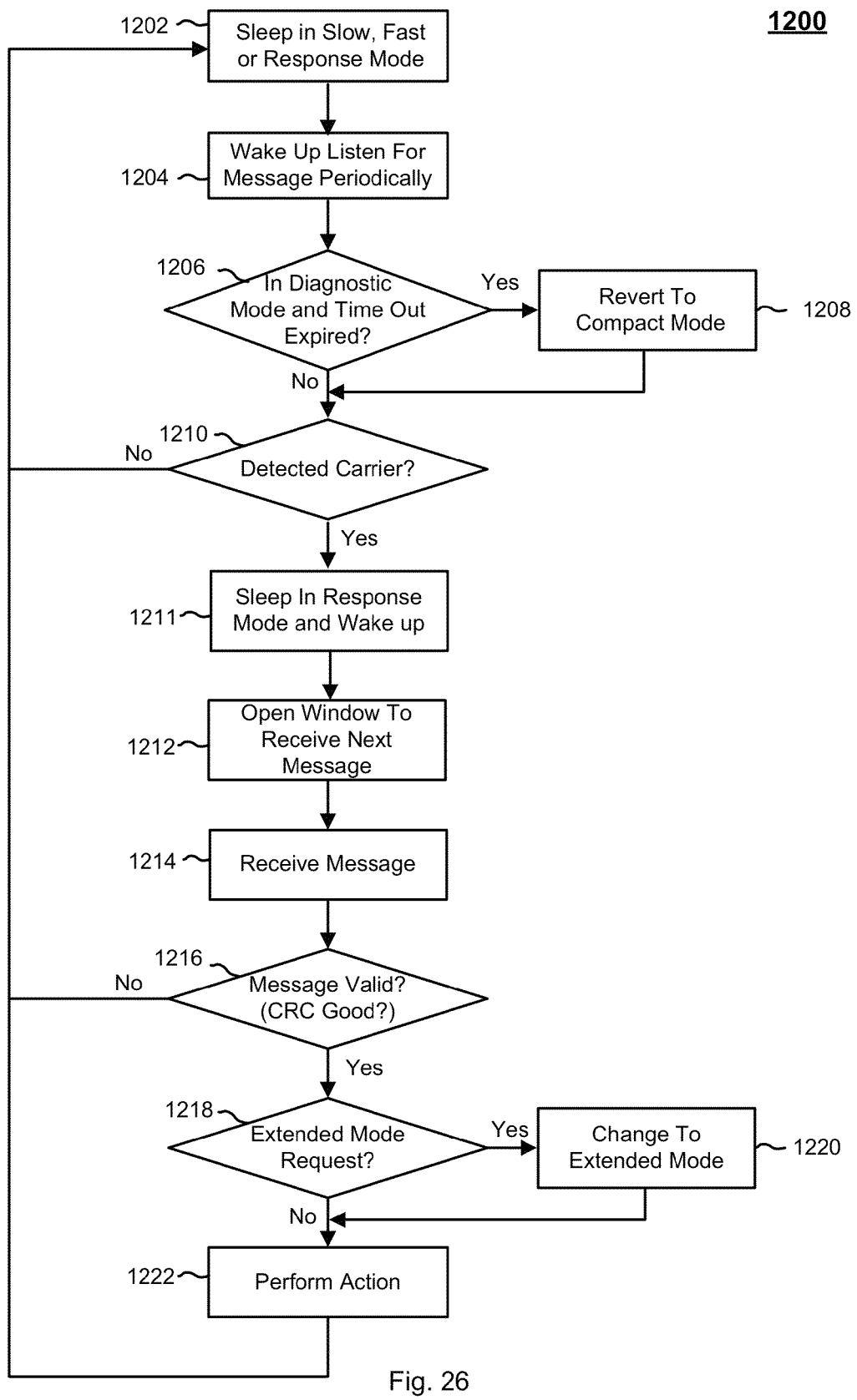
FIG. 26 depicts an embodiment of a power conserving communication protocol algorithm in a radio interface unit according to an embodiment of the present invention.

FIG. 26 depicts an embodiment of a power conserving communication protocol algorithm in a radio interface unit 400. In step 1202, the radio interface unit 400 may be in three sleep modes: Slow, Fast or Response Mode. Normal sleep mode is Slow mode. Fast mode is when a condition (e.g., fault) is asserted in the radio interface unit 400. Response mode is when a request command has been successfully detected and the radio interface unit is ready to receive a request command message.

In step 1204, the radio interface unit 400 is adapted to wake up and listen for messages periodically. In step 1206, the radio interface unit 400 reverts to Compact mode at step 1208 if the radio interface unit 400 is in diagnostic mode and the listening window is timed out. Otherwise, the radio interface unit 400 detects for a message or carrier for the corresponding frequency within the polling pulse window. If no message is detected, the radio interface unit returns to sleep 1202. But if a carrier of corresponding frequency is detected, the radio interface unit 400 stops polling and goes to step 1211 and sleep in Response mode period then wakes up to listen. In Step 1212, the polling pulse is widened in order to capture or receive the next message in corresponding frequency. In steps 1214 and 1216, a CRC validity check is performed to confirm for a successful reception of the full message content. If this request message is either a Peek or a Poke request command, the radio interface unit 400 will change to Extended Mode. In step 1222, an action will be performed according to the request command. For a Peek request command, the radio interface unit 400 will send to the requester diagnostic data such as setting parameters, counter reading, firmware revision or any radio status included in the request command message. For a Poke request command, the radio interface unit 400 is ready to receive new operational parameters to be written onto the flash memory such as a firmware reconfiguration etc. At the end of perform action, or failure of other events, the wireless device 102 defaults back to sleep mode and in compact mode. In another embodiment, any early termination of the message will also default to sleep and compact mode.

Figure 27:
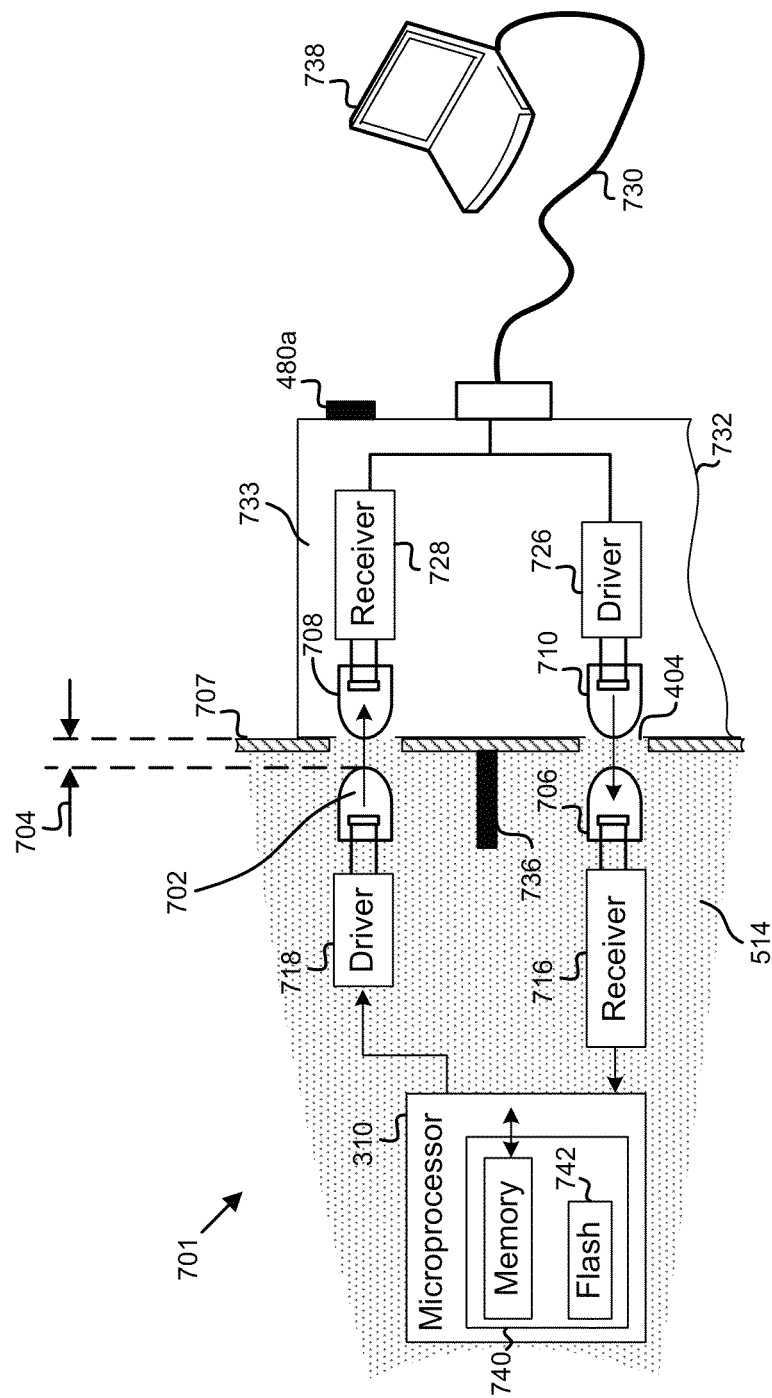
FIG. 27 illustrates a cutout side view of an embodiment of an interface between an optical communication device and an electronic device in accordance with one aspect of the present invention.

In yet another embodiment, data may be communicated to the radio interface unit via an optical communication interface. Referring to the drawings, and to FIG. 27 in particular, an optical communication device 732 is connected to an electronic device 701. For example, in one embodiment, as will be described with respect to FIGS. 28 and 29 below, the electronic device may be in the form of a radio interface unit. The electronic device 701 may be hardened. The electronic device 701 may be a power system protection, control, or monitoring system such as a faulted circuit monitoring system. The electronic device 701 may include a radio for transmission of data. The illustrated electronic device 701 includes a radio interface unit 400.

Referring back to FIG. 27, the optical communication device 732 is depicted as connected to an electronic data source. For illustration purposes only, the embodiment shown in this figure depicts a notebook computer 738 connected to the optical communication device 732 via an interface cable 730 using a wired protocol, such as Universal Serial Bus (USB) or RS232 interface. However, other embodiments could utilize a short range wireless connection between the optical communication device 732 and the notebook computer 738, a long range wireless connection between the optical communication device 732 and a server located at a remote site (not shown), or some other mechanism for supplying data to the optical communication device. In addition, the optical communication device 732 may contain the data to be communicated to the electronic device 701.

The electronic device 701 contains a circuit board (not shown) with at least one phototransmitter 702 as well as at least one photodetector 706. The phototransmitter 702 is disposed within the housing 707 of the electronic device 701 so that the axial line of the lens of the phototransmitter 702 is centered within an aperture 404 of the housing 707. The phototransmitter is electrically coupled to a driver circuit 718, which translates data from the microprocessor 310 into electrical pulses suitable for transmission by the phototransmitter 702. Depending on the type of driver circuit used as well as the microprocessor and the phototransmitter, additional interface circuitry may be required, such as the interface circuit depicted in FIG. 27. In the illustrated embodiment, the lens of the phototransmitter 702 is completely covered by a width 704 of semi-opaque material, which may be a potting material 514. Preferably, the electronic components are environmentally sealed within the potting material 514. A semi-opaque material is one that is partially transmissive to a particular wavelength of radiation. The potting material may be, but is not limited to, an epoxy based material, a urethane based material, a silicone based material, an acrylic based material, or a polyester based material.

The electronic device 701 also contains at least one photodetector 706. The photodetector 706 is disposed within the electronic device 701 so that the axial line of the lens of the photodetector 702 is centered within the aperture 404. The photodetector 706 is electrically coupled to a receiver circuit, such as a UART, which is capable of transforming the electrical output of the photodetector 706 into a form understandable by the microprocessor 310. Depending on the type of receiver circuit 716 used, as well as the microprocessor and the photodetector, additional interface circuitry may be required. In the illustrated embodiment, the lens of the photodetector 706 is completely covered by a width 704 of semi-opaque material, which may be potting material 514.

The microprocessor 310 within the electronic device 701 may require some amount of random access memory 740 and some amount of persistent storage, such as FLASH memory 742. Note that the memory 740 and persistent storage may reside within the microprocessor 310 or may be separate from it (not illustrated). In addition, different types of processing devices, such as microcontrollers or digital signal processors, may be used. Microprocessor is meant to be interpreted within this document as any data processing component. Some further examples of processing devices may include field programmable gate arrays (FPGAs), programmable logic devices, complex programmable logic devices (CPLDs) and the like.

Note that the system described above includes the use of housings 707, 733 for both the electrical device 701 and the optical communications device 732. However, a housing 707 is not required for either device to practice this invention. For instance, a collection of circuits comprising an electronic device including a photodetector could be encapsulated within potting material. A second collection of circuits comprising an optical communications device including a phototransmitter could be encapsulated within potting material. The two devices could then be positioned so that the lens of the phototransmitter and the lens of the photodetector were axially aligned.

As illustrated, the optical communication device 732 contains at least one photodetector 708 disposed within a housing 733. The photodetector 708 is situated within the housing 733 so that its lens is near or touching the interior wall of the housing 733, which is constructed of a material that transmits the radiation the photodetector 708 is attuned to with minimal distortion. In addition, the photodetector 708 is electrically coupled to a receiver circuit 728 which transforms electrical pulses from the photodetector into data which is forwarded to the notebook computer 738 via the cable 730. Similarly, the optical communication device 732 contains at least one phototransmitter 710 disposed within the housing 733 so that its lens is near or touching the interior wall of the housing 733. The phototransmitter 710 is electrically coupled to a driver circuit 726, which transforms data from the notebook computer 738 into electrical pulses suitable for transmission by the phototransmitter 710.

As illustrated, in one embodiment the electronic device includes a housing 707. The housing 707 may include an extension 736 that extends between the phototransmitter 702 and photodetector 706. This extension 736 may be opaque in that it does not allow for significant transmission of radiation between the phototransmitter 702 and photodetector 706. This extension 736 may be used to block stray radiation between the phototransmitter 702 and photodetector 706. Further, in an embodiment where there are several photodetectors 706 within the potting material, the extension 736 between each of the several photodetectors 706 would limit or eliminate cross-radiation from phototransmitters 710 of the optical communication device 732.

During operation a user will position the optical communication device 732 relative to the electronic device 701 such that the photodetector 706 and phototransmitter 702 of the electronic device 701 optically align with the photodetector 708 and the phototransmitter 710 of the optical communication device 732. Using software on the notebook computer 738, the user will initiate communication with the electronic device 701. Data is transmitted from the notebook computer 738 to the optical communication device 732 using the interface cable 730. The driver circuit 726 of the optical communication device transforms data from the notebook computer 738 into electrical pulses which are then transformed into optical pulses by the phototransmitter 710.

As indicated, data may flow in one direction, or in both directions, and this data could be related to the protocol, i.e., error checking packets; or it could be substantive. The data that is transmitted could be a firmware update of the electronic device 701. It could also be settings or configuration information, or some other kind of information. Further, the data may include a control or a command.

The optical pulses transmitted by the phototransmitter 710 of the optical communication device 732 are detected by the photodetector 706 of the electronic device 701. The photodetector 706 transforms the received optical pulses into electrical pulses which are captured by the receiver circuit 716. The receiver circuit 716 transforms the electrical pulses into a form understandable by the microprocessor 720, and passes the resultant data on. The receiver circuit's 716 transformation may take the form of generating serial data in a particular format understood by the microprocessor 310, such as 120, or it may take the form of generating parallel byte or word length data in a format usable by the microprocessor 310. Once information is received the microprocessor may then store the information in persistent storage 742.

Also, data may be transmitted from the electronic device 701 to the optical communication device 732 in a similar manner as described above. The driver circuit 718 of the intelligent electronic device 701 transforms data from the microprocessor 310 into electrical pulses which are then transformed into optical pulses by the phototransmitter 702. The optical pulses transmitted by the phototransmitter 702 of the electronic device 701 are detected by the photodetector 708 of the optical communication device 732. The photodetector 708 transforms the received optical pulses into electrical pulses which are captured by the receiver circuit 728. The receiver circuit 728 transforms the electrical pulses into a form understandable by the notebook computer 738, and passes the resultant data on.

Figure 28:
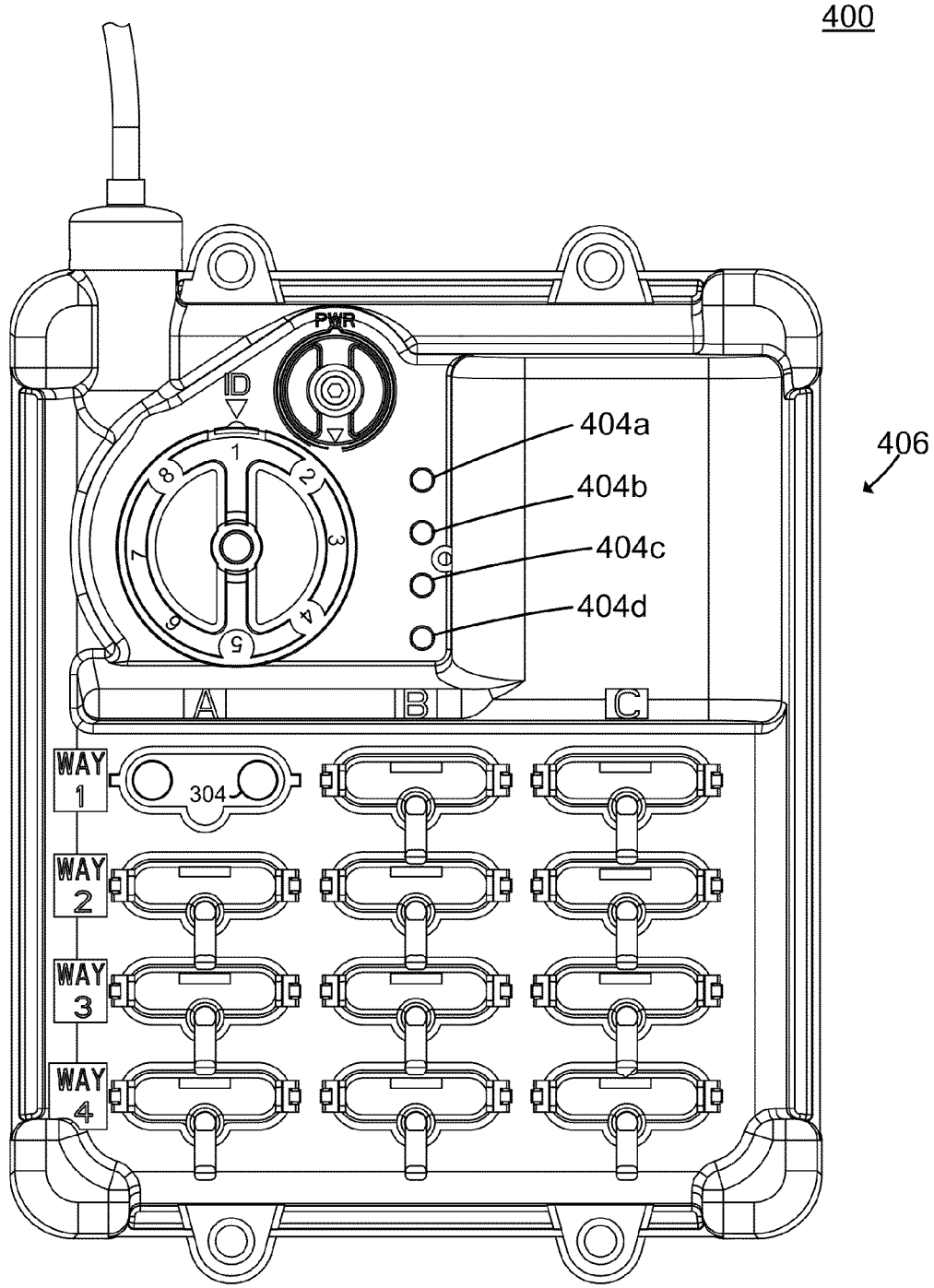
FIG. 28 illustrates a perspective view of a radio interface unit in accordance with one aspect of the present invention.
Figure 29:
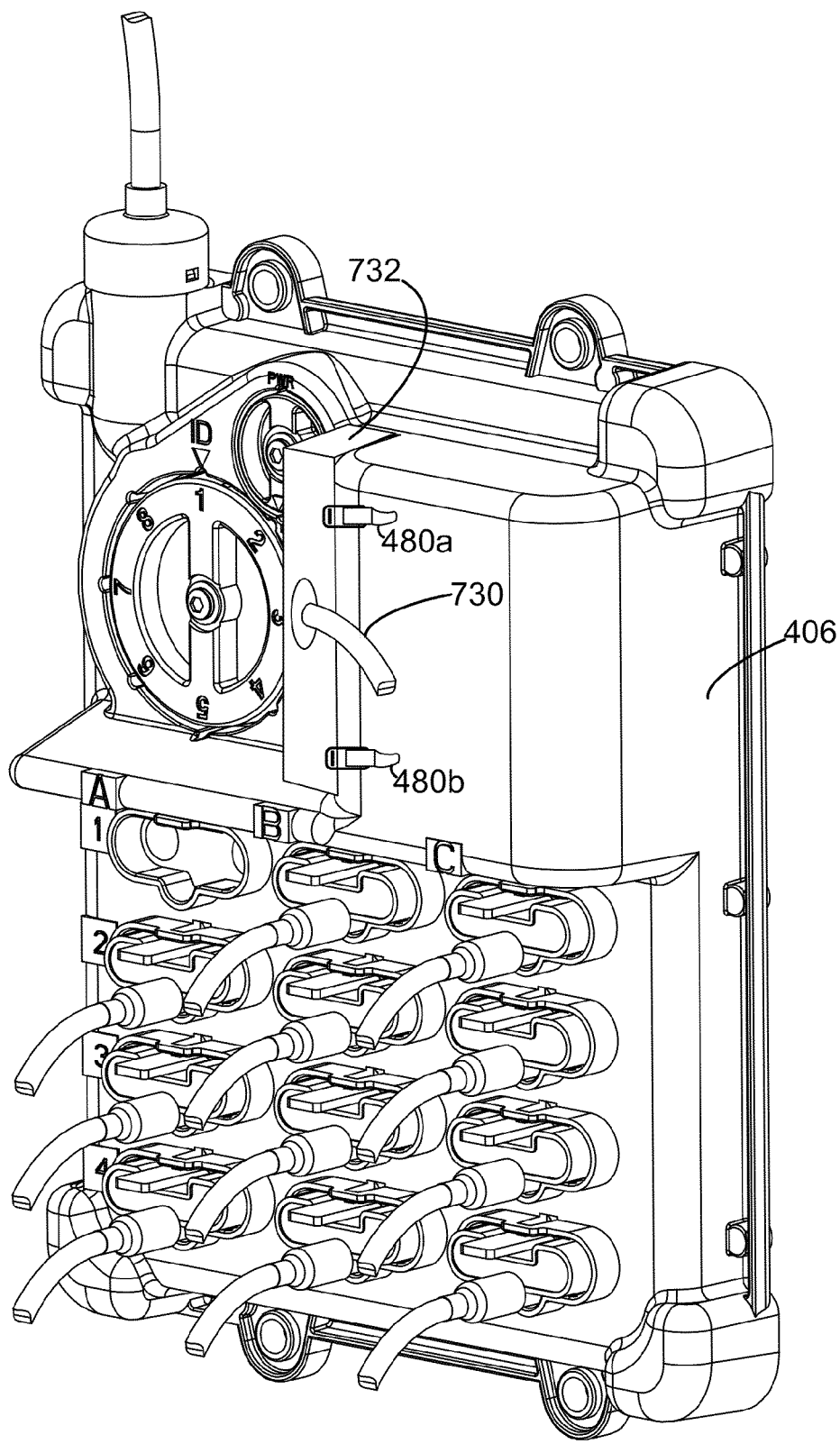
FIG. 29 illustrates a perspective view of an embodiment of an interface between an optical communication device and the radio interface unit of FIG. 27 in accordance with one aspect of the present invention.

In one embodiment of the present invention, the electronic device of the previous embodiments may be in the form of a radio interface unit 400 as shown in FIG. 28. This radio interface unit 400 may further communicate with a faulted circuit indicator or other protective device or monitoring device for use in an electrical power system. The radio interface unit 400 may include apertures 404a-404d where photodetectors or phototransmitters are positioned in the housing 406. As discussed above, corresponding photodetectors and phototransmitters of an optical communication device may be positioned in relation to these apertures 404a-404d in order to commence transmission of data therebetween and through the semi-opaque material contained within the housing 406. For example, as illustrated in FIG. 29, an optical communication device 732 is shown to be positioned in relation to the housing 406 of the radio interface unit 400 such that it aligns with the apertures in the previous figure. Additionally, latching mechanisms 480a and 480b are shown which provide proper positioning and securing of the optical communication device 732 to the radio interface unit 400.

Figure 30:
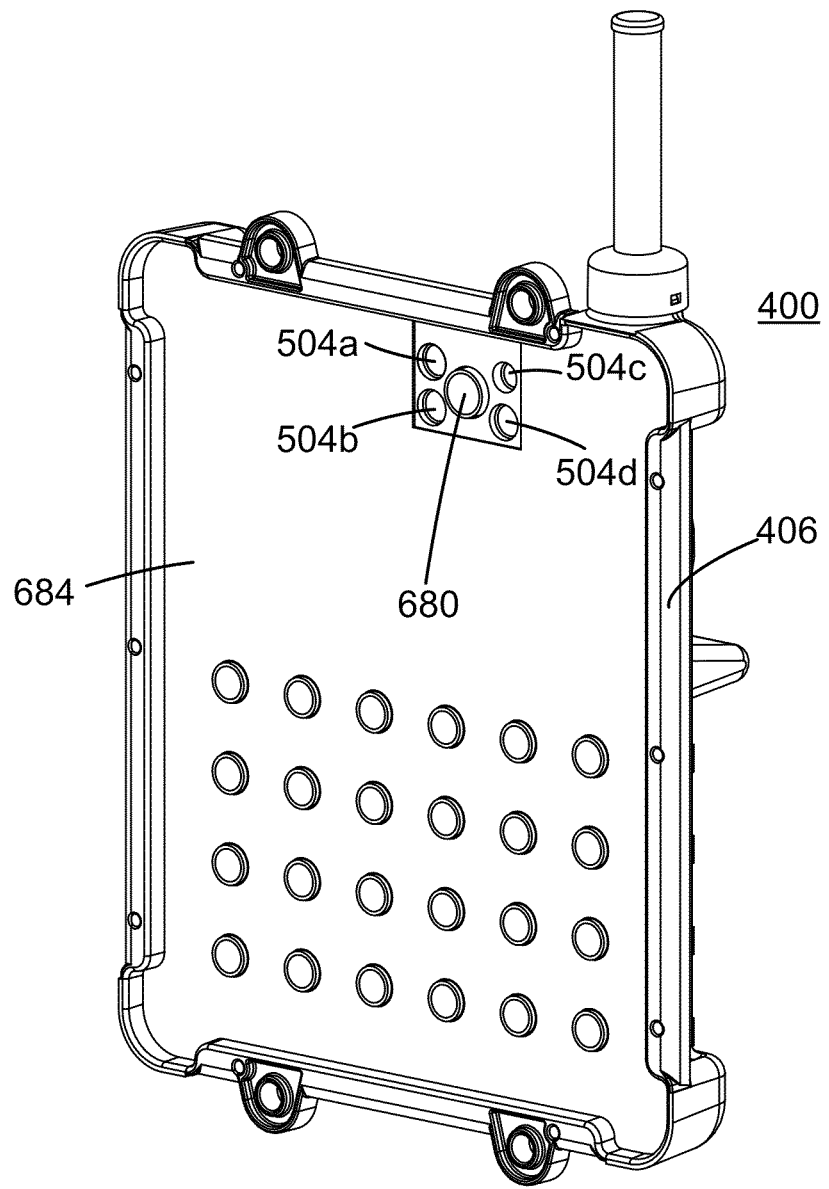
FIG. 30 illustrates a perspective view of a radio interface unit in accordance with one aspect of the present invention.
Figure 31:
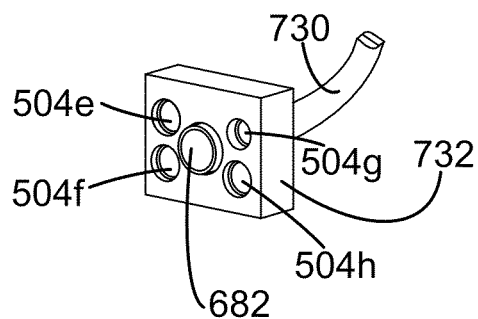
FIG. 31 illustrates a perspective view of an embodiment of an interface between an optical communication device and the radio interface unit of FIG. 30 in accordance with one aspect of the present invention.
Figure 32:
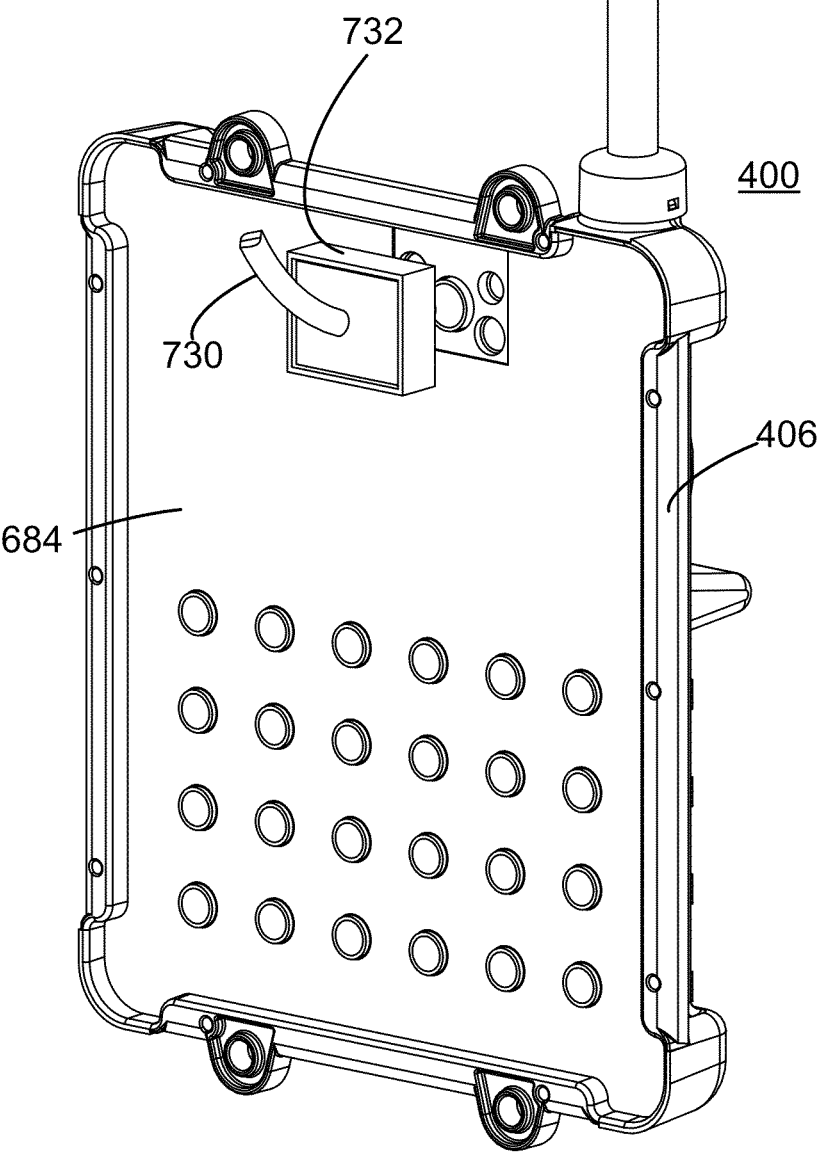
FIG. 32 illustrates a perspective view of an optical communication device in accordance with one aspect of the present invention.

In another embodiment of the present invention, the electronic device of the previous embodiments may be in the form of a radio interface unit 400 as shown in FIG. 30. This radio interface unit 400 may further communicate with a faulted circuit indicator or other protective device or monitoring device for use in an electrical power system. The radio interface unit 400 may include apertures 504a-504d where photodetectors or phototransmitters are positioned in the housing 506. According to this embodiment, the apertures 504a-504d are formed in the potting material 684. As discussed above, corresponding photodetectors and phototransmitters 504e-504h (of FIG. 32) of an optical communication device 732 may be positioned in relation to these apertures 504a-504d in order to commence transmission of data therebetween and through the semi-opaque material contained within the housing 406. For example, as illustrated in FIGS. 31 and 32, an optical communication device 732 is shown to be positioned in relation to the housing 406 of the radio interface unit 400 such that it aligns with the apertures in the previous figure. Additionally, an alignment and/or securing mechanism 680, 682 is shown which provides proper positioning and/or securing of the optical communication device 732 to the radio interface unit 400. The alignment and/or securing mechanism 680, 682 illustrated is a pressure-fit aperture 680 wherein the optical communication device 732 includes an extended portion 682 that is approximately the same size as, and fits firmly into the pressure-fit aperture 680, aligning the apertures and holding the optical communication device 732 in place.

Figure 33:
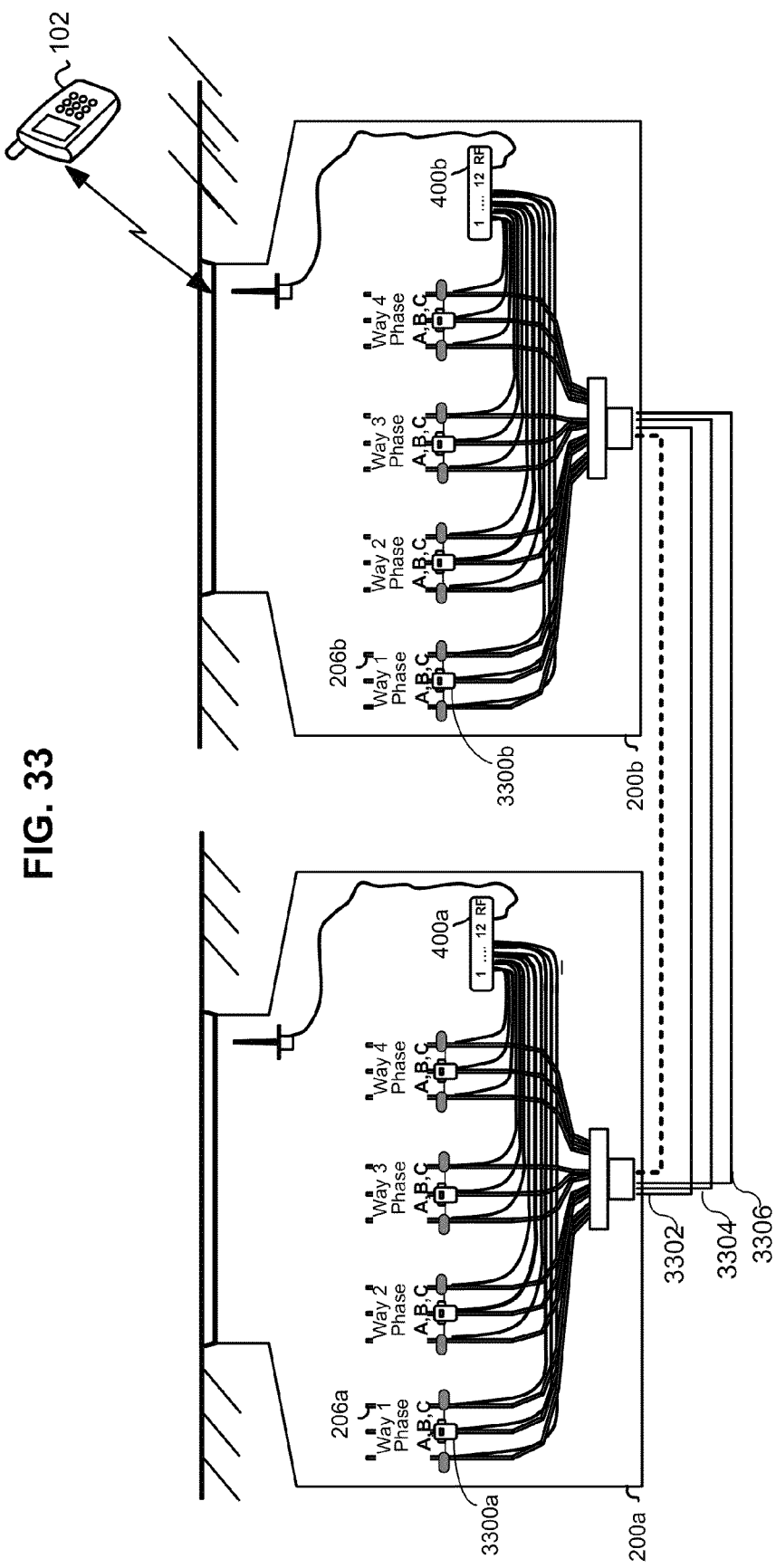
FIG. 33 illustrates a system diagram of a fault communication system having detection devices in communication with a wireless device for detection and communication of a fault using a phase comparison method.

FIG. 33 illustrates an application for the system for communicating information between a detection device and a wireless device, which is adapted to endure harsh conditions (e.g., prolonged exposure to water). More specifically, two underground vaults 200a, 200b are connected by underground power transmission lines 3302, 3304, 3306 (one for each phase, A, B, and C) for distributing electrical power therebetween. The underground vaults 200a, 200b may include additional power transmission lines entering and exiting, but for simplicity, only three are shown.

Further, within each underground vault 200a, 200b, each of the power transmission lines 3302, 3304, 3306 are spliced into electrical conductors for distribution of electricity therefrom into discrete ways (e.g., Way 1 (206a), Way 1 (206b)). Each way (e.g., Way 1 (206a), Way 1 (206b)) includes three phases (e.g., Phase A, Phase B, Phase C) as described above. A detection device (e.g., 3300a, 3300b) is adapted to monitor each phase corresponding to one of the ways. Again, for simplicity, only a single way and corresponding pair of detection device are enumerated in each vault, but all ways (and their corresponding phases) may be monitored by separate detection devices.

Figure 34:
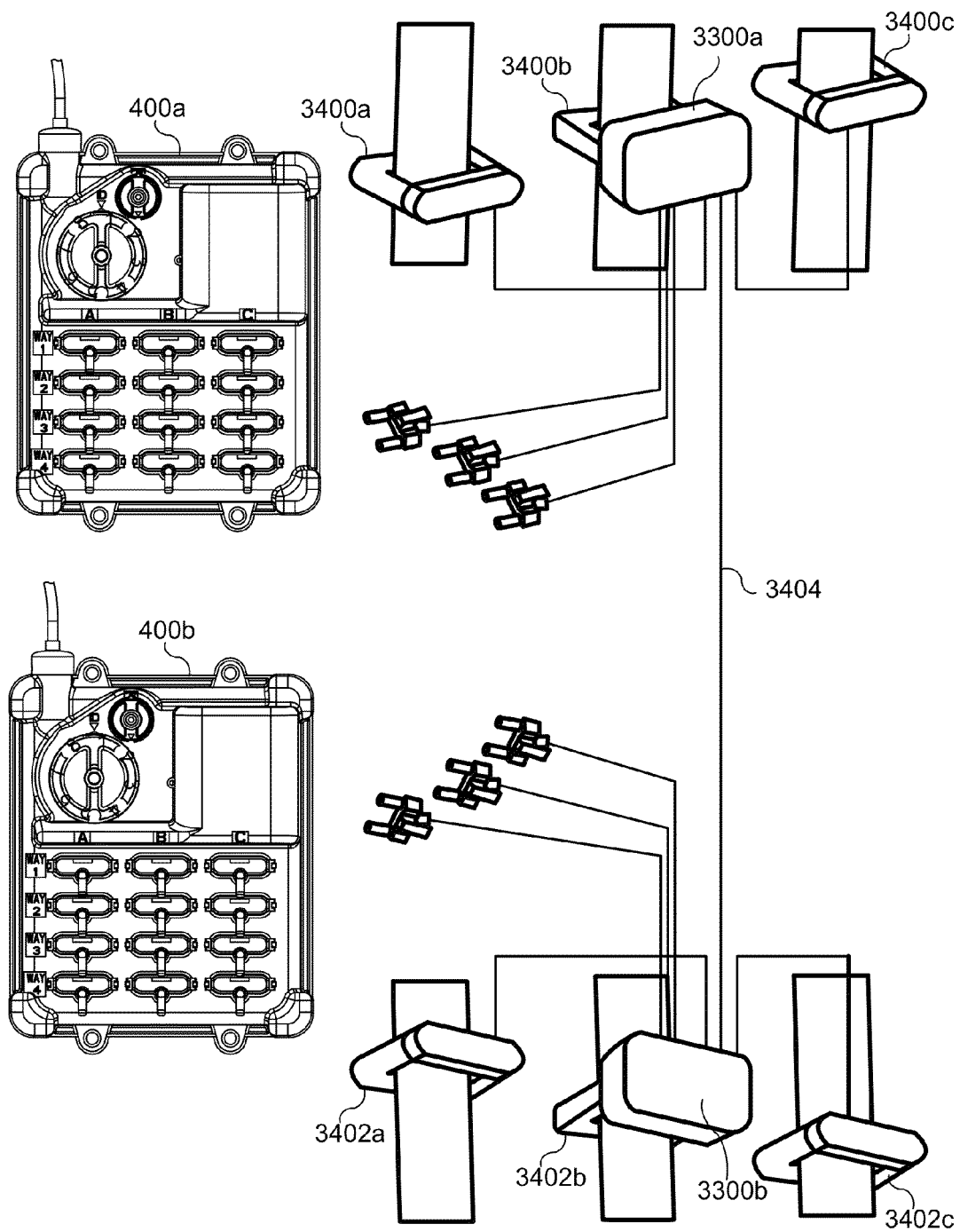
FIG. 34 illustrates an embodiment of the system of FIG. 33 in accordance with one aspect of the present invention.

The detection devices (e.g., 3300a, 3300b) are each adapted to determine the phase angle of the current on each phase corresponding to each way at their respective locations. Each of the detection devices (e.g., 3300a, 3300b) includes at least one current sensor for measuring the current on each phase (Phase A, Phase B, Phase C). For example, the current sensors may be split core current transformers 3402a, 3402b, 3402c as shown in FIG. 34. The detection devices (e.g., 3300a, 3300b) are each adapted to share the phase angle data at their respective locations with the other detection device via a communications link. For example, the detection devices may be coupled using a fiber optics line 3404. Other means of communication may be used, including copper communications cable, radio-frequency communication, and the like. Using the remote and local phase angle data, each detection device (e.g., 3300a, 3300b) determines whether a fault exists at one of the ways.

Figure 35:
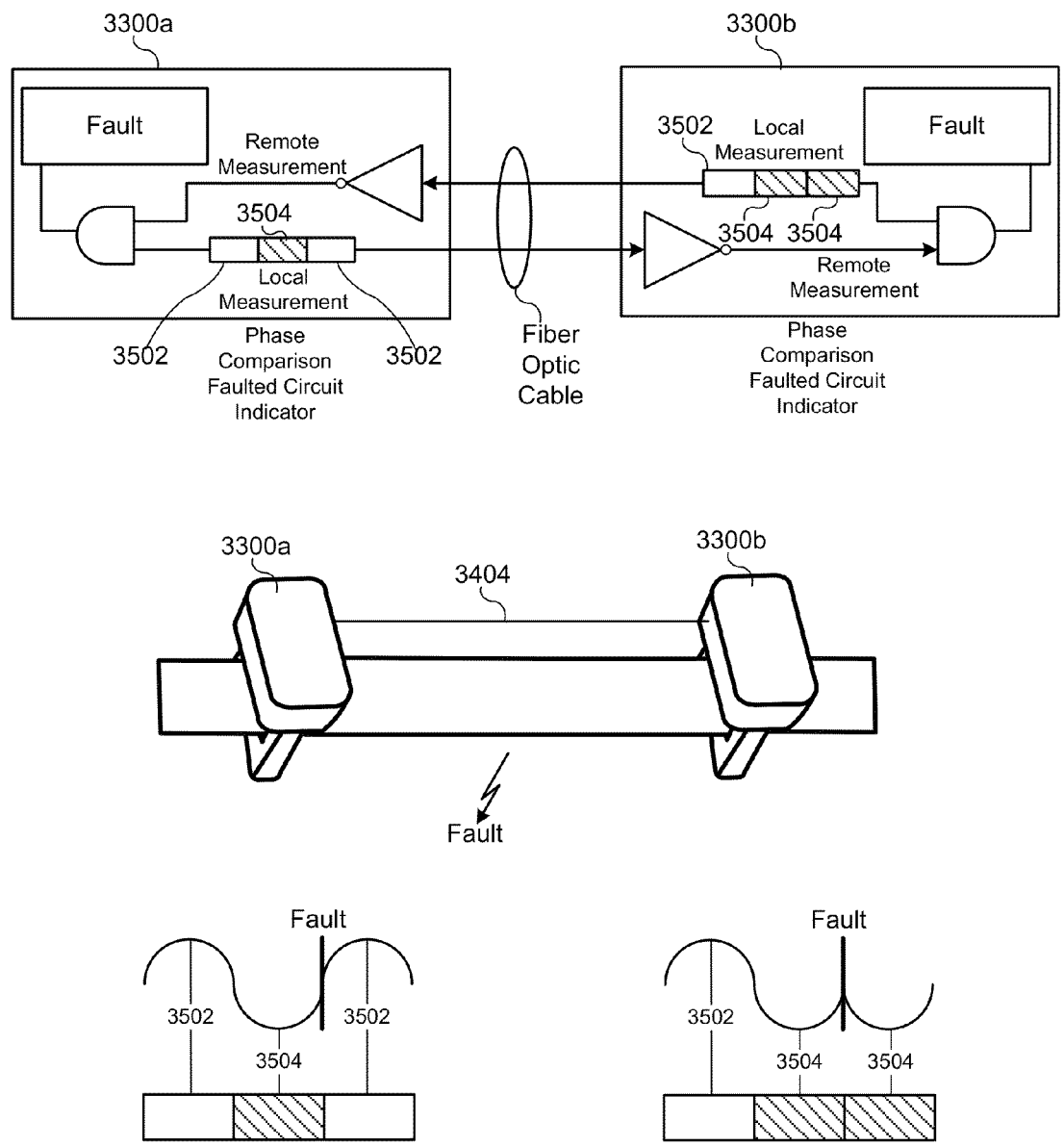
FIG. 35 illustrates another embodiment of the system of FIG. 33 in accordance with one aspect of the present invention.

For example, as shown in FIG. 35, the detection devices 3300a, 3300b each measure the current signal (and specifically the phase angle) for each phase A, phase B, and phase C at their respective locations. Each detection device 3300a, 3300b then determines whether the locally measured current signal is either a positive portion 3502 or negative portion 3504 of the power system waveform. The positive and negative portions 3502, 3504 of the current signal are converted into one of two frequencies corresponding to the positive or negative portion of the power system waveform. The detection devices 3300a, 3300b are each adapted to share the phase angle data and, specifically, the frequency information at their respective locations with the other detection device via a fiber optics line 3402. Using the remote and local phase angle data, each detection device 3300a, 3300b determines whether a fault exists by decoding the frequency information into positive and negative current phases of the power system waveform. Each detection device 3300a, 3300b then uses the local and remote phase information to determine whether the current is in-phase (e.g., no fault exists) or out-of-phase (e.g., fault exists).

Now referring back to FIG. 34, each detection device (e.g., 3300a, 3300b) is connected to a corresponding radio interface unit (e.g., 400a, 400b) such that detection device information may be transmitted to a handheld device 102. The detection device (e.g., 3300a, 3300b) may be connected to its corresponding radio interface unit (e.g., 400a, 400b) using the various embodiments shown and described herein (e.g., the embodiments shown and described with respect to FIGS. 5a-5d). The radio interface unit (e.g., 400a, 400b), the handheld device 102, and the communication methods therebetween may be in the form of the various embodiments shown and described herein.

Figure 36:
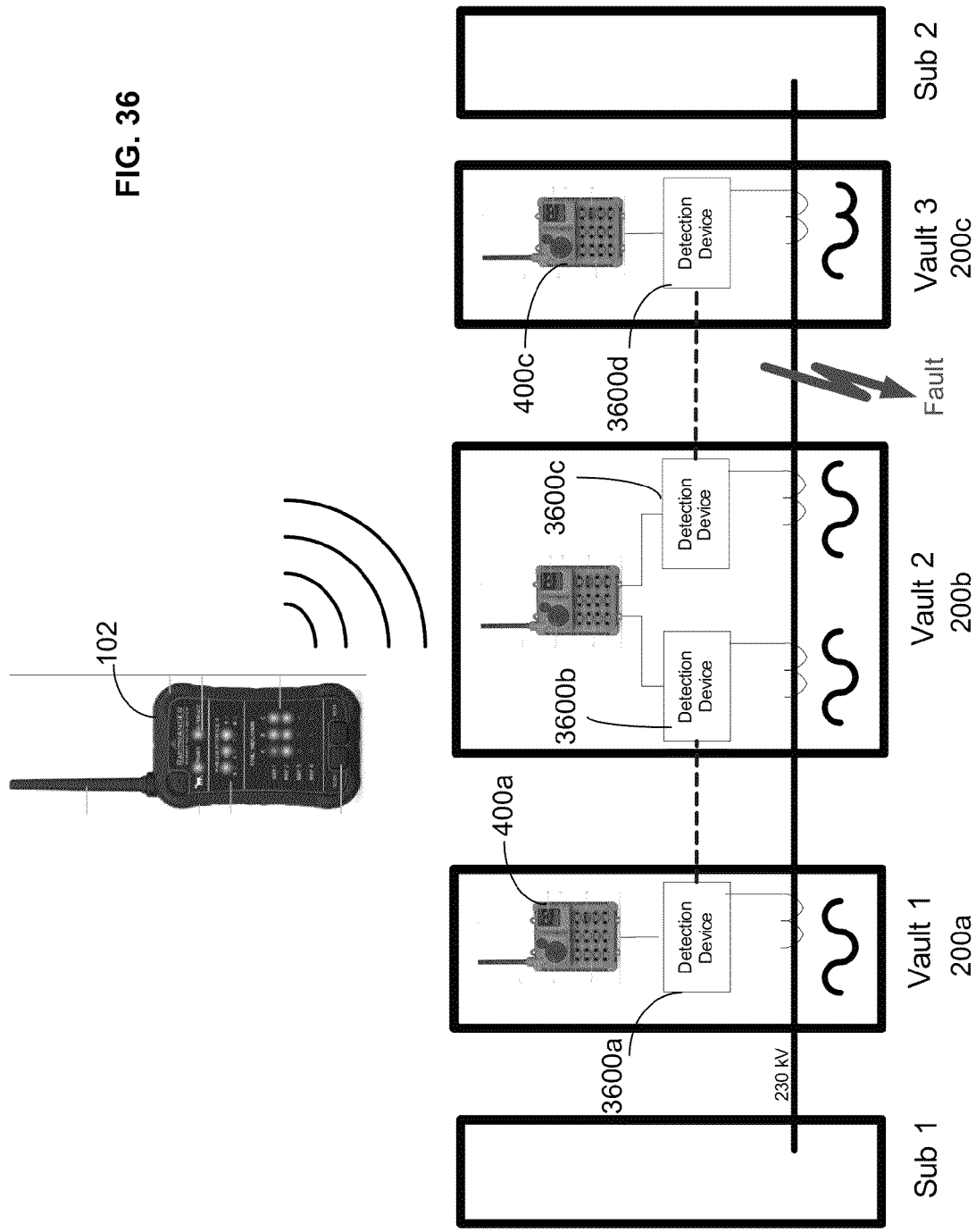
FIG. 36 illustrates a system diagram of a fault communication system having detection devices in communication with a wireless device for detection and communication of a fault between underground vaults using a phase comparison method.

The systems of FIGS. 33-35 may be used to determine whether there is a fault between underground vaults (e.g., for intervault fault determination). For example, as shown in FIG. 36, no fault exists between underground vaults 200a and 200b; however, a fault exists between underground vaults 200b and 200c. Detection devices 3600a, 3600b, 3600c, and 3600d are each adapted to determine the phase angle of the current on an electrical conductor at their respective locations in the underground vaults 200a, 200b, 200c. Using a communications link, detection device 3600a shares phase angle data with detection device 3600b. At the same time, detection device 3600c shares phase angle data with detection device 3600d. Using the local and remote phase angle data, each of the detection devices determines whether a fault exists. Specifically, detection devices 3600a and 3600b each determine that there is a in-phase condition and, therefore, no fault exists. On the other hand, detection devices 3600c and 3600d each determine that there is an out-of-phase condition and, therefore, a fault exists. Each of the detection devices 3600a, 3600b, 3600c, 3600d transmits its corresponding data (including whether there is a fault) to a respective radio interface unit 400a, 400b, 400c. In this example, detection devices 3600a and 3600b do not signal a fault condition to their respective radio interface units 400a and 400b; however, detection devices 3600c and 3600d signal a fault location to their respective radio interface units 400b and 400c. Each radio interface unit 400a, 400b, 400c transmits this data to a handheld device 102 which provides an indication that there is a fault condition at underground vaults 200b and 200c.

Figure 37:
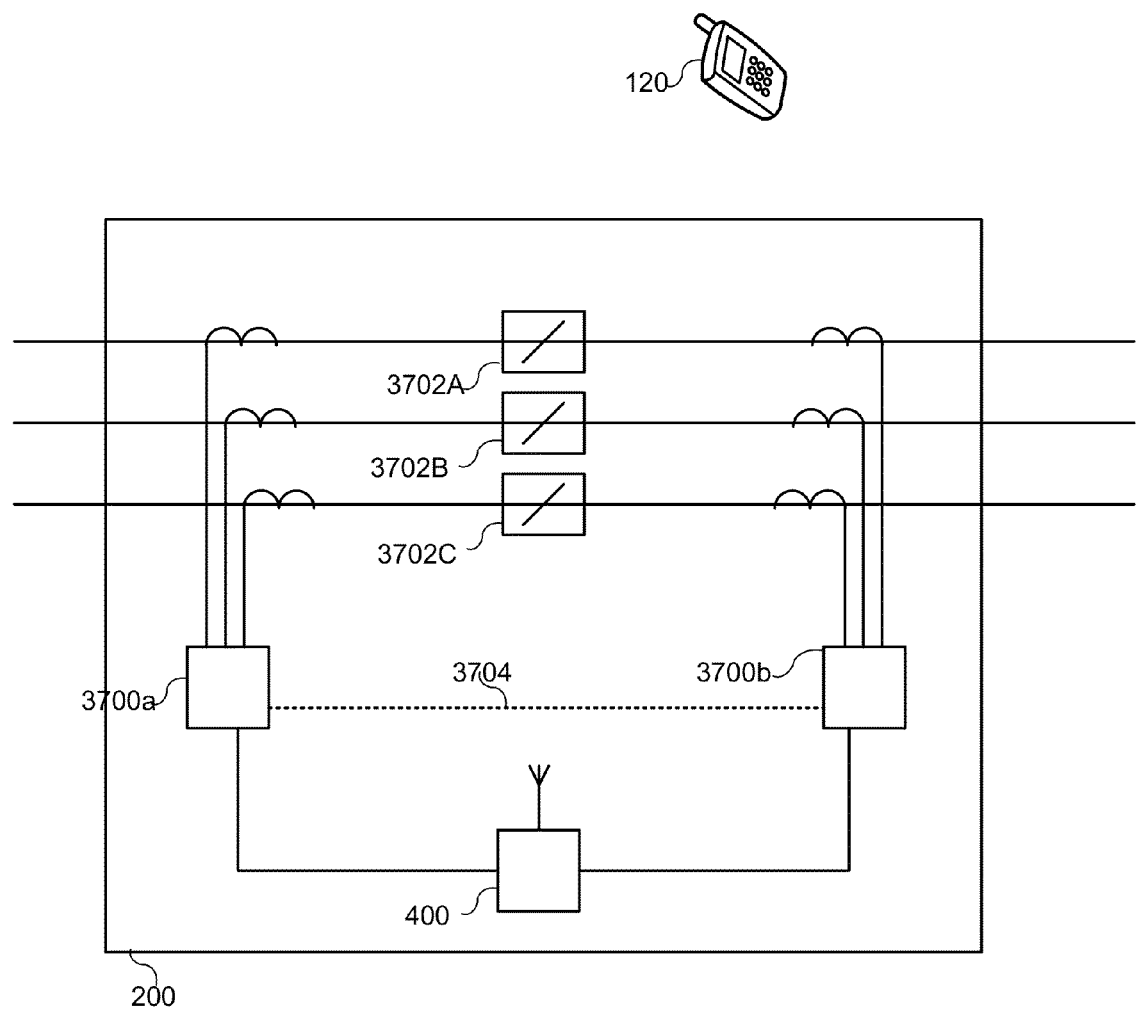
FIG. 37 illustrates a system diagram of a fault communication system having detection devices in communication with a wireless device for detection and communication of a fault within an underground vault using a phase comparison method.

The systems of FIGS. 33-35 may be used to determine whether there is a fault within an underground vault 200 (e.g. for intravault fault determination). For example, as shown in FIG. 37, each phase conductor A, B, and C includes a splice 3702a, 3702b, and 3702c. On either side of the splices is a current transformer that provides current signals to a detection device on the entrance 3700a, or a detection device on the exit 3700b of the underground vault 200. The detection device 3700a, 3700b are each adapted to determine the phase angle of the current on an electrical conductor at their respective locations in the underground vault 200. Using a communications link, detection device 3700a shares phase angle data with detection device 3700b. Using the local and remote phase angle data, each of the detection devices 3700a, 3700b determines whether a fault exists. Specifically, detection devices 3700a and 3700b each determine that there is an out-of-phase condition and, therefore, a fault exists. Each of the detection devices 3700a, 3700b transmits its corresponding data (including whether there is a fault) to the radio interface unit 400. The radio interface unit 400 transmits this data to a handheld device 102 which provides an indication that there is a fault condition at underground vault.

Figure 38A:
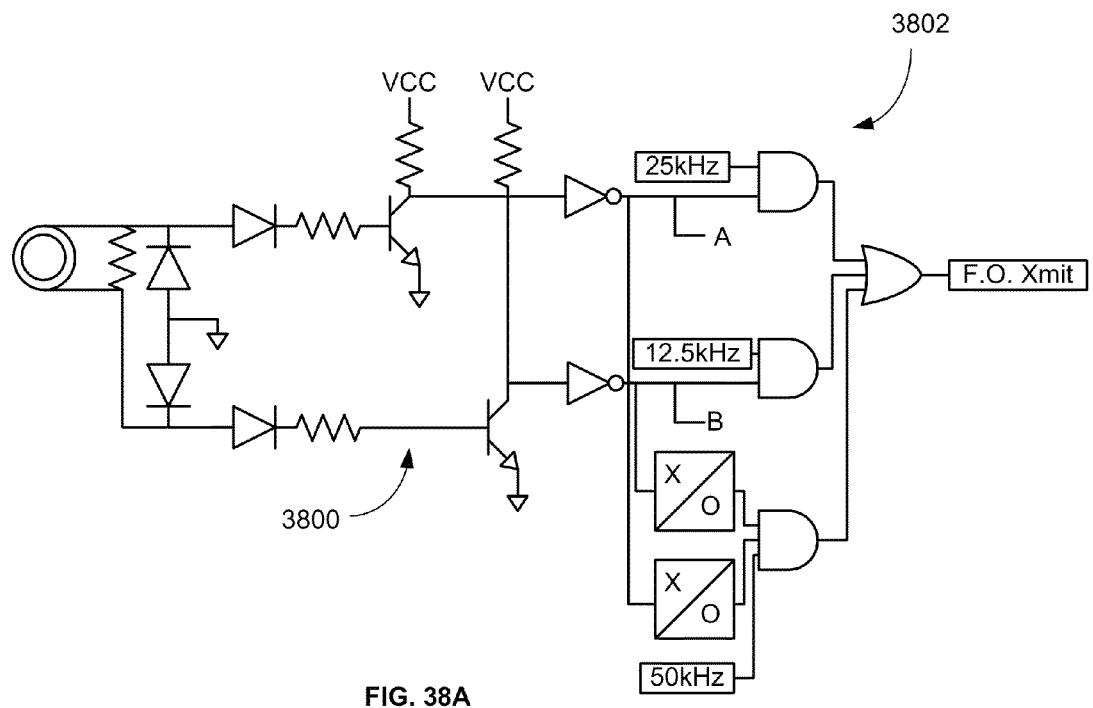
FIGS. 38A and 38B illustrate logic diagrams for the circuitry of one of the detection devices of FIG. 33.

FIG. 38A illustrates a logic diagram of circuitry contained within the detection devices of FIGS. 33-37 for rectifying, modulating and transmitting the current information measured locally by the current sensors of those figures. The current signal locally obtained by the current sensor may be rectified at 3800. The positive portion of the current signal may then be modulated with a first signal, such as a 25 kHz signal, and the negative portion of the current signal may be modulated using a second signal, such as a 12.5 kHz signal at 3802. The two signals are then OR'ed together to produce a modulated signal that is sent via a communications link to the other detection device.

Figure 38B:
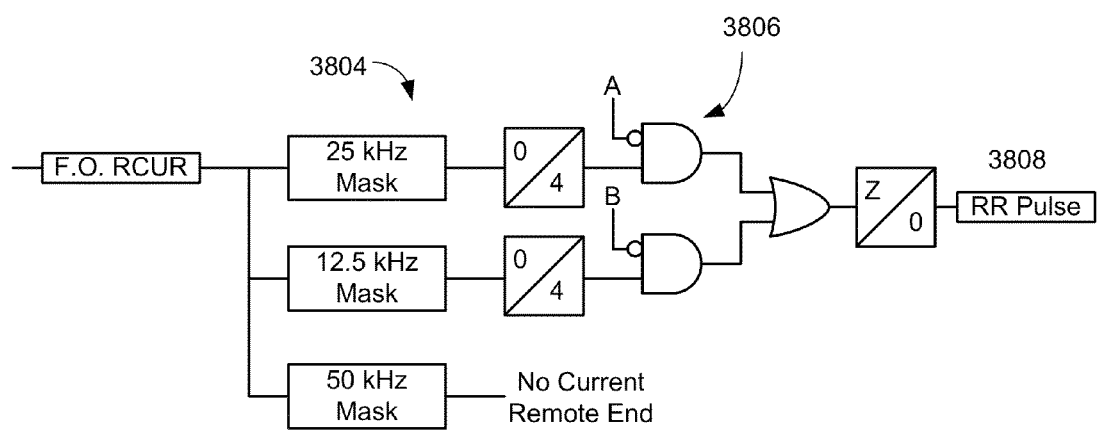

FIG. 38B illustrates a logic diagram of the circuitry in another detection device for processing the modulated signal transmitted by the circuitry of the first detection device of FIG. 38A. Specifically, the other detection device includes circuitry that decodes the modulated 25 kHz or 12.5 kHz signals to determine the corresponding positive and negative portions of the sine wave received from the first detection device at 3804. The local positive and negative signals are then compared with the received and decoded positive and negative signal to determine if they are in-phase or out-of-phase at 3806. If they are out of phase, the other detection device signals the radio interface unit that a fault exists at 3808. The radio interface unit then signals the handheld wireless device that a fault exists.

Figure 39:
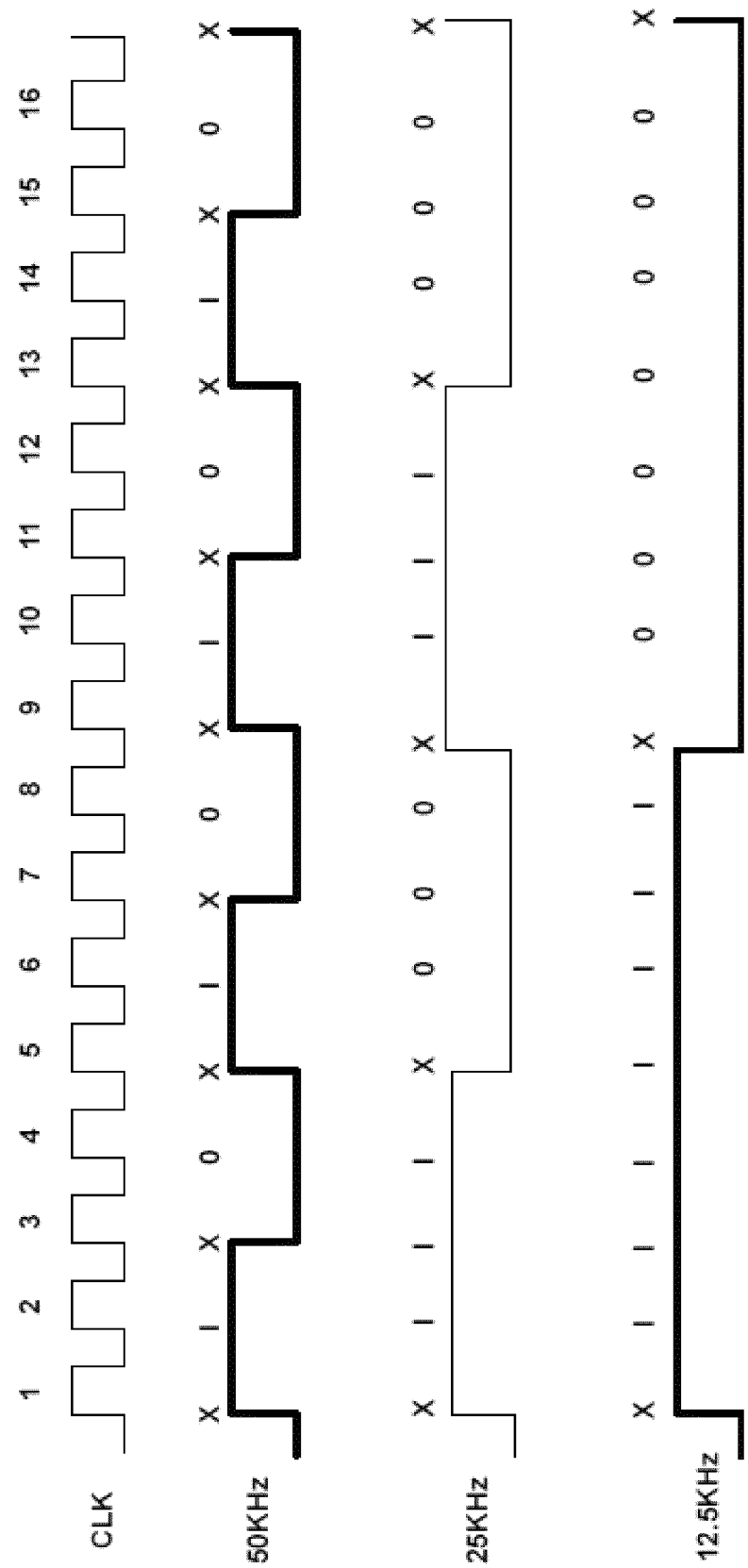
FIG. 39 illustrates a timing diagram of the signals shared between the detection devices of FIGS. 38A and 38B.

FIG. 39 illustrates a timing diagram of the signals shared between the detection devices of FIGS. 38A and 38B. One frame, as illustrated, is 16 clocks long. A positive or negative portion of a cycle is declared if all 16 bits of the frame match the frame pattern.

Figure 40:
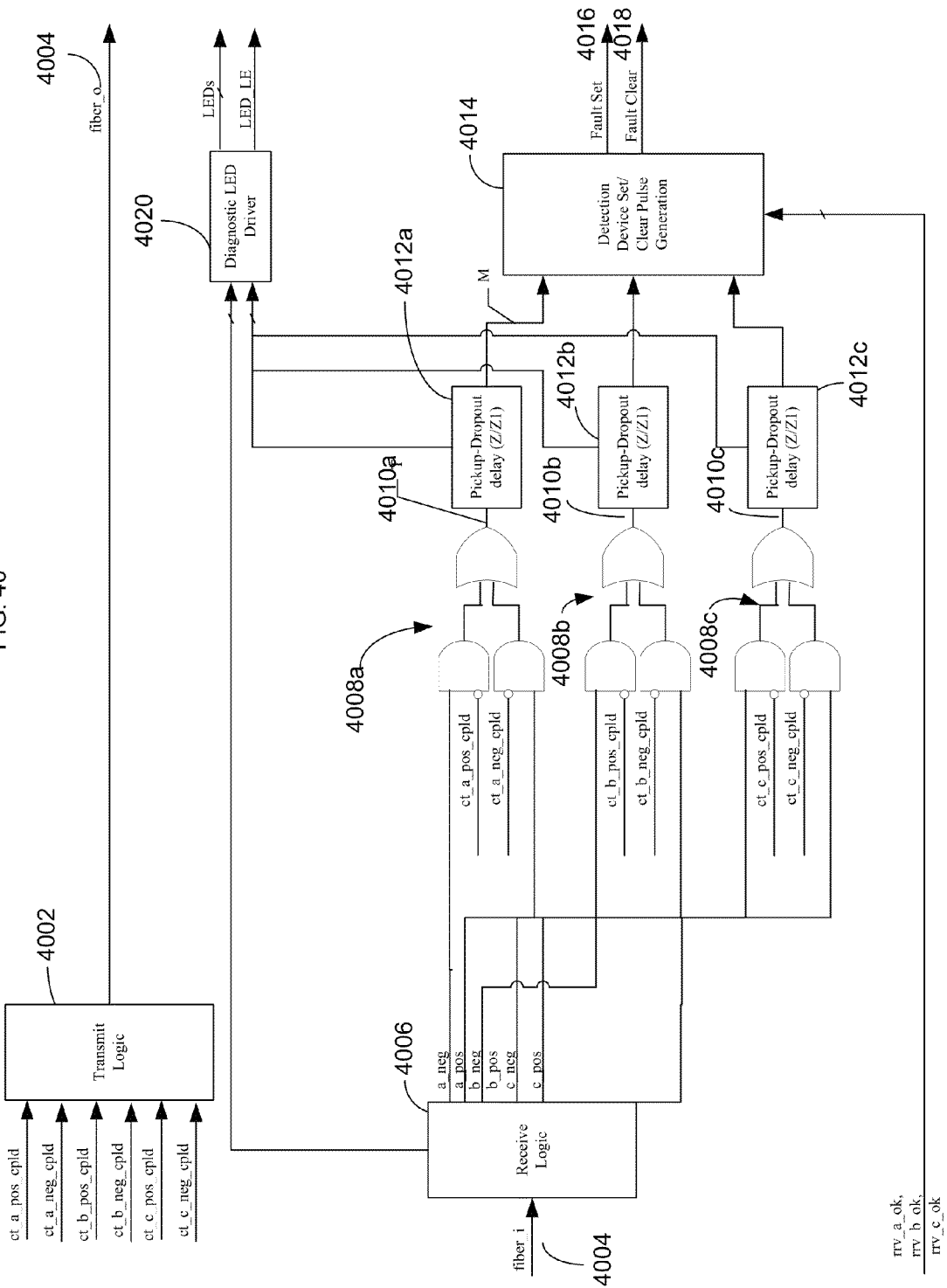
FIG. 40 illustrates a logic diagram for the circuitry of one of the detection devices of FIG. 33-37.

FIG. 40 illustrates a logic diagram of yet another circuit which may be used in one of the detection devices of FIGS. 33-37 for transmitting the current information measured locally by one of the current sensors of those figures; and another logic diagram of yet another circuit for receiving and processing the transmitted current information by another detection device of those figures. Specifically, one of the detection devices includes transmit logic (or module) 4002 for rectifying a current signal obtained locally via an associated current sensor and for generating pulses during a select cycle (e.g., during each half cycle of input current on each phase). Such rectifying may be performed inside or outside of a processing device (such as a complex programmable logic device (CPLD) or the like). The pulses may be sampled by a complex programmable logic device (or other comparable device) at a select rate (e.g., at about 512 μs or at about 1.95 KHz) and transmitted to another detection device via a communications link 4004.

Figure 41:
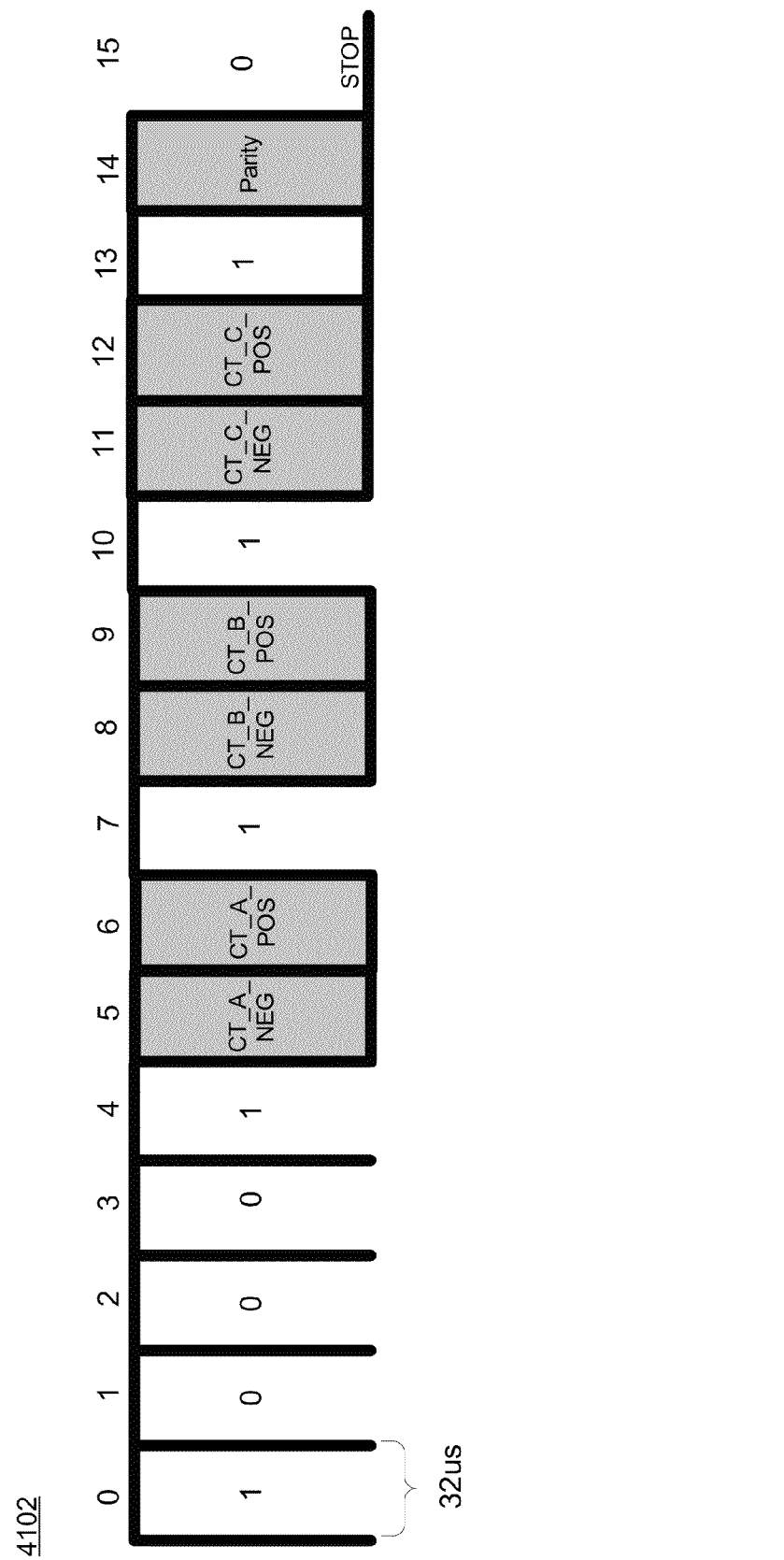
FIG. 41 illustrates a diagram of data packet which may be used for transmitting current information in the system of FIG. 40.

The sampled pulses may be sent in a select data packet (e.g., a serial data packet). For example, the transmit logic 4002 of FIG. 40 may be adapted to packetize the sampled pulses into a serial data packet 4102 as shown in FIG. 41. As specifically shown in the figure, the data packet 4102 includes a plurality of bits which contain sampled pulse information (e.g., bits 5, 6, 8, 9, 11, and 12) for the positive and negative portions of the three phases. The data packet 4102 may further include a plurality of bits (e.g., bits 0 to 4, 10001), which serve as a preamble having a select sequence to help the other detection device synchronize data packets during receipt. The data packet 4102 may further include a plurality of bits (e.g., bits 7, 10, and 13), which are at fixed logic high state to ensure that the preamble sequence does not repeat with in the data packet 4102. A parity bit (e.g., bit 14) is further provided at the end of the data packet 4102 for error detection purposes as will be further described below.

Referring back to FIG. 40, the sampled pulses from the detection device are transmitted to another detection device (e.g., in the form of the data packet 4102 of FIG. 41). The other detection device includes receive logic (or module) 4006, which scans the data packet 4102 for the select preamble sequence (e.g., 10001 of FIG. 41). The receive logic 4006 is further adapted to record the remaining data from the data packet 4102 upon detection of the preamble sequence. The receive logic 4006 is further adapted to compare the received parity bit (e.g., bit 14 from FIG. 41) with a calculated parity bit and determine whether to discard the data packet 4102 based on this comparison. If the data packet 4102 passes the parity bit comparison (and is therefore considered valid data), the data (e.g., bits 5, 6, 8, 9, 11, and 12) contained within the data packet 4102 for the positive and negative portions of the three phases is further processed.

During processing, the data from the receive logic (or module) 4006 is processed through a combinational logic circuit 4008a, 4008b, and 4008c or comparable compare module, where the data from the data packet 4102 for each phase is logically ANDed with the inverted versions of the respective pulses measured locally from a current sensor associated with the local detection device. The results of each pair of AND gates 4008a, 4008b, 4008c are then combined through OR gates. The output 4010a, 4010b, and 4010c of the combinational logic for each phase is then fed into a Pickup-Dropout delay blocks (or modules) 4012a, 4012b, and 4012c.

When already in low state, the output of the Pickup-Dropout delay block 4012*a*, 4012*b*, and 4012*c* goes high if the input remains high for a select period (e.g., at least DELAY_Z ms). Once high, the output goes low when input remains low for a select period (e.g., about DELAY_Z1 sec). The pick-up and drop-out delays also provide an angle margin such that the detection device does not pick-up a fault until the phase difference increases above a select threshold (e.g., at about 60° at about 60 Hz and 50° at about 50 Hz). The drop-out delay also prevents the output from chattering or decreases chattering as the phase difference approaches about 180°.

The outputs from Pickup-Dropout delay block (or module) 4012*a*, 4012*b*, and 4012*c* for each phase are then transmitted to Detection Device Set/Clear pulse generation logic 4014, where they are combined through an OR gate. Whenever the output of this OR gate asserts high, a pulse (e.g., 30 μs pulse) is generated on the "fault set" line 4016 to signal a fault. When this output changes to low, a pulse (e.g., 30 μs pulse) is generated on the "fault clr" line 4018 to signal clearance of a fault. In this way, a single communications line ("fault set", "fault clr") may be used to indicate fault on any of the phases by transmission of these pulses to the radio interface unit. The radio interface unit then signals the handheld wireless device that a fault exists.

In one embodiment, in addition to signaling fault conditions, the system may further be adapted to signal if there are parity errors in the data packet of FIG. 41. For example, the other detection device may be adapted to signal to the radio interface device and, ultimately the handheld wireless device, that valid data is being processed. The system may similarly be adapted such that the handheld wireless device ends such signaling if a select number of parity errors (e.g., three parity errors in succession) are received. Moreover, the system may be adapted to signal through the handheld wireless device that no data is received through the communications link.

The system may be further adapted to indicate communication diagnostics and/or the faulted phase during a cleared-fault condition. The outputs from Receive Logic 4006 and/or Pickup-Dropout delay blocks (or modules) 4012*a*, 4012*b*, and 4012*c* may be directed to a diagnostic LED driver 4020. In one embodiment, the diagnostic LED driver uses the output from the Receive Logic 4006 to determine the state of communications, and direct an LED to illuminate if the state of communications meets certain criteria. For example, if a fiber optic cable is broken or malfunctioning, the diagnostic LED driver may be configured to direct an LED to illuminate in a predetermined fashion (flash pattern, color, etc.). Similarly, if the communications are delayed or include a predetermined number of parity errors, the diagnostic LED driver 4020 may be configured to direct an LED to illuminate in a predetermined fashion.

In one embodiment, the diagnostic LED driver may be configured to use the outputs of Pickup-Dropout delay blocks (or modules) 4012*a*, 4012*b*, and 4012*c* to signal the faulted phase by directing an LED associated with the particular phase. The LED may be located on the underground system. For example, where the system is powered using the line current, a fault may be detected and cleared by another protective device (e.g. a recloser and recloser control). In such a case, the system would remain without power until after the fault condition has been remedied and the line has been re-energized. In such an event, a user may not have an indication as to which of the phases was faulted. Accordingly, the system may include a battery that is used to illuminate an LED that indicates the faulted phase even when the system is not able to obtain power from the monitored conductor. The system may be configured to illuminate the LED associated with the faulted phase for a predetermined amount of time to allow a user to properly identify the faulted phase.

The foregoing description of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and various modifications as are suited to the particular use contemplated. It is intended that the scope of the invention not be limited by the specification, but be defined by the claims set forth below.

The invention claimed is:

1. A system for indicating a fault on an electric power distribution system, comprising:
   a first detection device in electrical communication with a phase conductor, adapted to obtain a first current signal therefrom, and including:
   a first current signal modulator for modulating the first current signal; and
   a transmit module for communicating the first modulated current signal to a second monitoring device;
   a second detection device in electrical communication with the phase conductor at a different location, adapted to obtain a second current signal therefrom, and including:
   a second current signal modulator for modulating the second current signal;
   a receive module for receiving the first modulated current signal; and
   a compare module for comparing the first modulated current signal and the second current signal and determining whether the first current signal is in phase with the second current signal.

2. The system of claim 1, wherein the transmit module comprises a fiber-optic transmitter.

3. The system of claim 1, wherein the receive module comprises a fiber-optic receiver.

4. The system of claim 1, wherein the second detection device comprises a fault indication module for signaling when the compare module determines that the first current signal is not in phase with the second current signal, wherein the system further comprises:
   a radio interface unit in communication with the second detection device, for receiving the signal from the fault indication module and transmitting a signal upon receipt thereof.

5. The system of claim 1, wherein the transmit module is configured to transmit a communication frame that includes a predetermined number of clock counts.

6. The system of claim 5, wherein a sign of the first current signal is communicated depending on a number of the predetermined number of clock counts corresponding with a predetermined pattern.

7. The system of claim 1, wherein the transmit module is further adapted to packetize the current signal into a select data packet.

8. The system of claim 7, wherein the select data packet further includes a preamble, and the receive module synchronizes the select data packet based on the preamble.

9. The system of claim 7, wherein the select data packet further includes a parity bit, and the receive module is adapted to detect errors in the select data packet based on the parity bit.

10. The system of claim 1, further comprising a pick-up delay module coupled to the compare module, wherein the pick-up delay module determines whether the first current signal is in phase with the second current signal at a select threshold.

11. The system of claim 1, further comprising a drop-out delay module coupled to the compare module, wherein the drop-out delay module decreases chattering as the phase difference between the first and second current signals approaches about 0°.

12. A system for communicating information between a detection device and a wireless device, comprising:
- a detection device adapted to measure a current signal from an electrical conductor and compare the current signal with another current signal received from another detection device, said detection device further adapted to determine whether the current signal is in phase with the other current signal;
- a communication member coupled to the detection device,
- a radio interface unit in communication with said communication member, and
- a wireless device in radio communication with said radio interface unit, such that said detection device communicates information between the wireless device via the radio interface unit.

13. The system of claim 12, wherein the communication member is substantially self-contained.

14. The system of claim 12, wherein the radio interface unit is substantially self-contained.

15. The system of claim 12, wherein the communication member communicates power system information to the radio interface unit without a mechanical connection therebetween.

16. The system of claim 12, wherein the communication member communicates power system information to the radio interface unit without an electrical connection therebetween.

17. The system of claim 12, wherein the detection device is located in an underground location.

18. The system of claim 12, wherein the radio interface unit is generally submergible in water.

19. The system of claim 12, wherein the radio interface unit is generally constructed to endure harsh conditions.

20. The system of claim 12, wherein the radio interface unit is adapted to communicate information regarding the detection device between the detection device and the wireless device.

21. The system of claim 12, wherein the another detection device is further adapted to packetize the another current signal into a select data packet and transmit the select data packet to the detection device.

22. The system of claim 21, wherein the select data packet further includes a preamble, and the detection device synchronizes the select data packet based on the preamble.

23. The system of claim 21, wherein the select data packet further includes a parity bit, and the detection device is adapted to detect errors in the select data packet based on the parity bit.

24. The system of claim 12, wherein the detection device is further adapted to determine whether the current signal is in phase with the another current signal at a select threshold.

25. The system of claim 12, wherein the detection device is further adapted to decrease chattering as the phase difference between the current signal and the another current signal approaches about 0°.

26. The system of claim 12, wherein the radio interface unit is adapted to communicate information regarding the radio interface unit to the wireless device.

27. The system of claim 12, wherein the radio interface unit is adapted to receive information from the wireless device and transmit the information received from the wireless device to the detection device.

* * * * *